US007055120B2

(12) United States Patent
Teig et al.

(10) Patent No.: US 7,055,120 B2
(45) Date of Patent: *May 30, 2006

(54) METHOD AND APPARATUS FOR PLACING CIRCUIT MODULES

(75) Inventors: Steven Teig, Menlo Park, CA (US); Joseph L. Ganley, Vienna, VA (US)

(73) Assignee: Cadence Design Systems, Inc., San Jose, CA (US)

( * ) Notice: Subject to any disclaimer, the term of this patent is extended or adjusted under 35 U.S.C. 154(b) by 727 days.

This patent is subject to a terminal disclaimer.

(21) Appl. No.: 10/046,858

(22) Filed: Jan. 13, 2002

(65) Prior Publication Data

US 2002/0069397 A1 Jun. 6, 2002

Related U.S. Application Data

(63) Continuation-in-part of application No. 10/013,816, filed on Oct. 19, 2001, and a continuation-in-part of application No. 09/732,181, filed on Dec. 6, 2000, now Pat. No. 6,826,737, and a continuation-in-part of application No. 09/731,891, filed on Dec. 6, 2000.

(51) Int. Cl.
*G06F 9/45* (2006.01)
*G06F 17/50* (2006.01)

(52) U.S. Cl. .............................. 716/10; 716/6; 716/12

(58) Field of Classification Search ............... 716/1–14
See application file for complete search history.

(56) References Cited

U.S. PATENT DOCUMENTS

| 4,593,363 A | 6/1986 | Burstein et al. |
| 4,615,011 A | 9/1986 | Linsker |
| 4,777,606 A | 10/1988 | Fournier |
| 4,855,929 A | 8/1989 | Nakajima |
| 5,097,422 A | 3/1992 | Corbin, II et al. |
| 5,224,057 A | 6/1993 | Igarashi et al. |
| 5,267,176 A | 11/1993 | Antreich et al. |
| 5,375,069 A | 12/1994 | Satoh et al. |
| 5,481,473 A * | 1/1996 | Kim et al. ..................... 716/5 |
| 5,491,641 A * | 2/1996 | Scepanovic et al. .......... 716/13 |
| 5,519,836 A | 5/1996 | Gawlick et al. |
| 5,532,934 A | 7/1996 | Rostoker |
| 5,566,078 A | 10/1996 | Ding et al. |
| 5,578,840 A | 11/1996 | Scepanovic et al. |

(Continued)

FOREIGN PATENT DOCUMENTS

JP 64-15947 1/1989

(Continued)

OTHER PUBLICATIONS

Cong J. et al., DUNE—A Multilayer Gridless Routing System, May 2001, IEEE Transactions on Computer-Aided Design of Integrated Circuits and Systems, vol 20, iss. 5, pp. 633-647.

(Continued)

*Primary Examiner*—Leigh M. Garbowski
(74) *Attorney, Agent, or Firm*—Stattler Johansen & Adeli LLP

(57) ABSTRACT

Some embodiments of the invention are placers that use diagonal lines in calculating the costs of potential placement configurations. For instance, some embodiments estimate the delay cost of a placement configuration by accounting for the potential use of diagonal wiring in the layout. Some of these embodiments derive the delay cost from an estimate of the wirelength needed to route the nets in the region.

22 Claims, 35 Drawing Sheets

U.S. PATENT DOCUMENTS

| | | | |
|---|---|---|---|
| 5,587,923 A | 12/1996 | Wang | |
| 5,618,744 A | 4/1997 | Suzuki et al. | |
| 5,633,479 A | 5/1997 | Hirano | |
| 5,634,093 A | 5/1997 | Ashida et al. | |
| 5,636,125 A | 6/1997 | Rostoker et al. | |
| 5,637,920 A | 6/1997 | Loo | |
| 5,640,327 A | 6/1997 | Ting | |
| 5,650,653 A | 7/1997 | Rostoker et al. | |
| 5,663,891 A | 9/1997 | Bamji et al. | |
| 5,673,201 A * | 9/1997 | Malm et al. | 716/12 |
| 5,699,265 A | 12/1997 | Scepanovic et al. | |
| 5,742,086 A | 4/1998 | Rostoker et al. | |
| 5,742,510 A * | 4/1998 | Rostoker et al. | 700/97 |
| 5,757,089 A | 5/1998 | Ishizuka | |
| 5,757,656 A | 5/1998 | Hershberger et al. | |
| 5,777,360 A | 7/1998 | Rostoker et al. | |
| 5,784,289 A | 7/1998 | Wang | |
| 5,798,936 A | 8/1998 | Cheng | |
| 5,811,863 A | 9/1998 | Rostoker et al. | |
| 5,822,214 A * | 10/1998 | Rostoker et al. | 716/10 |
| 5,838,583 A | 11/1998 | Varadarajan et al. | |
| 5,859,449 A | 1/1999 | Kobayashi et al. | |
| 5,889,677 A | 3/1999 | Yasuda et al. | |
| 5,898,597 A | 4/1999 | Scepanovic et al. | |
| 5,914,887 A | 6/1999 | Scepanovic et al. | |
| 5,973,376 A | 10/1999 | Rostoker et al. | |
| 5,980,093 A | 11/1999 | Jones et al. | |
| 6,018,623 A | 1/2000 | Chang et al. | |
| 6,035,108 A | 3/2000 | Kikuchi | |
| 6,038,385 A | 3/2000 | Scepanovic et al. | |
| 6,058,254 A | 5/2000 | Scepanovic et al. | |
| 6,068,662 A | 5/2000 | Scepanovic et al. | |
| 6,070,108 A | 5/2000 | Andreev et al. | |
| 6,085,032 A | 7/2000 | Scepanovic et al. | |
| 6,088,519 A | 7/2000 | Koford | |
| 6,123,736 A | 9/2000 | Pavisic et al. | |
| 6,128,767 A | 10/2000 | Chapman | |
| 6,134,702 A | 10/2000 | Scepanovic et al. | |
| 6,154,874 A | 11/2000 | Scepanovic et al. | |
| 6,155,725 A | 12/2000 | Scepanovic et al. | |
| 6,175,950 B1 | 1/2001 | Scepanovic et al. | |
| 6,186,676 B1 * | 2/2001 | Andreev et al. | 716/12 |
| 6,209,123 B1 | 3/2001 | Maziasz et al. | |
| 6,216,252 B1 | 4/2001 | Dangelo et al. | |
| 6,230,306 B1 | 5/2001 | Raspopovic et al. | |
| 6,240,541 B1 | 5/2001 | Yasuda et al. | |
| 6,247,167 B1 | 6/2001 | Raspopovic et al. | |
| 6,249,902 B1 | 6/2001 | Igusa et al. | |
| 6,253,363 B1 | 6/2001 | Gasanov et al. | |
| 6,260,179 B1 | 7/2001 | Ohsawa et al. | |
| 6,262,487 B1 | 7/2001 | Igarashi et al. | |
| 6,289,495 B1 | 9/2001 | Raspopovic et al. | |
| 6,295,634 B1 | 9/2001 | Matsumoto | |
| 6,301,686 B1 | 10/2001 | Kikuchi et al. | |
| 6,324,674 B1 | 11/2001 | Andreev et al. | |
| 6,324,675 B1 | 11/2001 | Dutta et al. | |
| 6,327,693 B1 | 12/2001 | Cheng et al. | |
| 6,327,694 B1 | 12/2001 | Kanazawa | |
| 6,330,707 B1 | 12/2001 | Shinomiya et al. | |
| 6,349,403 B1 | 2/2002 | Dutta et al. | |
| 6,353,918 B1 * | 3/2002 | Carothers et al. | 716/8 |
| 6,366,279 B1 | 4/2002 | Gorman | |
| 6,378,121 B1 | 4/2002 | Hiraga | |
| 6,385,758 B1 | 5/2002 | Kikuchi et al. | |
| 6,401,234 B1 | 6/2002 | Alpert et al. | |
| 6,405,358 B1 | 6/2002 | Nuber | |
| 6,407,434 B1 | 6/2002 | Rostoker et al. | |
| 6,412,097 B1 | 6/2002 | Kikuchi et al. | |
| 6,412,102 B1 | 6/2002 | Andreev et al. | |
| 6,415,422 B1 | 7/2002 | Mehrotra et al. | |
| 6,436,804 B1 | 8/2002 | Igarashi et al. | |
| 6,442,743 B1 | 8/2002 | Sarrafzadeh et al. | |
| 6,442,745 B1 | 8/2002 | Arunachalam et al. | |
| 6,448,591 B1 | 9/2002 | Juengling | |
| 6,463,575 B1 | 10/2002 | Takahashi | |
| 6,473,891 B1 | 10/2002 | Shively | |
| 6,480,991 B1 | 11/2002 | Cho et al. | |
| 6,490,713 B1 | 12/2002 | Matsumoto | |
| 6,505,331 B1 | 1/2003 | Bracha et al. | |
| 6,516,455 B1 | 2/2003 | Teig et al. | |
| 6,519,751 B1 | 2/2003 | Huang et al. | |
| 6,543,043 B1 | 4/2003 | Wang et al. | |
| 6,546,540 B1 | 4/2003 | Igarashi et al. | |
| 6,557,145 B1 | 4/2003 | Boyle et al. | |
| 6,567,967 B1 | 5/2003 | Greidinger et al. | |
| 6,601,227 B1 | 7/2003 | Trimberger | |
| 2001/0003843 A1 | 6/2001 | Scepanovic et al. | |
| 2001/0009031 A1 | 7/2001 | Nitta et al. | |
| 2002/0073390 A1 | 6/2002 | Teig et al. | |
| 2002/0100007 A1 | 7/2002 | Teig et al. | |
| 2002/0124231 A1 | 9/2002 | Teig et al. | |
| 2002/0133798 A1 | 9/2002 | Teig et al. | |
| 2002/0147958 A1 | 10/2002 | Teig et al. | |
| 2002/0157075 A1 | 10/2002 | Teig et al. | |
| 2002/0165105 A1 | 11/2002 | Teig et al. | |
| 2002/0170027 A1 | 11/2002 | Teig et al. | |
| 2002/0174412 A1 | 11/2002 | Teig et al. | |
| 2002/0182844 A1 | 12/2002 | Igarashi et al. | |
| 2002/0199165 A1 | 12/2002 | Teig et al. | |
| 2003/0005399 A1 | 1/2003 | Igarashi et al. | |
| 2003/0014725 A1 | 1/2003 | Sato et al. | |
| 2003/0018947 A1 | 1/2003 | Teig et al. | |
| 2003/0023943 A1 | 1/2003 | Teig et al. | |
| 2003/0025205 A1 | 2/2003 | Shively | |
| 2003/0043827 A1 | 3/2003 | Teig et al. | |
| 2003/0056167 A1 | 3/2003 | Teig et al. | |
| 2003/0063568 A1 | 4/2003 | Teig et al. | |
| 2003/0063614 A1 | 4/2003 | Teig et al. | |
| 2003/0064559 A1 | 4/2003 | Teig et al. | |
| 2003/0066045 A1 | 4/2003 | Teig et al. | |
| 2003/0079193 A1 | 4/2003 | Teig et al. | |
| 2003/0086042 A1 | 4/2003 | Teig et al. | |
| 2003/0086043 A1 | 4/2003 | Teig et al. | |
| 2003/0088044 A1 | 4/2003 | Teig et al. | |
| 2003/0088841 A1 | 5/2003 | Teig et al. | |
| 2003/0088844 A1 | 5/2003 | Teig et al. | |
| 2003/0101428 A1 | 5/2003 | Teig et al. | |
| 2003/0115566 A1 | 6/2003 | Teig | |
| 2003/0121015 A1 | 6/2003 | Teig et al. | |
| 2004/0044979 A1 | 3/2004 | Aji et al. | |

FOREIGN PATENT DOCUMENTS

| | | |
|---|---|---|
| JP | 02-262354 | 10/1990 |
| JP | H03-173471 A | 7/1991 |
| JP | H05-102305 A | 4/1993 |
| JP | H05-243379 A | 9/1993 |
| JP | H07-86407 A | 3/1995 |
| JP | H09-162279 A | 6/1997 |
| JP | 411296560 A | 10/1999 |
| JP | 2000-82743 A | 3/2000 |

OTHER PUBLICATIONS

Ahuja, R. et al., Faster Algorithms for the Shortest Path Problem, Journal of the Association for Computing Machinery, vol. 37, No. 2, Apr. 1990, pp. 213-223.

Brady, L. et al., Channel Routing on a 60° Grid, extended abstract, pp. 956-931.

Brambilla, A. et al., Statistical Method for the Analysis of Interconnects Delay in Submicrometer Layouts, IEEE, Aug. 2001, pp. 957-966.

Carothers, K., A Method of Measuring Nets Routability for MCM's General Area Routing Problems, 1999, pp. 186-192.

Chen, H. et al., Physical Planning of On-Chip Interconnect Architectures, 2002, IEEE, Interntional Conference, pp. 30-35.

Cheng, K., Manhattan or Non Manhattan? A Study of Alternative VLSI Routng Arhcitectures, pp 47-52, 2000.

Cheng, K., Steiner Problem in Octilinear Routing Model, a Thesis Submitted for the Degree of Master of Science, National University Singapore, 1995, pp. 1-122.

Chip Model with Wiring Cost Map, Aug. 1983, IBM Technical Disclosure Bulletin, vol. 26, iss. 3A, pp. 929-933.

Cong, J. et al., Efficient Heuristics for the Minimum Shortest Path Steiner Arborescence Problem with Applications to VLSI Physical Design, Cadence Design Systems and UCLA Computer Science Department, pp. 88-95.

Cong, J. et al., Performance-Driven Multi-Layer General Routing for PCB/MCM Designs, UCLA Computer Science Department, 1998, pp. 356-361.

Enbody, R. et al., Near-Optimal n-Layer Channel Routing, 23$^{rd}$ Design Automation Conference, 1986, pp. 708-714.

Fang, S. et al., Constrained Via Minimization with Practical Considerations for Multi-Layer VLSI/PCB Routing Problems, 28$^{th}$ ACM/IEEE Design Automation Conference, 1991, pp. 60-65.

Hom, I. et al., Estimation of the Number of Routing Layers and Total Wirelength in a PCB Through Wiring Distribution Analysis, 1996, pp. 1-6.

Hong, X. et al., Performance-Driven Steiner Tree Algorithms for Global Routing, 30$^{th}$ ACM/IEEE Design Automation Conference, 1993, pp. 177-181.

Hu, J et al.: "A Timing-Constrained algorithm for Simultaneous Global Routing of Multiple Nets" IEEE/ACM International Conference on Computer Aided Design. ICCAD-2000. IEEE/ACM Digest of Technical Papers (CAT. NO.00CH37140), Proceedings of International Conference on Computer Aided Design (ICCAD), San Jose, CA USA, Nov. 5-9, 2000. pp. 99-103.

Kastner R et al.: "Predictable Routing" IEEE/ACM International Conference on Computer Aided Design. ICCAD-2000. IEEE/ACM Digest of Technical Papers (CAT. NO.0037140), Proceedings of International Conference on Computer Aided Design (ICCAD), San Jose, CA, USA, Nov. 5-9, 2000. pp. 110-113.

Khoo, K. et al., An Efficient Multilayer MCM Router Based on Four-Via Routing, 30$^{th}$ ACM/IEEE Design Automation Conference, 1993, pp. 590-595.

Lillis, J. et al., Table-Lookup Methods for Improved Performance-Driven Routing, 1998, pp. 368-373.

Lipski, W. et al.l, A Unified Approach to Layout Wirability, Mathimatical Systems Theory, 1987, pp. 585-597.

Lodi, E. et al., A Preliminary Study of a Diagonal Channel-Routing Model, Algorithmica, 1989, pp. 585-597.

Lodi, E. et al., Lecture Notes in Computer Science, A 4d Channel Router for a Two Layer Diagonal Model, pp. 464-476, Jul. 1988.

Naclerio, N. et al., Via Minimization for Gridless Layouts, 24$^{th}$ ACM/IEEE Design Automation Conference, 1987, pp. 159-165.

Nam, G. et al, Satisfialbility-Based Layout Revisited: Detailed Routing of Complex FPGAs Via Search-BAsed Boolean SAT, 1999, pp. 167-175..

Oh, J. et al., Constructing Lower and Upper Bounded Delay Routing Trees Using Linear Programming, 33$^{rd}$ Design Automation Conference, 1996.

Partitioning Logic on to Graph Structure, IBM Technical Disclosure Bulletin, Feb. 1990, vol. 32, iss. 9A, pp. 469-475.

Phillips, N., Channel Routing by Constraint Logic, Department of Computer Science Southern Illinois University, ACM, 1992.

Takashima, Y. et al, Routability of FPGAs with Extremal Switch-Block Structures, IEICE Trans. Fundamentals, vol. E81-A, No. 5, May 1998, pp. 850-856.

Thakur, S. et al.l, Algorithms for a Switch Module Routing Problem, 1994, pp. 265-270.

Theune, D., et al., HERO: Hierarchical EMC-constrained routing, Nov. 1992, IEEE pp 468-472.

Tseng, H., Timing and Crosstalk Driven Area Routing, pp. 378-381.

Wang, D., Novel Routing Schemes for IC Layout, Part I: Two-Layer Channel Routing, 28$^{th}$ ACM/IEEE Automation Conference, 1991, pp. 49-53.

Wang, M. et al., Modeling and Minimization of Routing Congestion, Jan. 2000, IEEE proceedings of ASP-DAC, Asia and South Pacific, pp. 185-190.

Wood, G. et al., FPGA Routing and Routability Estimation Via Boolean Satisfiability, Department of Electrical and Computer Engineering Carnegie Mellon University, Pittsburgh, PA, pp. 119-125.

Zhang, C.X. et al., Floorplan Design Using a Hierarchical Neutral Learning Algorithm, IEEE, Jun. 1991. pp. 2060-2063.

Zhou, H. et al., An Optimal Algorithm for River Routing with Crosstalk Constraints, 1996.

Zhou, H. et al., Global Routing with Crosstalk Constraints, Department of Computer Sciences, University of Texas, 1998, pp. 374-377.

Zhou, H. et al., Optimal River Routing with Crosstalk Constraints, ACM Transactions on Design Automation of Electronic Systems, vol. 3, No. 3, Jul. 1998, pp. 496-514.

U.S. Appl. No. 09/737,220, filed Dec. 13, 2000, Teig et al.
U.S. Appl. No. 09/737,245, filed Dec. 13, 2000, Teig et al.
U.S. Appl. No. 09/739,460, filed Dec. 15, 2000, Teig et al.
U.S. Appl. No. 09/739,589, filed Dec. 15, 2000, Teig et al.
U.S. Appl. No. 09/742,171, filed Dec. 19, 2000, Teig et al.

A.H. Farrahl et al., Quality of EDA CAD Tools: Definitions, Metrics and Directions, Quality Electronic Design, 2000, Proceedings of the first International Symposium on Mar. 2000, pp 395-405.

C. Chiang, et al., Wirability of Knock-Knee Layouts with 45° Wires, IEEE Transactions on Circuits and Systems, vol. 38, Issue 6, pp 613-624, Jun. 1991.

J. Su et al., Post-Route Optimization for Improved Yield Using Rubber-Band Wiring Model, 1997 International Conference on Computer-Aided Design, pp 700-706, Nov. 1997.

J. Vicente, RSR: A New Rectilinear Steiner Minimum Tree Approximation for FPGA Placement and Global Routing, Proceedings of the 24$^{th}$ Euro Micro Conference, pp 192-195, Aug. 1998.

K. Powers et al., The 60° Grid: Routing Channels in Width d/square root 3, VLSI, 1991, Proceedings., First Great Lakes Symposium on Kalamazoo, MI, USA, pp 214-291, Mar. 1991.

M. Alexander et al., Performance-Oriented Placement and Routing for field-programmable gate arrays, Proceedins of the European Design Automation Conference, pp. 80-85, 1995.

M. Alexander et al., Placement and Routing for Performance-Oriented FPGA Layout, VLSI Design, vol. 7, No. 1, 1998.

M. Igarashi et al., A Diagonal-Interconnect Architecture and Its Application to RISC Core Design, 2002 IEEE Solid-State Circuits Conference, pp 210-460, Feb. 2002.

P. Dood, et al. A Two-Dimensional Topological Compactor with Octagonal Geometry, 28$^{th}$ ACM/IEEE Design Automation Conference, pp 727-731, Jul. 1991.

P. Parikh, et al., Congestion Driven Quadratic Placement, Proceedings of Design Automation Conference, 1998, pp 275-278.

R. Putatunda et al., VITAL: Fully Automatic Placement Strategies for Very Large Semicustom Designs, Proceedings of the International Conference on Computer Design: VLSI in Computers and Processors, pp 434-439 Oct. 1988.

S. Dutt, et al., Probabililty-Based Approaches to VLSI Circuit Partitioning, IEEE Trans. on Computer-Aided Design of IC's and Systems, vol. 19, No. 5, May 2000, pp 534-549.

Y. Sekiyama et al., Timing-Oriented Routers for PCB Layout Design of High-Performance Computers, International Conference on Computer Aided Design, pp 332-335, Nov. 1991.

U.S. Appl. No. 09/737,220, Teig et al., filed Dec. 13, 2000.
U.S. Appl. No. 09,737,245, Teig et al., filed Dec. 13, 2000.
U.S. Appl. No. 09/739,460, Teig et al., filed Dec. 15, 2000.
U.S. Appl. No. 09/739,589, Teig et al., filed Dec. 15, 2000.
U.S. Appl. No. 09/742,171, Teig et al., filed Dec. 19, 2000.

* cited by examiner

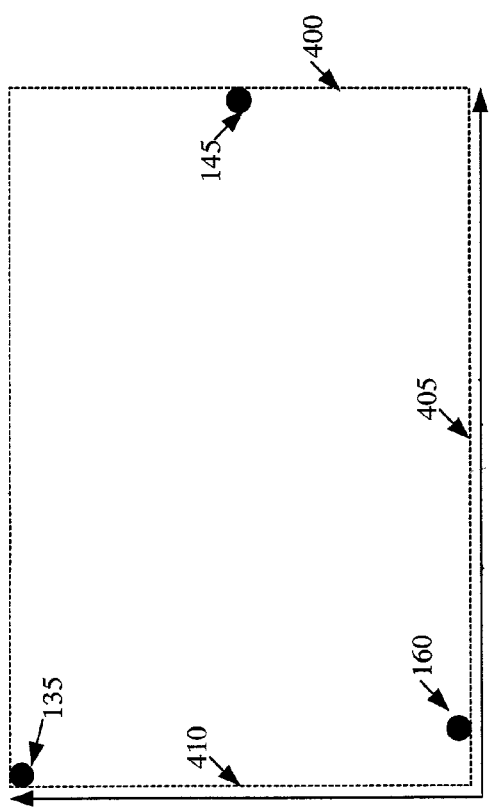
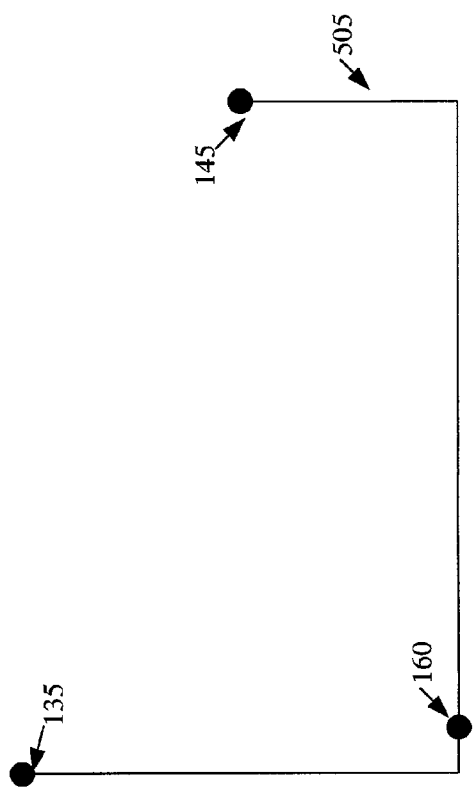

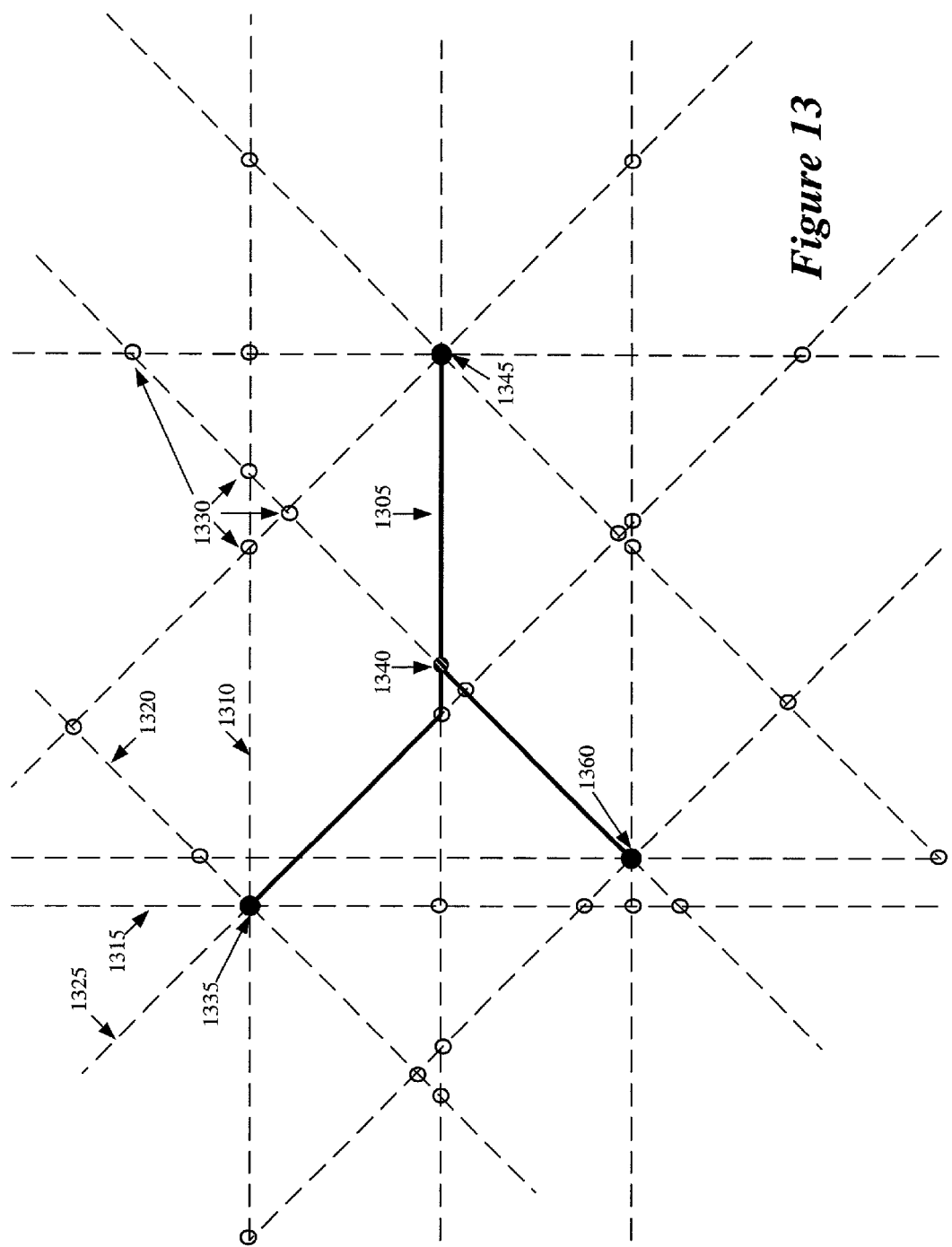

*Figure 35:* $\frac{\textit{Figure 35A}}{\textit{Figure 35B}}$

US 7,055,120 B2

METHOD AND APPARATUS FOR PLACING CIRCUIT MODULES

CLAIM OF BENEFIT TO PRIOR APPLICATIONS

This patent application is a continuation-in-part of U.S. patent application entitled "Method and Apparatus for Considering Diagonal Wiring in Placement," having Ser. No. 09/731,891, and filed Dec. 6, 2000; and is also a continuation-in-part of "Recursive Partitioning Placement Method and Apparatus," having the Ser. No. 09/732,181, and filed on Dec. 6, 2000 now U.S. Pat. No. 6,826,737 filed Nov. 30, 2004. This patent application is also a continuation-in-part application of U.S. patent application Ser. No. 10/013,816, filed Sep. 19, 2001.

FIELD OF THE INVENTION

The invention is directed towards method and apparatus for considering diagonal wiring in placement.

BACKGROUND OF THE INVENTION

An integrated circuit ("IC") is a device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of wiring ("wiring layers") that interconnect its electronic and circuit components. For instance, many IC's are currently fabricated with metal or polysilicon wiring layers (collectively referred to below as "metal layers") that interconnect its electronic and circuit components. One common fabrication model uses five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a net list. In other words, a net list specifies a group of nets, which, in turn, specify the interconnections between a set of pins.

FIG. 1 illustrates an example of an IC layout 100. This layout includes five circuit modules 105, 110, 115, 120, and 125 with pins 130–160. Four interconnect lines 165–180 connect these modules through their pins. In addition, three nets specify the interconnection between the pins. Specifically, pins 135, 145, and 160 define a three-pin net, while pins 130 and 155, and pins 140 and 150 respectively define two two-pin nets. As shown in FIG. 1, a circuit module (such as 105) can have multiple pins on multiple nets.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; (5) compaction, which compresses the layout to decrease the total IC area; and (6) verification, which checks the layout to ensure that it meets design and functional requirements.

Placement is a key operation in the physical design cycle. It is the process of arranging the circuit modules on a layout, in order to achieve certain objectives, such as reducing layout area, wirelength, wire congestion, etc. A poor placement configuration not only can consume a large area, but it also can make routing difficult and result in poor performance.

Numerous EDA placers have been proposed to date. Certain placers are constrained-optimization placers, which (1) use cost-calculating functions to generate placement scores (i.e., placement costs) that quantify the quality of placement configurations, and (2) use optimization algorithms to modify iteratively the placement configurations to improve the placement scores generated by the cost-calculating functions.

A constrained-optimization placer typically receives (1) a list of circuit modules, (2) an initial placement configuration for these modules, and (3) a net list that specifies the interconnections between the modules. The initial placement configuration can be random (i.e., all the modules can be positioned randomly). Alternatively, the initial configuration can be partially or completely specified by a previous physical-design operation, such as the floor planning.

A constrained-optimization placer then uses a cost-calculating function to measure the quality of the initial placement configuration. The cost function generates a metric score that is indicative of the placement quality. Different cost-calculating functions measure different placement metrics. For instance, as further described below, some functions measure wirelength (e.g., measure each net's minimum spanning tree, Steiner tree, or bounding-box perimeter, etc.), while others measure congestion (e.g., measure number of nets intersected by cut lines).

After calculating the metric cost of the initial placement configuration, a constrained-optimization placer uses an optimization algorithm to modify iteratively the placement configuration to improve the placement score generated by its cost-calculating function. Different optimization techniques modify the placement configuration differently. For instance, at each iteration, some techniques move one circuit module, others swap two modules, and yet others move a number of related modules. Also, at each iteration, some optimization techniques (e.g., KLFM and tabu search algorithms) search for the best move, while others (e.g., simulated annealing and local optimization) select random moves. In addition, some techniques (e.g., simulated annealing) accept moves that make the metric score worse, whereas others (e.g., local optimization) do not.

Four types of constrained-optimization placement techniques are described below.

A. Min-Cut Bipartitioning.

Some placers use min-cut bipartitioning. This technique uses horizontal and vertical cut lines to partition the IC layout recursively into successive pairs of regions. At each level of the recursion, this technique then moves the circuit modules between the regions at that level, in order to reduce the number of nets intersected by the cut line for that level. By minimizing the net-cut cost at each level of the recursion, these techniques reduce the wire congestion across the cut lines.

FIGS. 2 and 3 illustrate one example of min-cut bipartitioning. FIG. 2 illustrates an IC layout 200 that is partitioned initially in two regions 210 and 215 by a vertical cut line 205. After defining this initial cut line, the min-cut bipartitioning method calculates the number of nets that are intersected by this cut line. This number is indicative of the wire congestion about this cut line. An optimization algorithm (such as KLFM) is then used to modify the initial placement iteratively (i.e., to move the circuit modules iteratively), in order to minimize the net-cut cost across the initial cut line 205.

Once the congestion across the initial cut line is minimized, the min-cut bipartitioning method is applied recursively to the two regions created by the initial cut line, and then it is applied to the resulting regions created by the succeeding cut lines, and so on. FIG. 3 illustrates the IC layout 200 after it has been recursively partitioned by seven cut lines 205 and 220–245.

B. Semi-Perimeter Method.

The semi-perimeter method is another cost-calculating function used by some constrained-optimization techniques. This method quickly generates an estimate of the wirelength cost of a placement. For each net, this method typically (1) finds the smallest bounding-box rectangle that encloses all the net's pins, and (2) computes half the perimeter of this bounding rectangle.

FIG. 4 illustrates a bounding box 400 for a net that contains pins 135, 145, and 160 of FIG. 1. The computed semi-perimeter value of this box 400 equals the sum of its width 405 and height 410. This computed semi-perimeter value provides a lower bound estimate on the amount of wire required to route a net.

The semi-perimeter method sums the semi-perimeter values of all the bounding rectangles of all the nets to obtain an estimated wirelength cost for a placement configuration. An optimization technique can then be used to modify iteratively the placement configuration to reduce this wirelength cost estimate, and thereby obtain an acceptable placement configuration.

C. Minimum Spanning Tree.

To estimate the wirelength cost of placement configurations, some constrained-optimization placement techniques compute and add the length of the rectilinear minimum spanning tree ("RMST") for each net. A net's RMST is typically defined as a tree that connects (i.e., spans) the net's pins through the shortest Manhattan wiring route that only branches at the pin locations.

More specifically, the RMST for an N-pin net includes (1) N nodes (also called points or vertices) corresponding to the N pins, and (2) N−1 edges that connect its N nodes. In addition, the edges of the RMST are either horizontal or vertical, and these edges start and end at one of the N nodes of the tree. FIG. 5 illustrates a RMST 505 for the net that contains pins 135, 145, and 160 of FIG. 1.

The sum of the length of the RMST for each net provides an estimate of the wirelength cost of a placement. An optimization algorithm can then be used to modify iteratively the placement configuration to minimize this wirelength cost.

D. Steiner Tree.

Rectilinear Steiner trees are another type of tree structure that constrained-optimization placement techniques generate to estimate the wirelength cost of placement configurations. Rectilinear Steiner trees are similar to RMST's except that Steiner trees do not restrict branching to only pin locations. In rectilinear Steiner trees, a horizontal or vertical edge can branch from a point on an edge that connects two other net pins.

To construct a Steiner tree for an N-pin net, additional points, called Steiner points, are typically added to the net. If R Steiner points are added to the net, the rectilinear Steiner tree for the N-pin net is the RMST on the N +R points. FIG. 6 illustrates a Steiner tree 605 for the net that contains pins 135, 145, and 160 of FIG. 1. In this example, the Steiner point that has been added is point 610.

Heuristic techniques are often used to select the R Steiner points and construct the Steiner tree, since these problems cannot be solved in polynomial time. A heuristic technique is a clever algorithm that only searches inside a subspace of the total search space for a good rather than the best solution that satisfies all design constraints.

Hence, to get an estimate of the wirelength cost of a placement, some constrained-optimization placement techniques use heuristic approximations to identify rectilinear Steiner trees for the nets. The sum of the length of the heuristic Steiner trees for all the nets provides an estimate of the wirelength cost of a placement. An optimization algorithm can then be used to modify iteratively the placement configuration to minimize this wirelength cost.

E. Recursive Grid Partitioning.

Recursive grid partitioning is another technique for calculating the wirelength cost of placement configurations. A recursive-grid-partitioning placer typically uses sets of crossing horizontal and vertical lines to divide an IC layout recursively into several sub-regions. At each recursion level, the placer then uses an optimization algorithm to move the circuit modules between the sub-regions defined at that recursion level, in order to reduce the wirelength cost. After minimizing the wirelength cost at a particular recursion level, the placer recursively partitions that level's sub-regions that meet certain criteria, in order to optimize further the wirelength cost within those partitioned sub-regions.

For examples, once recursive partitioning technique recursively divides an IC layout into quadrisections (i.e., into four regions). Under this approach, minimum spanning trees are typically used to estimate the wirelength cost for connecting modules in different quadrisections. Another recursive partitioning technique recursively divides an IC layout into nine regions. This style of partitioning is sometimes referred to as "sharp" partitioning. For this type of partitioning, Steiner trees are typically used to estimate the wirelength cost for connecting modules in different regions.

The above-described placement techniques do not consider diagonal wiring in calculating their placement-configuration cost. Hence, when diagonal routes are selected for the interconnect lines, these techniques result in poor placement configurations, which inefficiently consume the layout area, utilize too much wire, and/or have poor wire congestions. Consequently, there is a need in the art for placers that consider diagonal wiring in calculating their placement-configuration costs.

SUMMARY OF THE INVENTION

The invention is directed towards method and apparatus that consider diagonal wiring in placement. Some embodiments of the invention are placers that use diagonal lines in calculating the costs of potential placement configurations. For instance, some embodiments estimate the wirelength cost of a placement configuration by (1) identifying, for each net in a net list, a bounding box that encloses all the circuit elements of the net, (2) computing an attribute of each bounding box by using a line that can be completely or partially diagonal, and (3) computing the wirelength cost estimate based on the computed attributes.

To estimate the wirelength cost of different placement configurations, other embodiments construct connection graphs that model the net interconnect topologies. These connection graphs can have edges that are completely or partially diagonal. These embodiments might also compute other attributes of the connection graphs.

Yet other embodiments partition the circuit region at issue into a several sub regions. For a net in the circuit region, these embodiments identify the set of sub-regions that contain the net's set of circuit elements, and then identify an attribute (e.g., wirelength) of a connection graph that traverses the identified set of sub-regions. The identified connection graph has at least one completely or partially diagonal edge. These embodiments then use the identified attribute to compute a placement metric.

For a placement configuration, some embodiments compute a delay cost that accounts for potential diagonal wiring. For instance, some embodiments compute such a delay cost for a net from a wirelength placement cost for the net.

Other embodiments use diagonal lines to measure congestion costs of potential placement configurations. For instance, some placers use diagonal lines as cut lines that divide the IC layout into regions. These placers then generate congestion-cost estimates by measuring the number of nets cut by the diagonal cut lines.

BRIEF DESCRIPTION OF THE DRAWINGS

The novel features of the invention are set forth in the appended claims. However, for purpose of explanation, several embodiments of the invention are set forth in the following figures.

FIG. 4 illustrates a bounding box for a net that contains pins 135, 145, and 160 of FIG. 1.

FIG. 5 illustrates a RMST for the net that contains pins 135, 145, and 160 of FIG. 1.

FIG. 13 illustrates a heuristically constructed Steiner tree with 45° edges for the net represented by pins 135, 145, and 160 of FIG. 1.

DETAILED DESCRIPTION OF THE INVENTION

Figure 1:
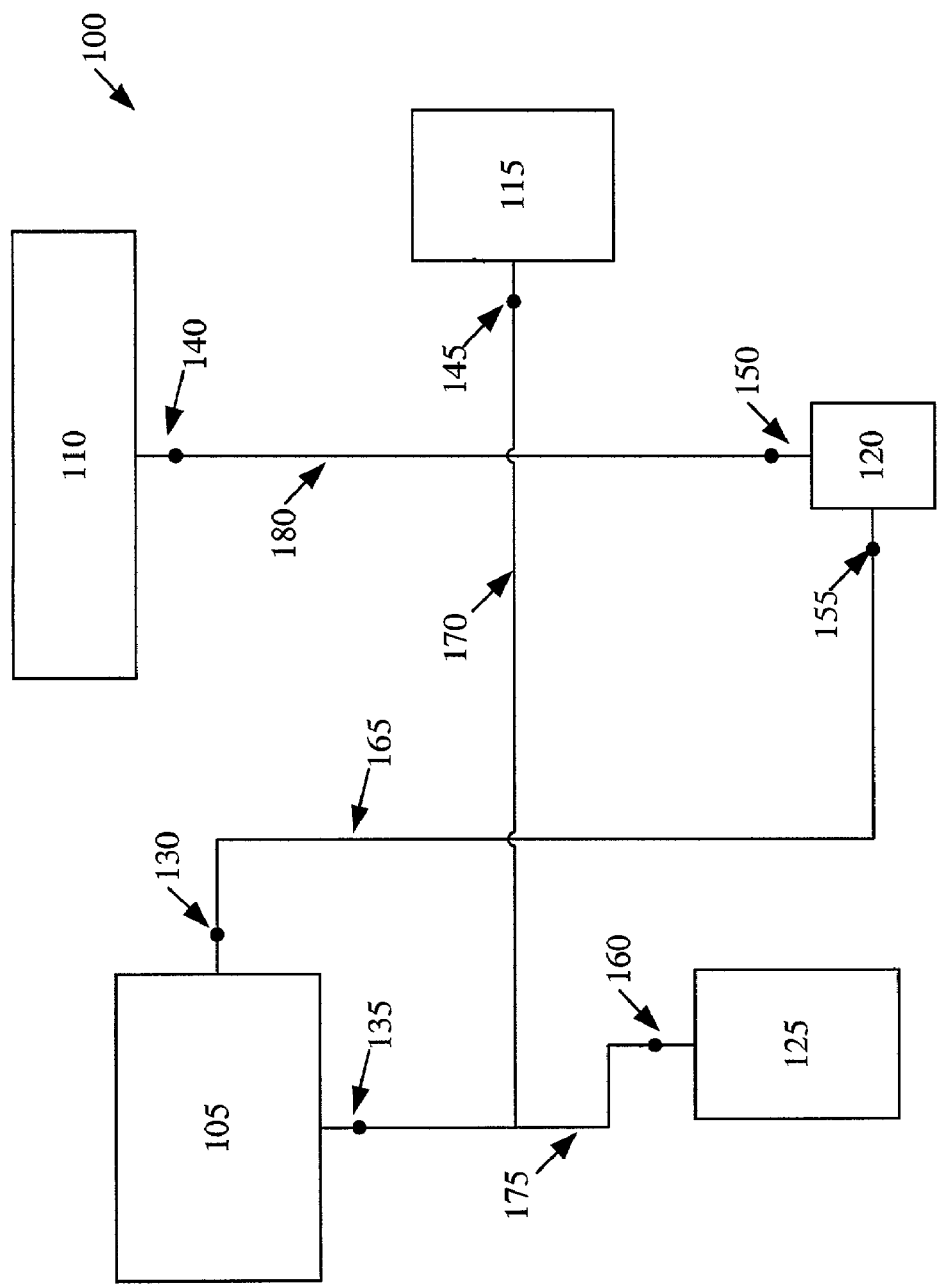
FIG. 1 illustrates an example of an IC layout.
Figure 3:
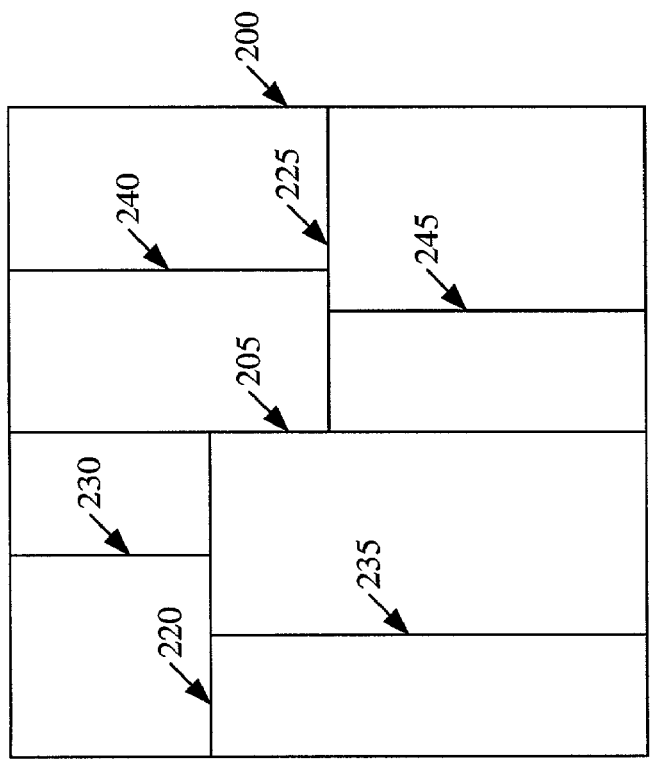
FIG. 3 illustrates the IC layout of FIG. 2 after it has been recursively partitioned by seven cut lines.
Figure 2:
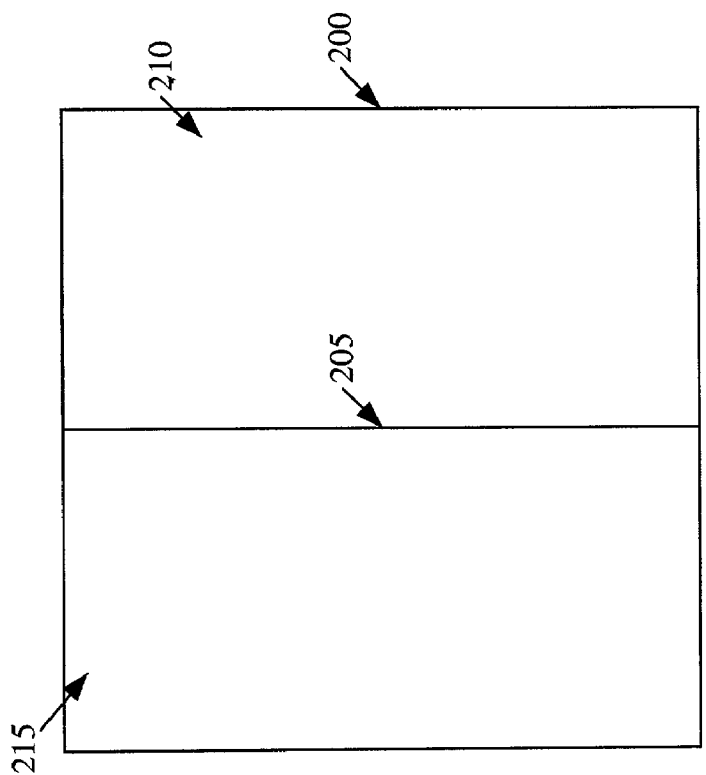
FIG. 2 illustrates an IC layout that is partitioned initially in two regions by a vertical cut line.
Figure 6:
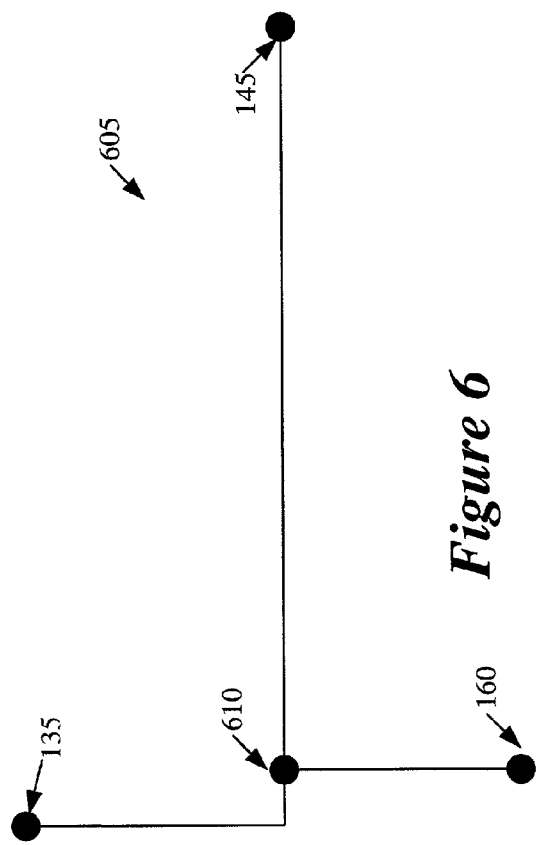
FIG. 6 illustrates a Steiner tree for the net that contains pins 135, 145, and 160 of FIG. 1.

The invention is directed towards method and apparatus for considering diagonal wiring in placement. In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention are placers that consider diagonal lines in calculating the costs of potential placement configurations. For instance, some embodiments estimate the wirelength cost of placement configurations by (1) identifying, for each net, a bounding box that encloses all the circuit elements (i.e., pins or circuit modules) of the net, (2) computing an attribute of each bounding box by using a line that can be completely or partially diagonal, and (3) generating a placement cost based on the computed attributes. Section II below discusses several embodiments that use such a bounding-box method.

Other embodiments model potential interconnect topologies to estimate the wirelength cost of different placement configurations. These embodiments construct connection graphs that can have edges that are completely or partially diagonal. Examples of such connection graphs include minimum spanning trees and Steiner trees. Section III presents several such embodiments.

Other embodiments use diagonal lines as cut lines that divide the IC layout into regions. These embodiments then generate congestion-cost estimates by measuring the number of nets cut by the diagonal cut lines. Section IV discusses several such embodiments that use min-cut bipartitioning with diagonal cut lines.

Other embodiments use partitioning lines to divide the IC regions into sub-regions and then measure wirelength costs based on the configuration of the nets with respect to the sub-regions. Section V discusses several such embodiments. Also, some embodiments calculate placement delay costs that account for potential diagonal wiring during routing. Section VI discusses several such embodiments.

Before discussing the embodiments presented in Sections II–VI, several diagonal-wiring architectures that can be used in conjunction with the invention's cost-calculating methods are described in Section I. Also, Section VII presents several optimization techniques that can be used for optimizing the costs calculated by the cost-calculating methods described in Sections II–VI. Section VIII then illustrates a computer system used in some embodiments of the invention. Finally, Section IX describes the advantages of considering diagonal wiring during placement.

I. Diagonal Wiring Architecture

Some embodiments of the invention calculate the cost of placement configurations for IC layouts that have diagonal interconnect lines (i.e., diagonal wiring). In some of these embodiments, the IC layouts not only have diagonal interconnect lines, but also have horizontal and vertical interconnect lines.

As used in this document, an interconnect line is "diagonal" if it forms an angle other than zero or ninety degrees with respect to one of the sides of the layout boundary. On the other hand, an interconnect line is "horizontal" or "vertical" if it forms an angle of 0° or 90° with respect to one of the sides of the layout.

Figure 7:
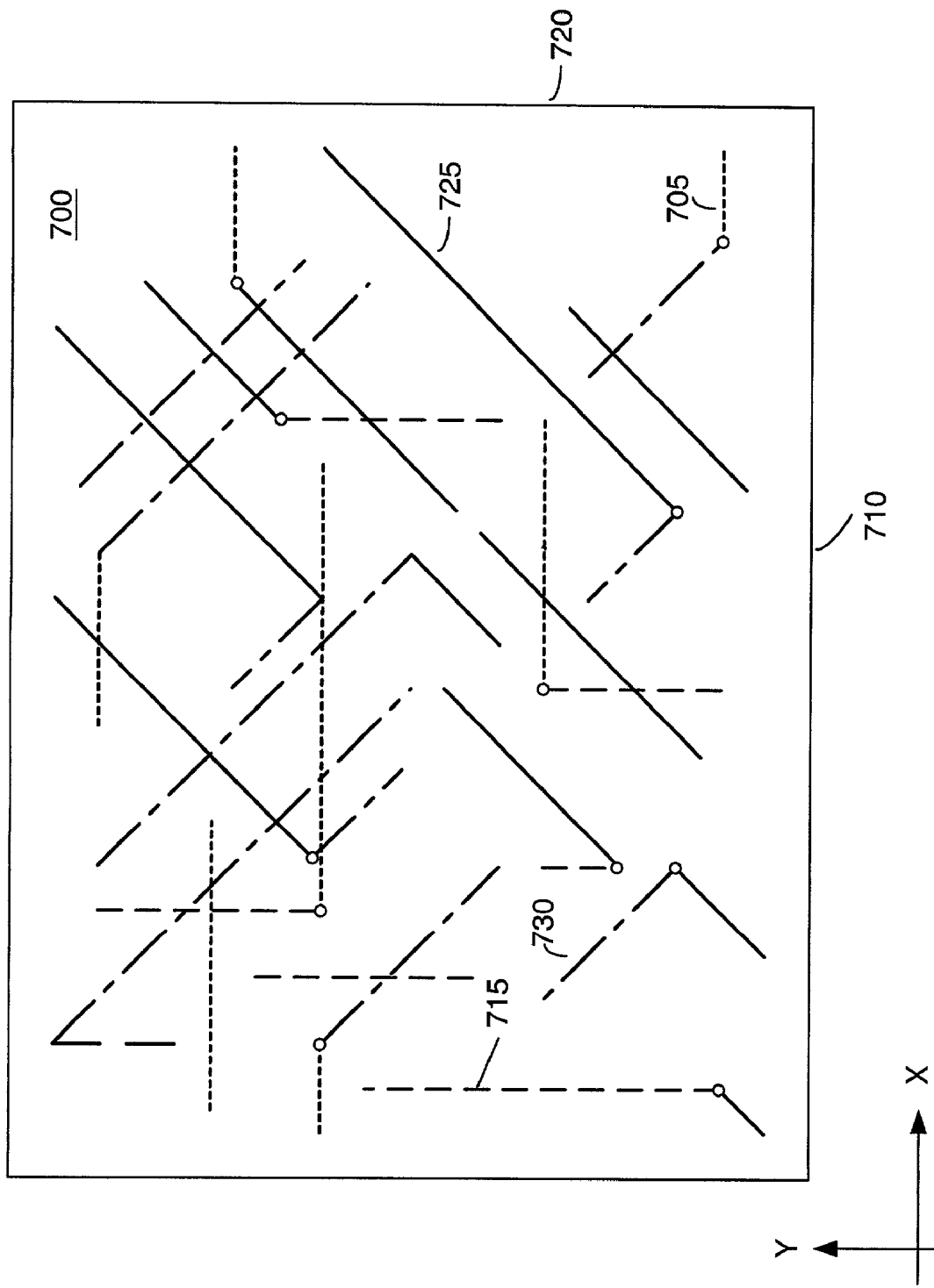
FIG. 7 illustrates the wiring architecture of an IC layout that not only uses diagonal lines, but also uses horizontal and vertical lines.

FIG. 7 illustrates the wiring architecture (i.e., the interconnect-line architecture) of an IC layout 700 that utilizes horizontal, vertical, and 45° diagonal interconnect lines. In this document, this architecture is referred to as the octagonal wiring model, in order to convey that an interconnect line can traverse in eight separate directions from any given point.

The horizontal lines 705 are the lines that are parallel (i.e., are at 0°) to the x-axis, which is defined to be parallel to the width 710 of the layout. The vertical lines 715 are parallel to the y-axis, which is defined to be parallel to the height 720 of the layout. In other words, the vertical interconnect lines 715 are perpendicular (ie., are at 90°) to the width of the IC layout. In this architecture, one set 725 of diagonal lines are at +45° with respect to the width of the IC layout, while another set 730 are at −45° with respect to the width of the IC layout.

Figure 8:
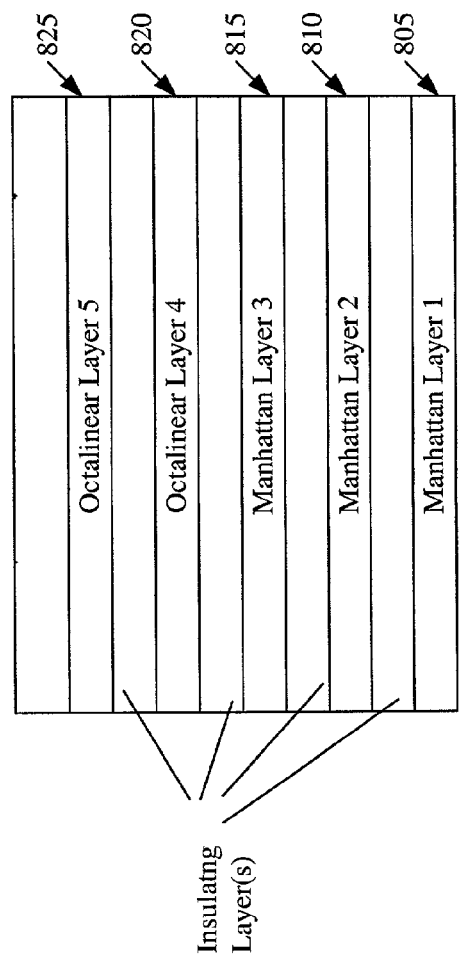
FIG. 8 illustrates one manner of implementing the wiring architecture illustrated in FIG. 7.

FIG. 8 illustrates one manner of implementing the wiring architecture illustrated in FIG. 7 on an IC. Specifically, FIG. 8 illustrates five metal layers for an IC. The first three layers 805–815 are Manhattan layers. In other words, the preferred direction for the wiring in these layers is either the horizontal direction or the vertical direction. The preferred wiring direction in the first three layers typically alternates so that no two consecutive layers have the same direction wiring. However, in some cases, the wiring in consecutive layers is in the same direction.

The next two layers 820 and 825 are diagonal layers. The preferred direction for the wiring in the diagonal layers is ±45°. Also, as in the first three layers, the wiring directions in the fourth and fifth layer are typically orthogonal (i.e., one layer is +45° and the other is −45°), although they do not have to be.

Even though some embodiments of the invention are described below to work with IC layouts that utilize the above-described octagonal wiring model, one of ordinary skill will understand that the invention can be used with any wiring model. For instance, the invention can be used with wiring architectures that are strictly diagonal (i.e., that do not have horizontal and vertical preferred direction wiring).

Also, some embodiments are used with non −45° diagonal wiring. For example, some embodiments are used with IC layouts that have horizontal, vertical, and ±120° diagonal interconnect lines.

II. Bounding-Box Method

For IC layouts that utilize horizontal, vertical, and diagonal interconnect lines, some embodiments of the invention compute a wirelength-cost estimate for each net in a net list, by (1) identifying a bounding box that encloses all the circuit elements of the net, and (2) computing an attribute of the bounding box by using a line that is at least partially diagonal. These embodiments then generate a wirelength-cost estimate based on the computed attributes of all the nets in the net list. For instance, some embodiments sum the computed attributes to obtain the wirelength-cost estimate for a placement configuration.

Figure 9:
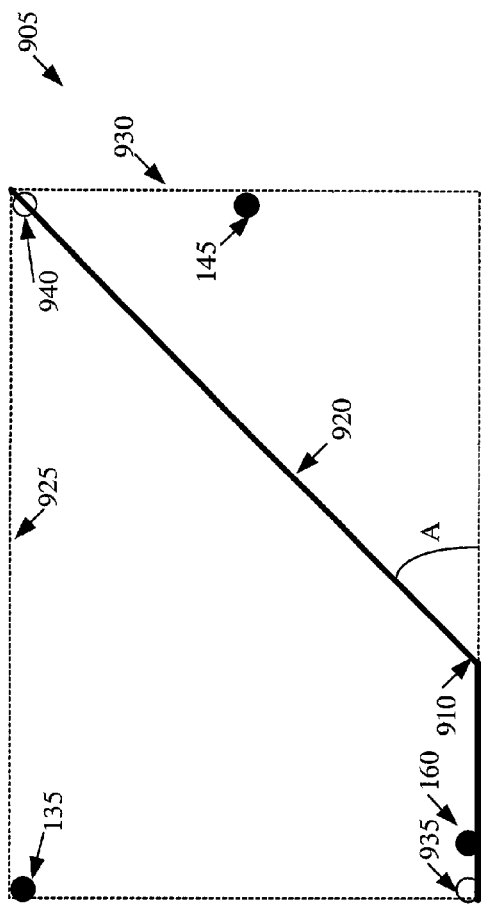
FIG. 9 provides an example of a bounding-box for the net represented by pins 135, 145, and 160 of FIG. 1.
Figure 10A:
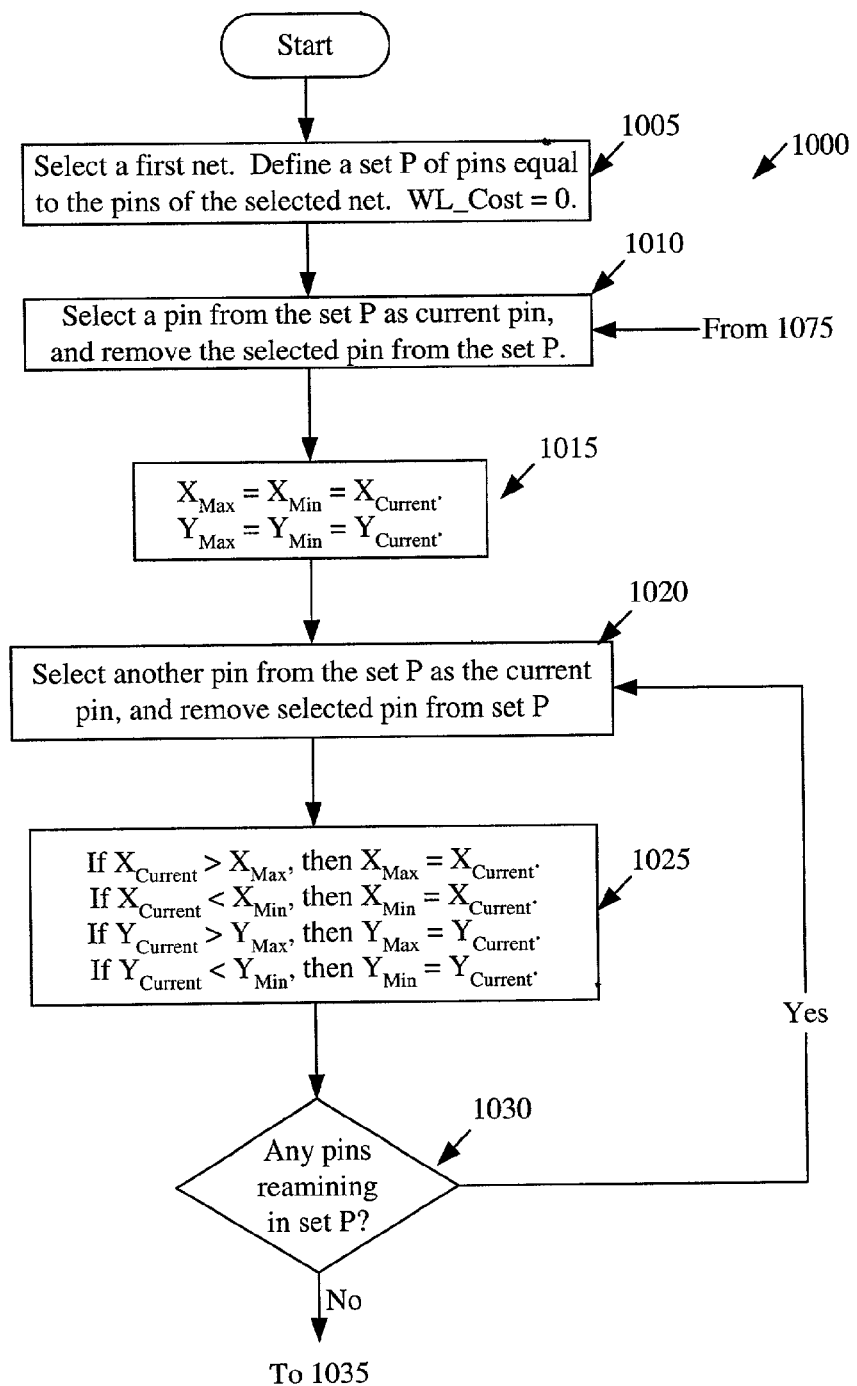
FIG. 10 illustrates a process for generating a wirelength estimate according to a bounding-box method of the invention.
Figure 10B:
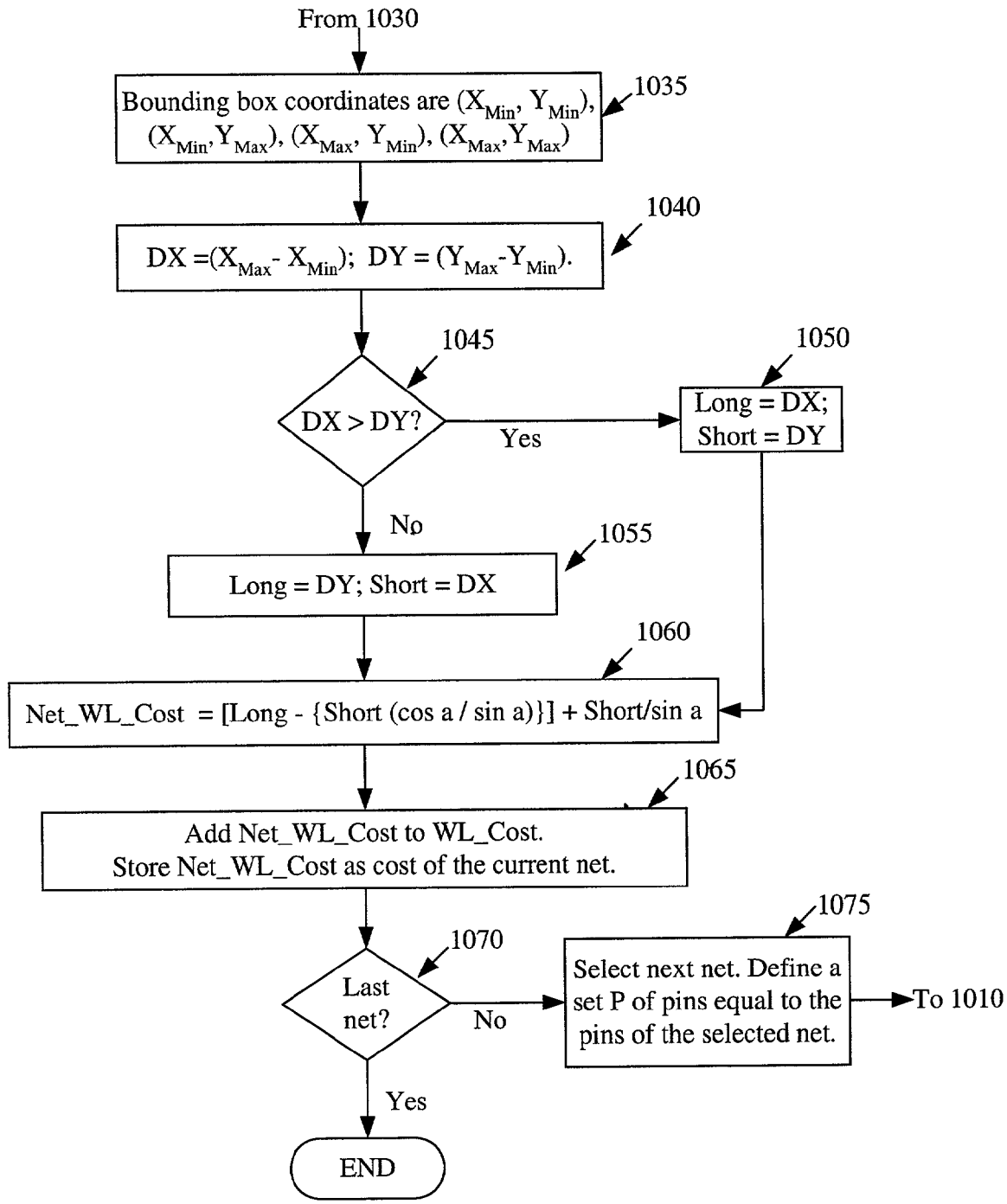

In some embodiments, the computed attribute of a net's bounding box is the minimum distance between opposing corners of the bounding box. FIGS. 9 and 10 illustrate one such embodiment of the invention. FIG. 9 presents an example of a bounding-box 905 for the net represented by pins 135, 145, and 160 of FIG. 1. Line 910 traverses the shortest distance between two opposing corners 935 and 940 of the box 905. As shown in FIG. 9, this line is partially diagonal. Specifically, in this example, one segment 920 of this line is diagonal, while another segment 915 is horizontal.

Equation (A) below provides the minimum distance between the two opposing corners 935 and 940 of the bounding box 905.

$$\text{Distance} = [L - \{S(\cos A/\sin A)\}] + S/\sin A \quad (A)$$

In this equation, "L" is the box's long side, which in this example is the box's width 925, while "S" is the box's short side, which in this example is its height 930. Also, in this equation, "A" is the angle that the diagonal segment 915 makes with respect to the long side of the bounding box.

In some embodiments, this angle A corresponds to the direction of some of the diagonal interconnect lines in the IC layout. For instance, in some embodiments, the angle A equals 45° when the IC layout uses the octagonal wiring model. In this manner, the diagonal cut 920 across the bounding box represents a diagonal interconnect line that forms the connection between two opposing corners of the bounding box.

Equations (B)–(D) illustrate how Equation (A) was derived. The length of the line 910 equals the sum of the lengths of its two segments 915 and 920. Equation (B) provides the length of the horizontal segment 915, while Equation (C) provides the length of the diagonal segment 920.

$$\text{Length of } 915 = L - (\text{Length of } 920) * (\cos A) \quad (B)$$

$$\text{Length of } 920 = S/\sin A \quad (C)$$

Equations (B) and (C) can be combined to obtain Equation (D) below, which when simplified provides Equation (A) above.

$$\text{Distance} = \text{Length of } 915 + \text{Length of } 920 = L - S/\sin A * (\cos A) + S/\sin A \quad (D)$$

When the angle A equals 45°, Equation (A) simplifies to Equation (E) below.

$$\text{Distance} = L + S * (sqrt(2) - 1) \quad (E)$$

If the bounding box has no width or height, then the bounding box is just a line, and the minimum distance between the opposing corners of this line is provided by the long (and only) side of the bounding box, which will be a horizontal or vertical line. Alternatively, when the bounding box is a square and the angle A is 45°, a line that is completely diagonal specifies the shortest distance between the box's two opposing corners.

When the angle A corresponds to the direction of some of the diagonal interconnect lines in the IC layout, the minimum distance computed by Equation (A) corresponds to the shortest length of wiring required to connect two hypothetical net circuit-elements located at opposing corners of the bounding box. In these situations, the distance computed by Equation (A) might not be indicative of the wirelength needed for nets with three or more circuit elements. Moreover, this distance might be shorter than the actual wiring path necessary for even a two-element net, as it may not be possible to route the net along line 910. The distance value computed by Equation (A) simply provides a lower-bound estimate on the amount of wire required to route a net in a wiring architecture that utilizes horizontal, vertical, and diagonal wiring. Some embodiments also use this equation for other arbitrary wiring models. However, some of these embodiments select the angle A among several choices so that the distance quantified by this equation is minimized.

FIG. 10 illustrates a cost-calculating process 1000 that uses the above-described bounding box method. A placer can use this cost-calculating process to generate a wirelength cost estimate for a set of nets on a net list. In some embodiments, the process 1000 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1000 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1000 to optimize the placement configuration for a wiring architecture that uses diagonal wiring.

The process 1000 initially (at 1005) sets the wirelength cost estimate (WL_Cost) to zero, and selects a first net from the received net list. Each net has a set N of pins. At 1005, the process also defines a set P of pins equal to the set N of pins of the selected net. At 1010, the process selects a pin from the defined set P of pins, and removes this selected pin from the set P. The process then uses (at 1015) the x- and y-coordinates of the selected pin to initialize the maximum and minimum x- and y-coordinates of a bounding box for the current net.

Next, the process selects (at 1020) another pin from the set P of pins for the current net. At 1025, the process examines the x- and y-coordinates of the pin selected at 1020 (i.e., the current pin) to determine whether it needs to modify the maximum and minimum x- and y-coordinates of the bounding box for the current net. Specifically, if the maximum x-coordinate ($X_{MAX}$) of the bounding box is less than the x-coordinate of the current pin, the process sets the maximum x-coordinate ($X_{MAX}$) of the bounding box equal to the x-coordinate of the current pin. Alternately, if the minimum x-coordinate ($X_{MIN}$) of the bounding box is greater than the x-coordinate of the current pin, the process sets the minimum x-coordinate ($X_{MIN}$) of the bounding box equal to the x-coordinate of the current pin. Similarly, if the minimum y-coordinate ($Y_{MIN}$) of the bounding box is greater than the y-coordinate of the current pin, the process sets the minimum y-coordinate ($Y_{MIN}$) of the bounding box equal to the y-coordinate of the current pin. On the other hand, if the maximum y-coordinate ($Y_{MAX}$) of the bounding box is less than the y-coordinate of the current pin, the process sets the maximum y-coordinate ($Y_{MAX}$) of the bounding box equal to the y-coordinate of the current pin.

After 1025, the process determines (at 1030) whether there are any pins in set P (i.e., whether there are any pins in the current net that it has not yet examined). If so, the process transitions back to select (at 1020) another pin, and to determine (at 1025) whether it needs to use the selected pin's coordinates to modify the x- and y-coordinates of the bounding box. If the process determines (at 1030) that it has examined all the pins of the current net, the process defines (at 1035) the four coordinates of the current net's bounding box as $(X_{MIN}, Y_{MIN})$, $(X_{MIN}, Y_{MAX})$, $(X_{MAX}, Y_{MIN})$, and $(X_{MAX}, Y_{MAX})$.

Next, the process determines (at 1040) the bounding-box's width and height. The process determines (1) the width by taken the difference between the maximum and minimum x-coordinates of the bounding box, and (2) the height by taking the difference between the maximum and minimum y-coordinates of the bounding box. The process then determines (at 1045) whether the computed width is greater than the computed height. If so, the process defines (1050) the width as the long side and the height as the short side. Otherwise, the process defines (at 1055) the width as the short side and the height as the long side.

The process then computes (at 1060) a wirelength cost estimate (Net_WL_Cost) for the current net, by computing the distance between two opposing corners of the bounding box by using the above-described Equation (A). The process next (at 1065) (1) adds the computed net wirelength cost (Net_WL_Cost) to the total wirelength cost (WL_Cost), and (2) stores the net wirelength cost (Net_WL_Cost). At 1070, the process determines whether it has examined all the nets in the net list. If not, at 1075, it selects another net from the net list, and defines a set P of pins equal to the set N of pin of this selected net. The process then transitions back to 1010 to compute the bounding-box cost for this selected net.

When the process has calculated the bounding-box cost for all the nets, the process determines (at 1070) that it has examined all the nets in the net list. At this point, the process returns the value of the wirelength cost variable (WL_Cost) as the estimated wirelength cost for the received net list, and then ends.

In some embodiments of the invention, the process 1000 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1000 to calculate the placement-configuration cost for each possible iterative modification to the placement configuration. This is further described below in Section VII, which presents several suitable optimization techniques.

III. Connection Graphs with Potential Diagonal Lines

Some embodiments of the invention construct connection graphs that model potential interconnect (i.e., wiring) topologies, in order to estimate the wirelength cost of different placement configurations. Generally, a connection graph for a net models (1) each net element (i.e., pin or module) as a node (also called a vertex or point), and (2) each potential interconnect line that connects two net elements as an edge (also called a line).

The connection graphs of the invention can include edges that are completely or partially diagonal. Such connection graphs include minimum spanning trees ("MST") and Steiner trees, which are described below. One of ordinary skill will understand that other embodiments of the invention use other connection graphs (such as complete graphs, minimum chain graphs, source-to-sink graphs, etc.) to model the potential interconnect topologies.

A. Minimum Spanning Trees.

Some embodiments generate wirelength cost estimate for placement configurations by (1) constructing, for each net, a MST that can have diagonal edges, (2) computing the length of each MST, and (3) summing the computed lengths. A minimum spanning tree for a net is a tree that connects (i.e., spans) the net's elements through the shortest route that only branches at the elements. The length of a minimum spanning tree provides a lower-bound estimate of the amount of wire needed to interconnect the net's elements (i.e., the net's pins or modules).

More specifically, a spanning tree for an N-element net includes (1) N nodes corresponding to the N elements, and (2) N–1 edges that connect its N nodes. The edges of a minimum spanning tree can only start and end at one of the N nodes of the tree. Also, in a MST, the edges are typically selected to provide the shortest achievable route to connect its nodes.

In some embodiments of the invention, the edges of the MST's can be horizontal, vertical, or diagonal. The diagonal edges can be completely or partially diagonal. Also, when the IC layouts use diagonal interconnect lines (e.g., ±120° interconnect lines), the diagonal edges of the MST's can be in the same direction (e.g., can be in ±120° directions) as some of the diagonal interconnect lines in the layout.

Figure 11:
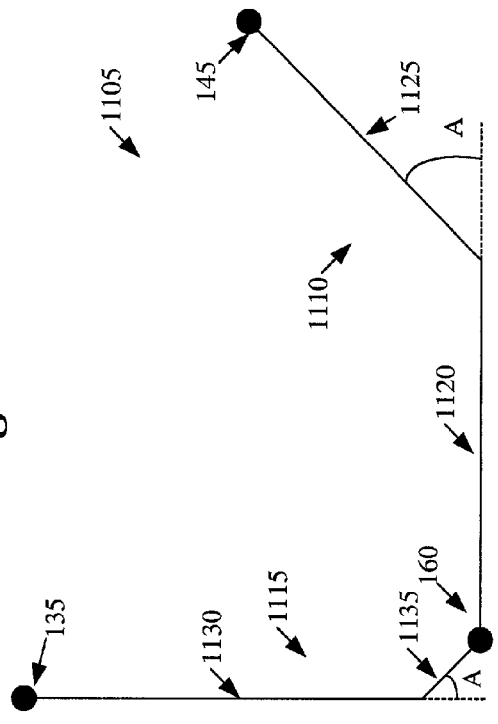
FIG. 11 presents a minimum spanning tree with diagonal edges.

For instance, when the IC layout uses an octagonal wiring model (i.e., uses horizontal, vertical, and 45° diagonal lines), some embodiments construct MST's that have horizontal, vertical, and 45° diagonal edges. FIG. 11 illustrates an example of such a MST. This tree 1105 is the MST of the net that contains pins 135, 145, and 160 of FIG. 1. This tree has two edges 1110 and 1115, with the first edge 1110 having a horizontal segment 1120 and a +45° diagonal segment 1125, while the second edge 1115 has a vertical segment 1130 and a –45° diagonal segment 1135.

By treating the two nodes of each MST edge as two opposing corners of a box, the length of each MST edge can be obtained by using the above-described Equation (A).

$$\text{Distance} = [L - \{S(\cos A/\sin A)\}] + S/\sin A \quad (A)$$

As described above, in this equation, "L" is the box's long side, "S" is the box's short side, and "A" is the angle that the diagonal segment of the edge makes with respect to the long side of the bounding box.

Figure 12A:
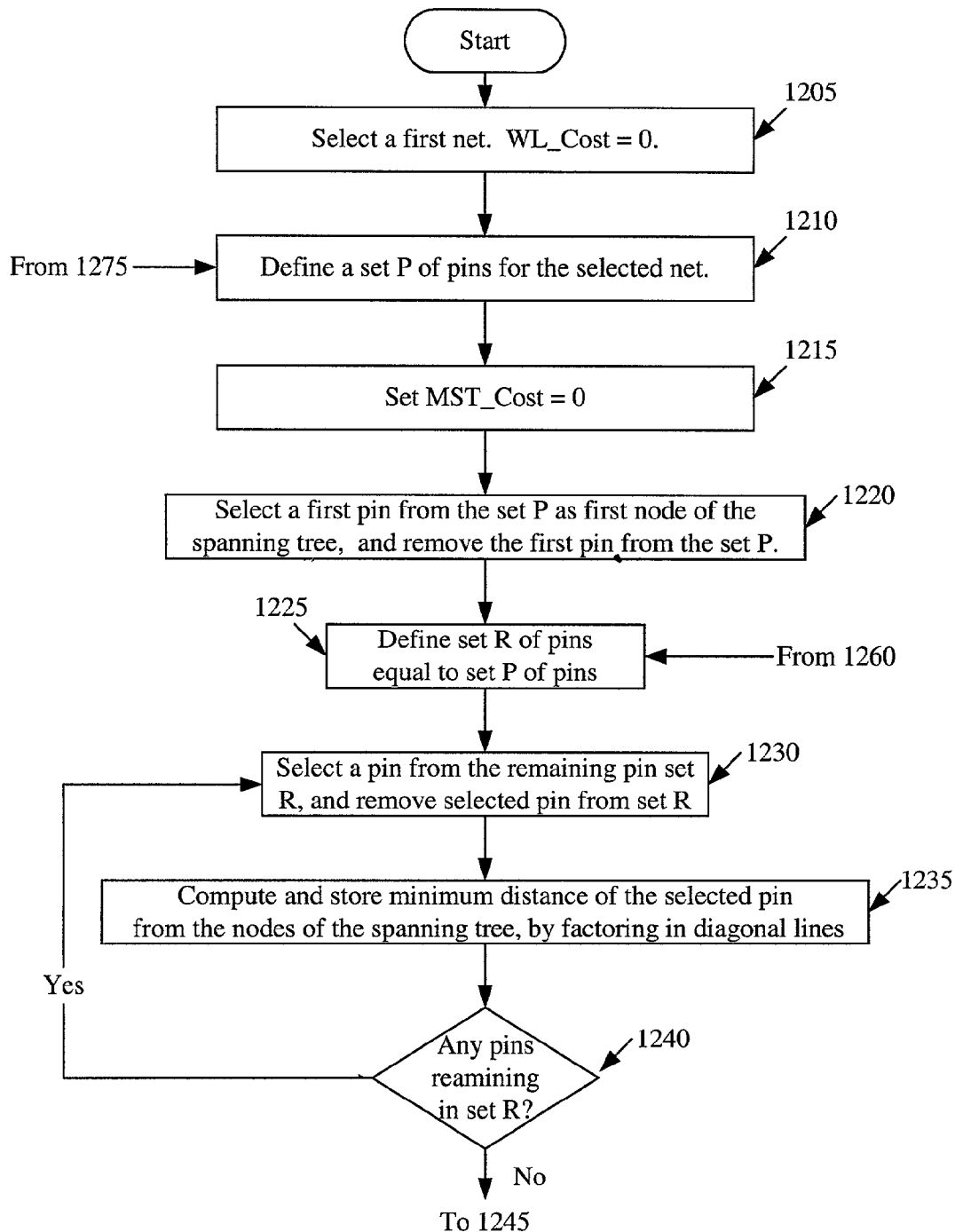
FIG. 12 illustrates a process for generating a wirelength estimate by constructing MST's that include horizontal, vertical, and 45° edges.
Figure 12B:
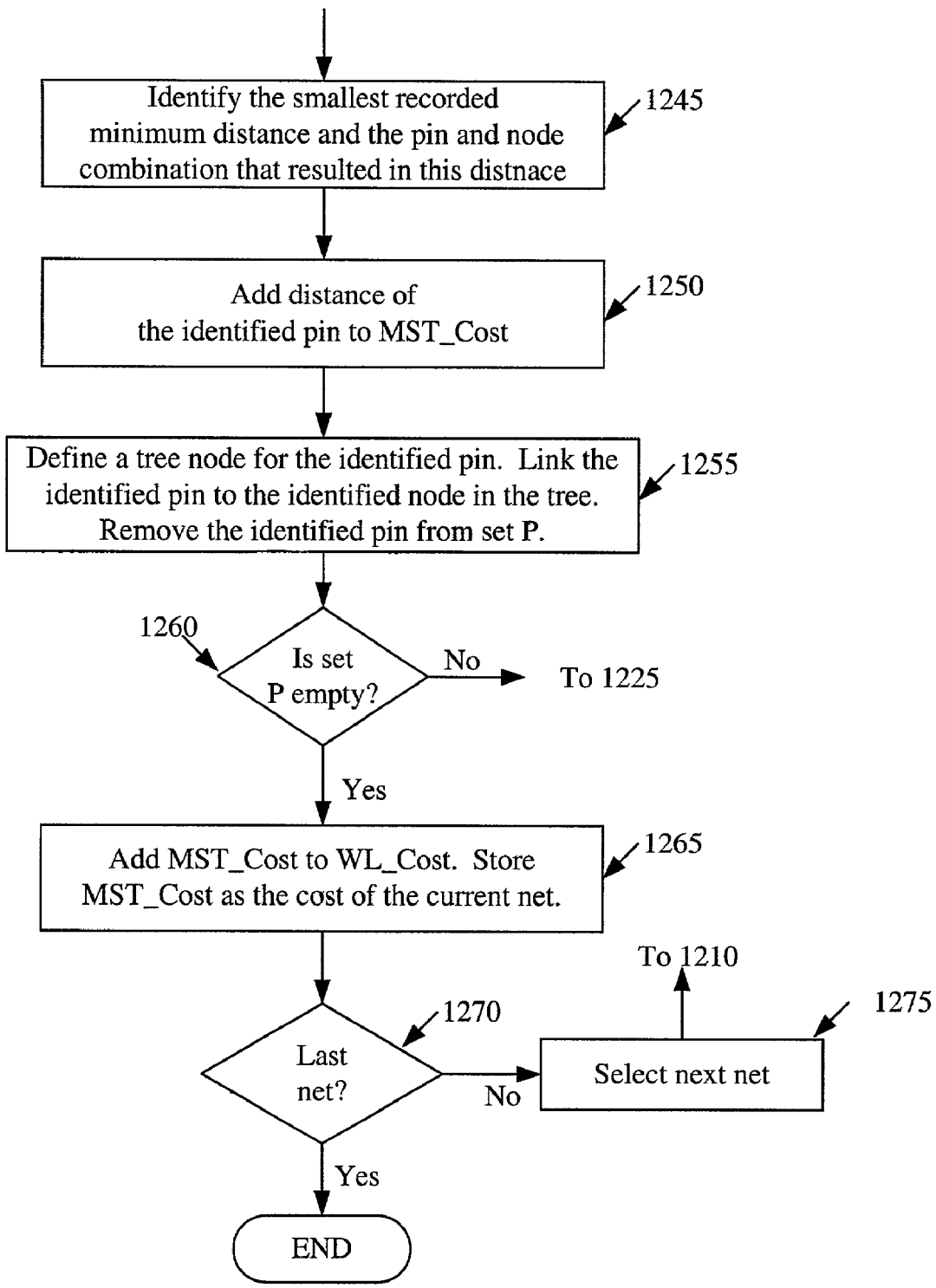

FIG. 12 illustrates a cost-calculating process 1200 that computes the length of MST's that model the interconnect topologies of several nets. A placer can use this process to generate a wirelength cost estimate for a set of nets on a net list. In some embodiments, the process 1200 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1200 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1200 to optimize the placement configuration for a wiring architecture that uses diagonal wiring.

The process 1200 initially (at 1205) sets the wirelength cost estimate (WL_Cost) to zero, and selects a first net from the received net list. Next, the process defines (at 1210) a set P of pins equal to the selected net's set of pins. The process then (at 1215) sets the minimum-spanning-tree cost (MST_Cost) of the selected net to zero.

Next, the process (at 1220) (1) selects a pin from the retrieved set of pins as the first node of the spanning tree, and (2) removes this pin from this set. The process then defines (at 1225) a remainder set R of pins equal to the current set P of pins. At 1230, the process selects a pin from the remaining pin set R, and removes the selected pin from this pin set.

The process then computes and stores (at 1235) the distance between the pin selected at 1230 and each current node of the spanning tree. The distance between the selected pin and each node can be traversed by an edge that is completely or partially diagonal. Hence, the process uses (at 1235) Equation (A) to compute the minimum distance between the selected pin and each node.

The process next determines (at 1240) whether there is any pin remaining in set R. If so, the process returns to 1230 to select another pin from this set, so that it can compute at 1235 the distance between this pin and the current nodes of the spanning tree. Otherwise, the process (at 1245) identifies the smallest distance recorded at 1235, and identifies the pin and node combination that resulted in this distance. The process then adds (at 1250) the identified smallest distance to the minimum-spanning-tree cost (MST_Cost). The process also (at 1255) (1) defines a tree node corresponding to the pin identified at 1245, (2) removes the identified pin from the pin set P, and (3) links the defined tree node to the node identified at 1245.

The process then determines (at 1260) whether the pin set P is empty. If not, the process transitions back to 1225 to identify the next pin that is closest to the current nodes of the tree. Otherwise, the process (at 1265) (1) adds the minimum-spanning-tree cost (MST_Cost) of the current net to the wirelength cost (WL_Cost), and (2) stores the current net's minimum-spanning-tree cost (MST_Cost). The process then determines (at 1270) whether it has constructed the minimum spanning tree of all the received nets. If not, the process selects (at 1275) another net, and transitions back to 1210 to construct the minimum spanning tree for this net.

Otherwise, if the process determines that it has constructed the MST of all the nets, the process returns the value of the wirelength cost variable (WL_Cost) as the estimated wirelength cost of the current placement configuration. The process then ends.

In some embodiments of the invention, the process 1200 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1200 to calculate the placement-configuration cost for each possible iterative modification to the placement configuration. This is further described below in Section VII, which presents several suitable optimization techniques.

B. Steiner Tree with Diagonal Edges.

Some embodiments generate wirelength cost estimate for placement configurations by (1) constructing, for each net, a Steiner tree that can have diagonal edges, (2) computing the length of each Steiner tree, and (3) summing the computed lengths. Steiner trees are similar to minimum spanning trees except that Steiner trees do not restrict branching to only the locations of the elements of the nets. In some embodiments, Steiner trees can have edges that branch off (i.e., start or terminate) from points in the middle of other edges.

In some embodiments of the invention, the edges of the Steiner tree can be horizontal, vertical, or diagonal. The diagonal edges can be completely or partially diagonal. Also, when the IC layouts use diagonal interconnect lines (e.g., ±120° interconnect lines), the diagonal edges can be in the same direction (e.g., can be in ±120° directions) as some of the diagonal interconnect lines in the layout.

To construct a Steiner tree for an N-element net, additional points, called Steiner points, can be added to the net. Heuristic techniques are often used to select the Steiner points. FIG. 13 illustrates one heuristic technique that is used in some embodiments of the invention, for IC layouts that use the octagonal wiring model (i.e., that use horizontal, vertical, and 45° interconnect lines). This figure presents a Steiner tree 1305 for the net that contains pins 135, 145, and 160 of FIG. 1. In this example, the Steiner tree 1305 includes three original nodes 1335, 1345, and 1360 corresponding to the pins 135, 145, and 160.

Also, in this example, a set of potential Steiner points are identified by passing four lines through each original node of the Steiner tree. Of these four lines, one 1310 is horizontal, one 1315 is vertical, one 1320 is a +45° diagonal line, and one 1325 is a −45° diagonal line. As shown in FIG. 13, the intersection of the lines that pass through each original node defines a set of potential Steiner points 1330. A few of these potential points can then be added as nodes in the Steiner tree, in order to minimize the length of the tree. In FIG. 13, the Steiner point 1340 has been added as nodes in the tree.

Figure 14A:
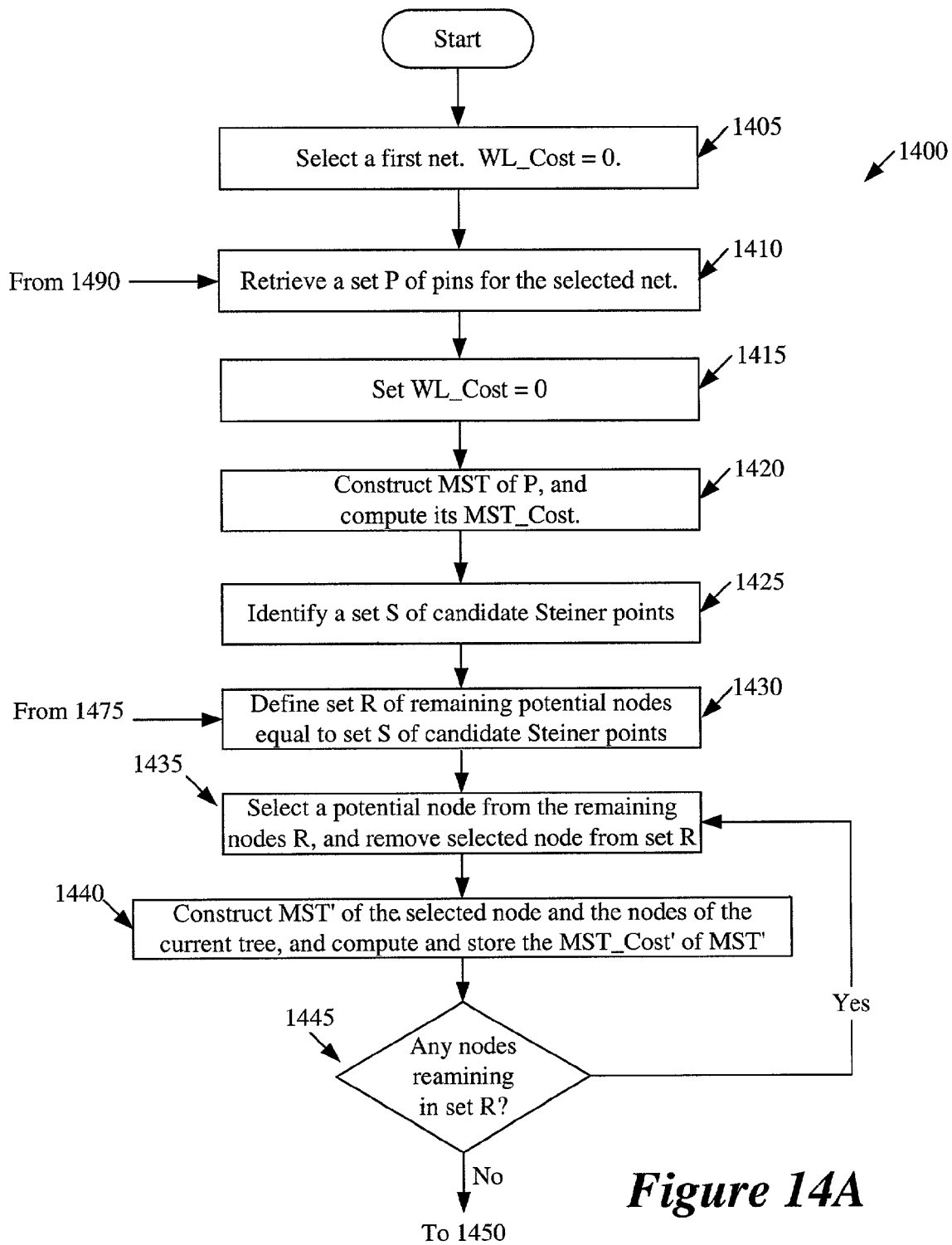
FIG. 14 illustrates a process for generating a wirelength estimate by constructing Steiner trees with 45° diagonal edges.
Figure 14B:
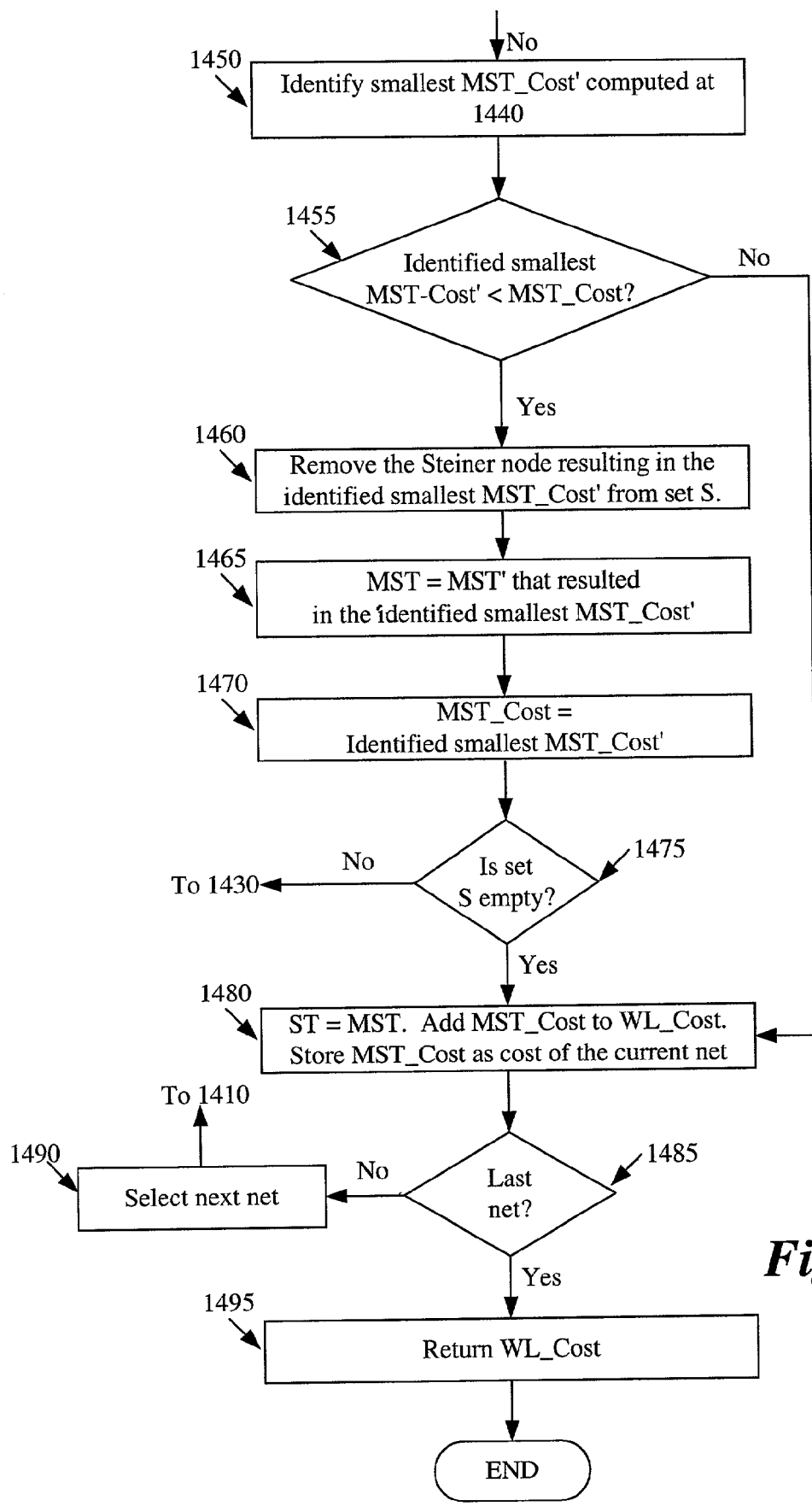

FIG. 14 illustrates a cost-calculating process 1400 that computes the length of Steiner trees that model the interconnect topologies of several nets. A placer can use this process to generate a wirelength cost estimate for a set of nets on a net list. In some embodiments, the process 1400 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1400 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1400 to optimize the placement configuration for a wiring architecture that uses diagonal wiring.

The process 1400 is a modification of the One-Steiner process. Like the traditional One-Steiner process, this process 1400 constructs a heuristic Steiner tree by adding Steiner nodes that minimize the MST of the original and added pin nodes. However, unlike the traditional One-Steiner process, this modified process allows the edges of the heuristic Steiner tree to be partially or completely diagonal.

This process initially (at 1405) sets the wirelength cost estimate (WL_Cost) to zero, and selects a first net from the received net list. Next, the process defines (at 1410) a set P of pins equal to the selected net's set of pins. The process then (at 1415) sets the wirelength cost (WL_Cost) of the selected net to zero. After 1415, the process constructs (at 1420) the minimum spanning tree of the selected net, and computes the cost (MST_Cost) of this tree. This minimum spanning tree can have edges that are completely or partially diagonal. The process can construct the MST by performing the operations 1210 to 1260 of FIG. 12.

After constructing the MST for the selected net, the process identifies (at 1425) a set S of candidate Steiner points. As described above by reference to FIG. 13, the process can identify these points by passing a pair of diagonal lines and a pair of Manhattan lines through each pin in the net and identifying the intersection of these lines. When the IC layouts use diagonal interconnect lines (e.g., ±120° interconnect lines), the diagonal lines passed through each pin can be in the same direction (e.g., can be in ±120° directions) as some of the diagonal interconnect lines in the layout.

Next, the process defines (at 1430) a remainder set R of nodes equal to the current set S of potential Steiner points. At 1435, the process selects a node from the remaining node set R, and removes the selected node from this set. The process then (at 1440) (1) constructs a minimum spanning tree (MST') for the node selected at 1435 and the nodes of the current MST for the selected net, and (2) computes and stores the cost (MST_Cost') of this minimum spanning tree (MST'). The process constructs this minimum spanning tree (MST') by using edges that are completely or partially diagonal. Also, the process can construct this tree MST' by performing the operations 1210 to 1260 of FIG. 12.

Next, the process determines (at 1445) whether there is any node remaining in set R. If so, the process returns to 1435 to select another node from this set, so that it can construct a minimal spanning tree for this other node and the nodes of the current MST.

Otherwise, the process (at 1450) identifies the smallest minimum-spanning-tree cost (MST_Cost') computed at 1440. The process then determines (at 1455) whether the identified smallest minimum-spanning-tree cost (MST_Cost') is less than the cost (MST_Cost) of the current minimum spanning tree (MST) created at 1420. If not, the process transitions to 1480, which will be described below. Otherwise, from the set S of potential Steiner nodes, the process removes (at 1460) the Steiner node that resulted in the smallest minimum-spanning-tree cost (MST_Cost') identified at 1450. The process then identifies (at 1465) the minimum spanning tree (MST') that resulted in the identified smallest minimum-spanning-tree cost (MST_Cost') as the current minimum spanning tree (MST). The process also sets (at 1470) the minimum-spanning-tree cost (MST_Cost) equal to the identified smallest minimum-spanning-tree cost (MST_Cost').

The process next determines (at 1475) whether the set S of candidate Steiner points is empty. If not, the process returns to 1430 to see if it can find another potential Steiner point that would further reduce the length of the current minimum spanning tree (MST).

If the process 1400 determines (at 1475) that all the candidate Steiner points have been examined and set S is empty, it (at 1480) (1) defines the Steiner tree as the current MST, (2) adds this MST's cost (MST Cost) to the estimated wirelength cost (WL_Cost), and (2) stores this MST's cost (MST Cost) as the cost of the current net. After 1480, the process determines (at 1485) whether it has constructed Steiner trees for all the nets in the received net list. If not, the process selects (at 1490) another net and returns to 1410 to construct a Steiner tree for this net. Otherwise, the process returns (at 1495) the wirelength cost (WL_Cost) of the current placement configuration, and then ends.

In some embodiments of the invention, the process 1400 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1400 to calculate the placement-configuration cost for each possible iterative modification to the placement configuration. This is further described below in Section VII, which presents several suitable optimization techniques.

IV. Min-Cut Bipartitoning with Diagonal Lines

Some embodiments of the invention are min-cut bipartitioning techniques that utilize diagonal cut lines. As further described below by reference to FIGS. 15–17, some embodiments only utilize diagonal cut lines, while other embodiments use diagonal, horizontal, and vertical cut lines.

The cut lines are used to partition the IC layout recursively into successive pairs of regions. After defining the cut line at each level of the recursion, the invention's min-cut bipartitioning method calculates the number of nets that are intersected by the cut line of the particular level. This number is indicative of the wire congestion about this cut line. Next, at each recursion level, an optimization technique is used to move the circuit modules between the regions at that level, in order to reduce the number of nets intersected by the cut line of that level. The minimization of the net-cut cost at each level of the recursion reduces wire congestion across the cut line at that level.

The invention's min-cut bipartitioning technique can be used with IC layouts that only use the Manhattan wiring model (i.e., IC layouts that only have preferred horizontal and vertical direction wiring). In other instances, the invention's min-cut bipartitioning technique is used with IC layouts that have diagonal interconnect lines. In some of these instances, the diagonal cut lines are in the same direction as some or all of the diagonal interconnect lines. For instance, for IC layouts that use the octagonal wiring model (i.e., that use horizontal, vertical, and 45° diagonal lines), some embodiments use 45° diagonal cut lines.

Figure 15:
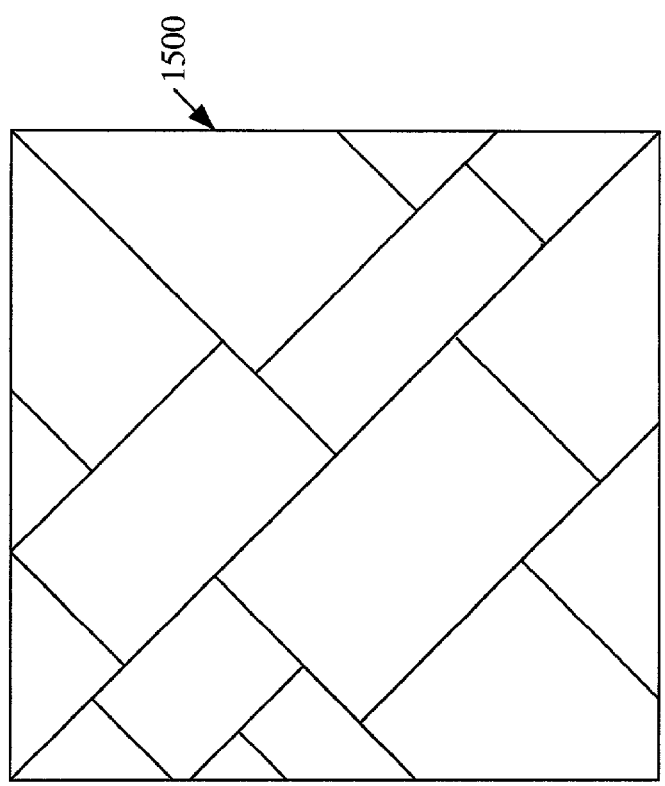
FIG. 15 illustrates an IC layout that has been recursively partitioned into a number of regions by only diagonal cut lines.

FIG. 15 illustrates an IC layout 1500 that has been recursively partitioned into a number of regions by only diagonal cut lines. Such a strict diagonal-partitioning approach is typically used when the IC layout uses only diagonal interconnect lines. However, such an approach can be taken when the IC layout uses diagonal and Manhattan interconnect lines.

Figure 16:
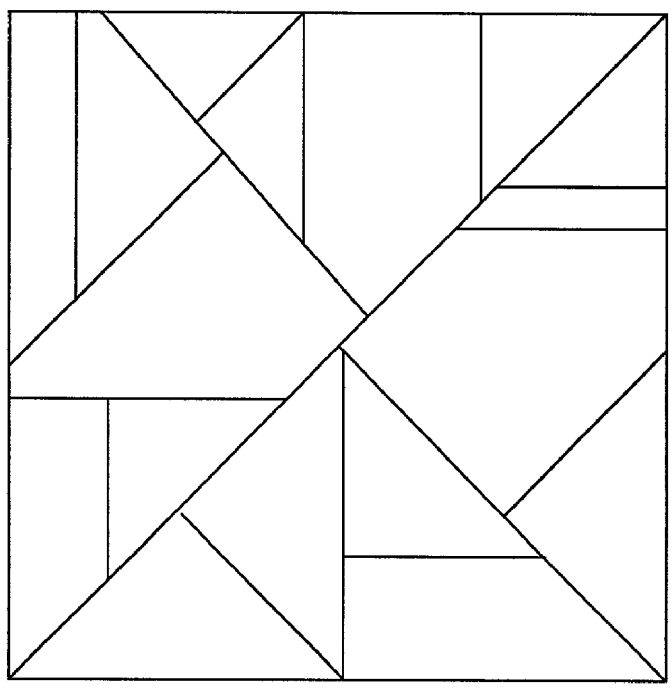
FIGS. 16 and 17 illustrate two IC layouts that are recursively partitioned by combinations of diagonal, horizontal, and vertical cut lines.
Figure 17:
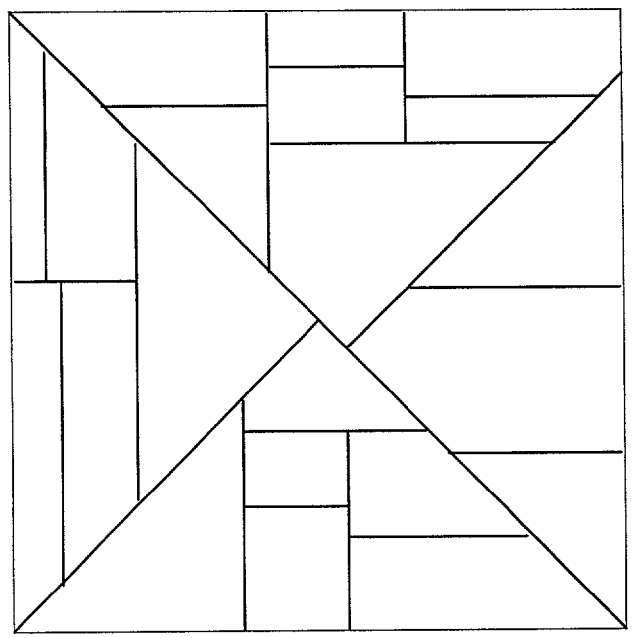

FIGS. 16 and 17 illustrate two IC layouts that are recursively partitioned by combinations of diagonal, horizontal, and vertical cut lines. In FIG. 16, diagonal cut lines are used at all levels of the recursion. On the other hand, in FIG. 17, the diagonal cut lines are only used at the higher recursion levels, and Manhattan cut lines are used at the lower levels of the recursion.

In other words, the partitioning scheme illustrated in FIG. 17 stops using diagonal cut lines once it reaches some of the lower levels of the recursion process. Such a partitioning scheme (i.e., a scheme that stops using diagonal cut lines at the lower recursion levels) is useful in connection with IC layouts that have their diagonal layers as their top metal layers. Such a partitioning scheme is useful for such layouts because the first set of cut lines reduce the congestion of longer wires, and the longer wires are likely to be diagonal wires. In octagonal wiring models that have the diagonal layers as the top metal layers, the diagonal wires tend to be long, because otherwise it would be wasteful to incur the delay costs associated with the vias necessary for performing the routing on the higher layers.

Figure 18:
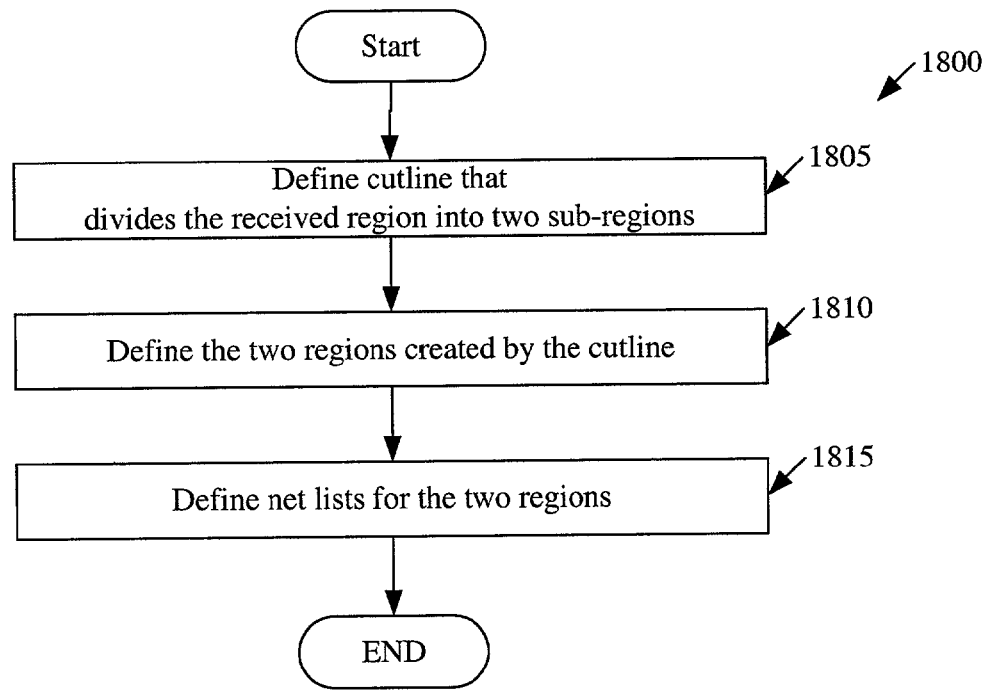
FIG. 18 is a process that defines a cut line that partitions a layout region into two smaller regions.
Figure 19A:
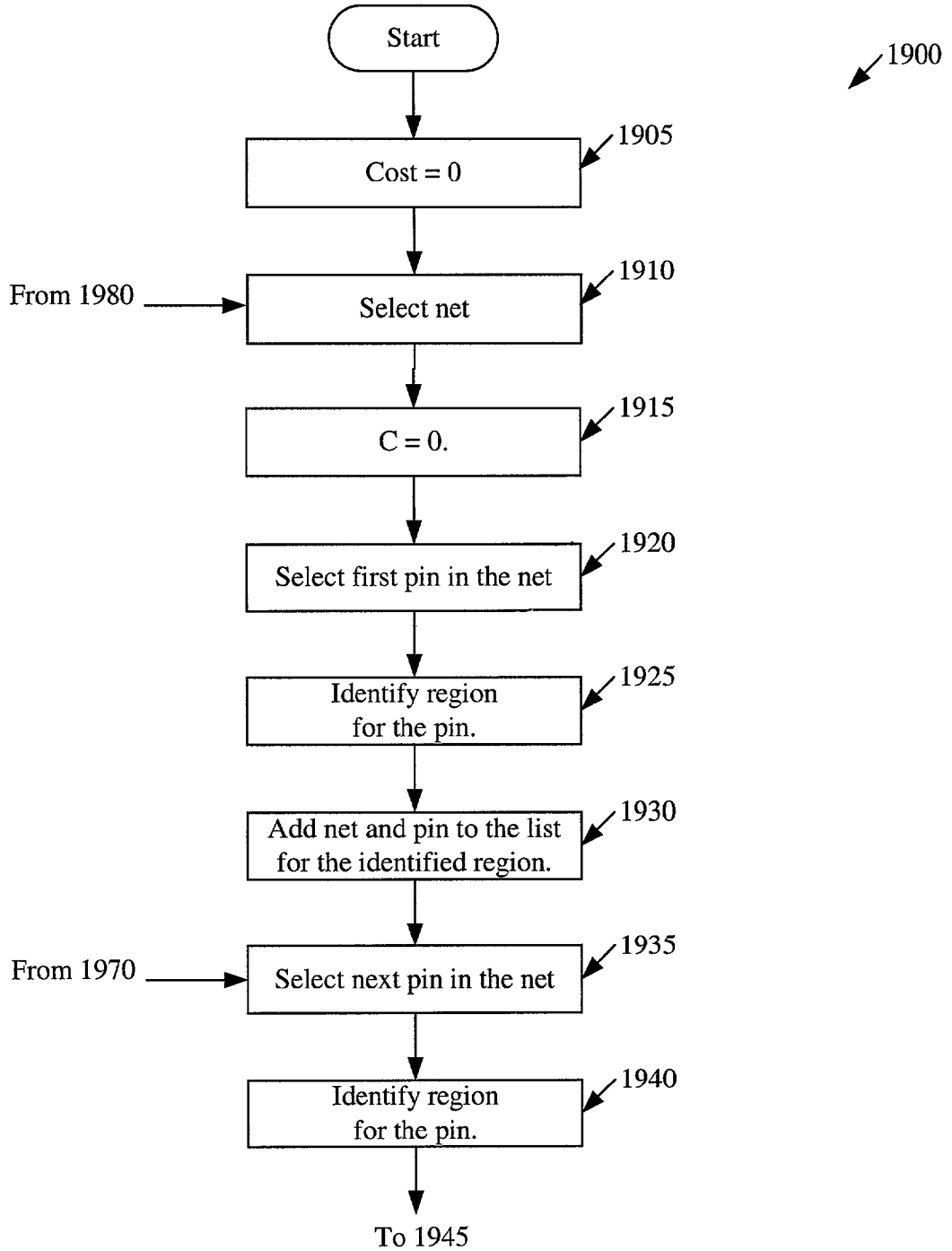
FIG. 19 illustrates a process that generates a congestion cost estimate, and partitions a set of nets, about a cut line.
Figure 19B:
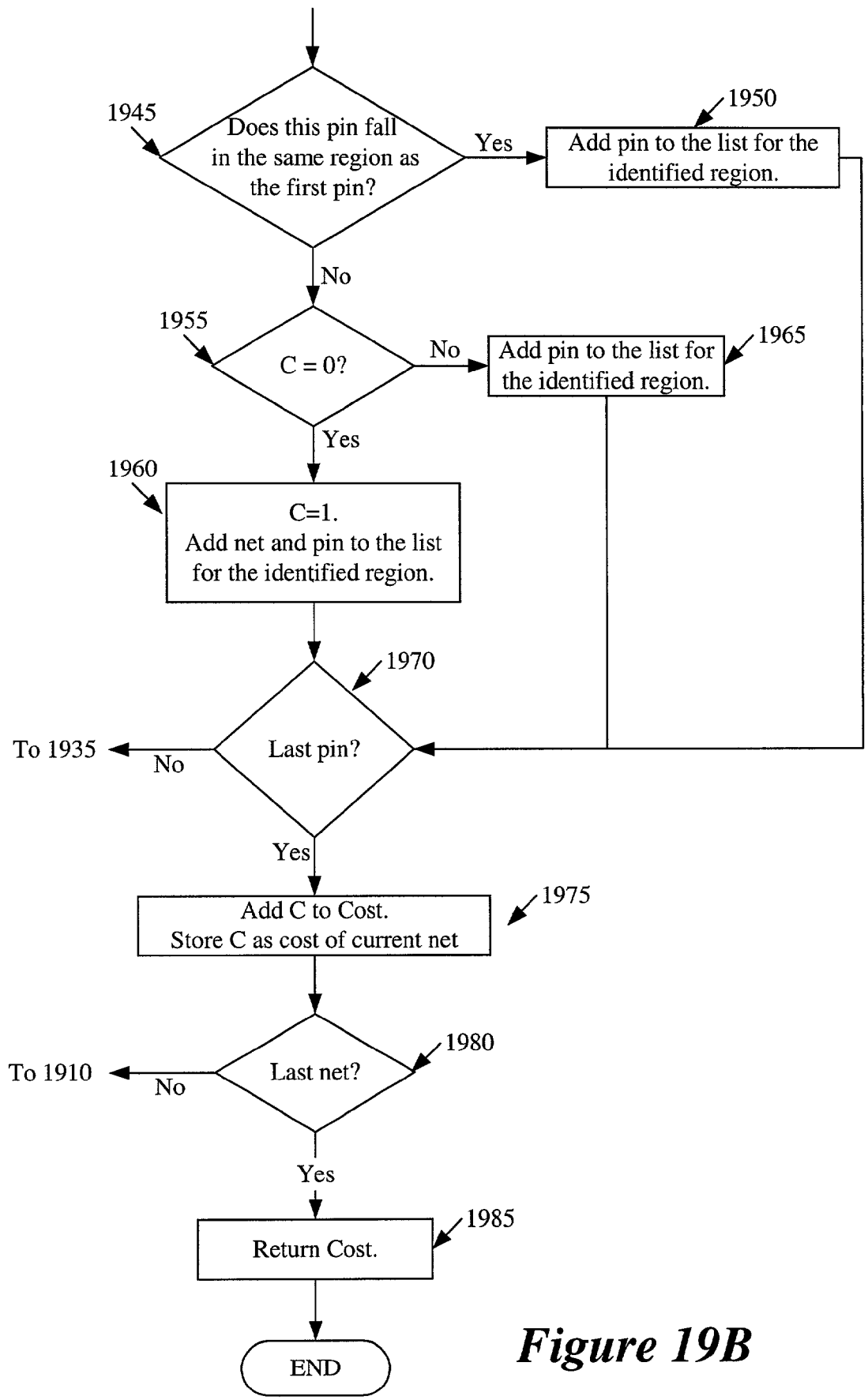

FIGS. 18 and 19 illustrate two processes 1800 and 1900 that a placer can use to perform min-cut bipartitioning with diagonal cut lines. The placer can repeatedly use these processes 1800 and 1900 to minimize congestion across the IC layout. Specifically, the placer can repeatedly perform the process 1800 of FIG. 18 to define a series of cut lines that recursively partition the IC layout into smaller and smaller regions. After defining the cut line at a particular level of the recursion, the placer can then use the process 1900 of FIG. 19 to obtain congestion cost estimates, and to partition nets, across the cut line of that level.

The process 1800 starts whenever it receives the coordinates of a region of the IC layout. As shown in FIG. 18, this process initially defines (at 1805) a horizontal, vertical, or diagonal cut line that divides the received region into two sub-regions. After defining the cut line, the process 1800 defines (at 1810) two regions created by the cut line. Some embodiments use the following convention to define the regions: (1) when the cut line is horizontal or diagonal, the first region is above the cut line, while the second region is below the cut line, and (2) when the cut line is vertical, the first region is to the right of the cut line, and the second region is to the left of the cut line.

Finally, the process 1800 initializes two net lists for the two regions created by the cut line defined at 1805. As further described below, the first time the process 1900 is performed for all the nets in the received region, the process 1900 adds the nets in this received region and the pins of these net to these two net lists. Also, as further described below, the placer and the process 1900 might remove and add nets and pins to these two net lists during the optimization process.

FIG. 19 illustrates a process 1900 that a placer can use to partition a set of nets, and to calculate the congestion cost of these nets, about a cut line that can be diagonal. The process 1900 starts whenever it receives (1) a list of nets, and (2) a cut line for partitioning the nets.

Each net on the received net list has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, an initial placement configuration is defined by the positions of the net circuit elements before the process 1900 is performed for the first cut line. In some of these embodiments, the initial placement configuration is random. In other embodiments, a previous physical-design operation, such as the floor planning, partially or completely specifies the initial placement configuration. Other embodiments use another placer to specify the initial placement configuration, and then use processes 1800 and 1900 to optimize the placement configuration for a wiring architecture that uses diagonal wiring.

As shown in FIG. 19, the process 1900 initially sets (at 1905) the congestion cost (Cost) equal to 0. The process then selects (at 1910) a net from the received net list. It then sets (at 1915) a net-cut variable (C) to 0. The process next selects (at 1920) a first pin of the selected net. After selecting the pin, the process determines (at 1925) which of the two regions defined by the cut line contains the pin. The process 1900 identifies the region for the pin by using one of three processes, which are illustrated in FIGS. 20, 21, and 22.

Figure 20:
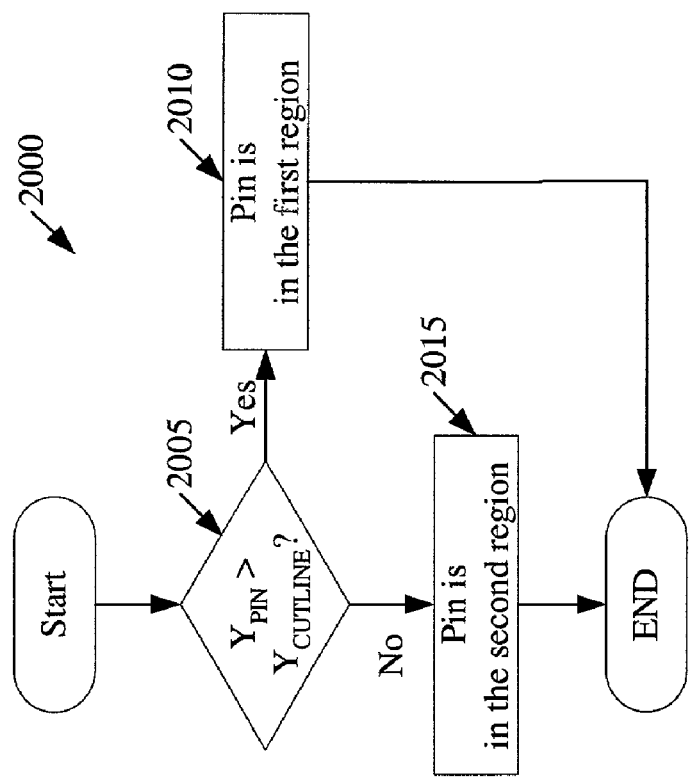

The process 1900 calls the process 2000 of FIG. 20 when the cut line is horizontal. As shown in FIG. 20, the process 2000 determines (at 2005) whether the y-coordinate of the pin is greater than the y-coordinate of the horizontal cut line. If so, the process specifies (at 2010) that the pin is in the first region defined by the cut line. Otherwise, the process specifies (at 2015) that the pin is in the second region defined the cut line.

Figure 21:
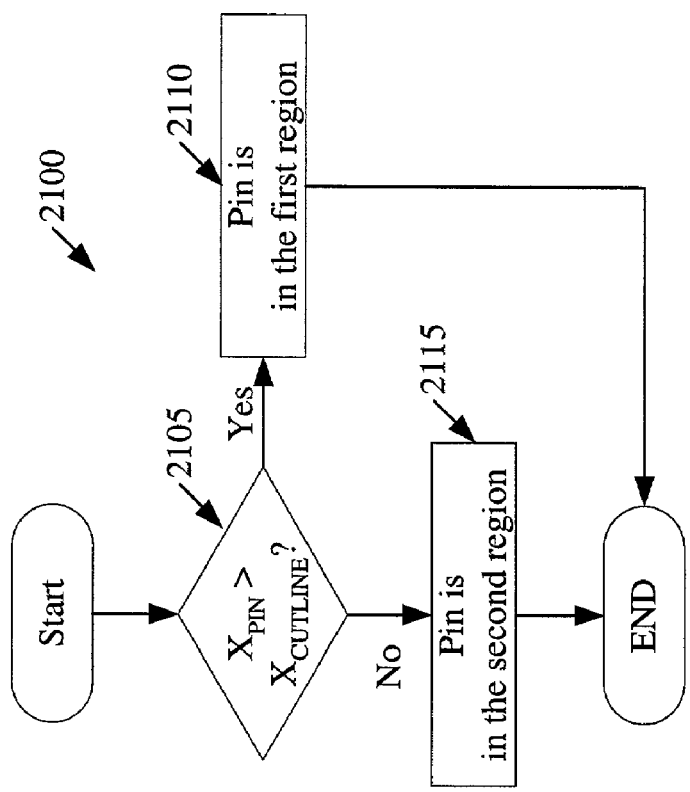
FIGS. 20, 21, and 22 illustrate three processes for identifying a region for a pin.

The process 1900 uses the process 2100 of FIG. 21 when the cut line is vertical. As shown in FIG. 21, the process 2100 determines (at 2105) whether the x-coordinate of the pin is greater than the x-coordinate of the vertical cut line. If so, the process specifies (at 2110) that the pin is in the first region defined by the cut line. Otherwise, the process specifies (at 2115) that the pin is in the second region defined the cut line.

Figure 22:
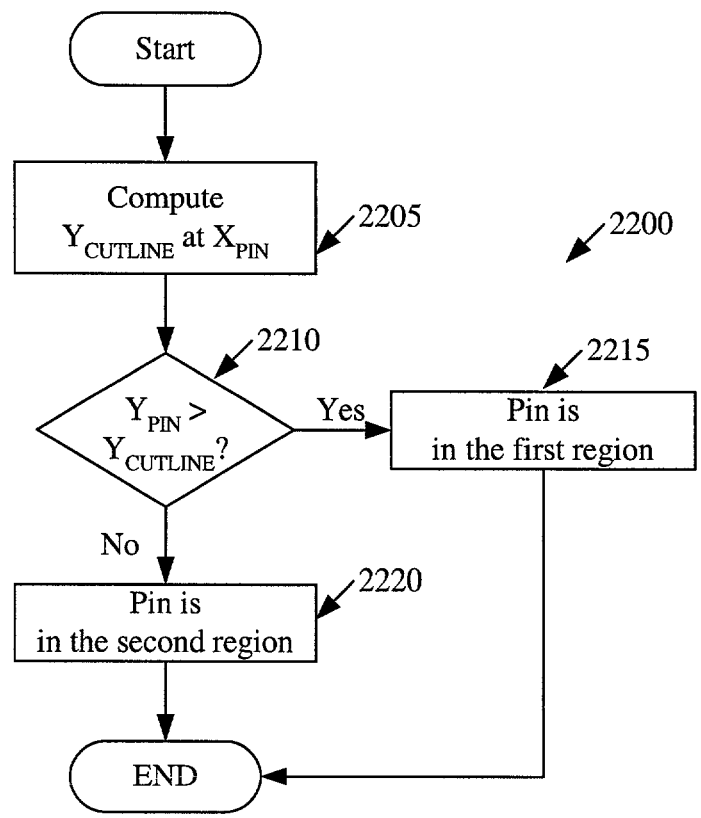

The process 1900 calls the process 2200 of FIG. 22 when the cut line is diagonal. As shown in FIG. 22, the process 2200 inserts (at 2205) the x-coordinate of the pin in the linear equation (y=mx+b) that represents the cut line. This equation expresses the y-coordinate value of the cut line in terms of its slope (m), x-coordinate, and y-intersect (b). The process then determines (2210) whether the derived y-value of the diagonal line at the inserted x-location is greater than the y-coordinate of the pin. If not, the process specifies (at 2215) that the pin is in the first region defined by the cut line. Otherwise, the process specifies (at 2220) that the pin is in the second region defined the cut line.

After identifying the region for the pin, the process adds (at 1930) the selected net and pin to the net list for the identified region. The process then selects (at 1935) the next pin in the net. At 1940, the process identifies the region for the pin selected at 1935 by calling the same processes described above for 1925.

The process then determines (at 1945) whether the current pin (i.e., the pin selected at 1935) falls in the same region as the first pin. If so, the process adds the current pin to the net previously added (at 1930) to the net list for the identified region. The process then transitions to 1970, which will be described below.

On the other hand, if the process determines (at 1945) that the current pin does not fall in the same region as the first pin, the process determines whether the intersection variable C equals 0. If so, the process realizes that it has detected a net cut. Hence, it changes the value of the intersection variable C to 1, and adds the net and the current pin to the net list for the identified region of the current pin. However, if the process determines (at 1955) that the intersection variable is not 0, the process realizes that it has previously detected the net cut. Therefore, the process simply adds (at 1960) the current pin to the net list for the identified region.

From 1960 and 1965, the process transitions to 1970, where it determines whether it has examined the last pin in the current net. If not, the process transitions back to 1935 to examine the next pin in the net. Otherwise, the process (at 1975) (1) adds the intersection cost C to the congestion cost (Cost), and (2) stores the intersection cost C as the cost of the current net.

Next, the process determines (at 1980) whether it has examined the last net. If not, the process returns to 1910 to (1) select another net, (2) partition this net about the cut line, and (3) determine whether this net crosses the cut line. Otherwise, the process returns (at 1985) (1) the congestion cost of the current placement configuration, and (2) the two net lists that represent the partitioning of the received net list about the received cut line.

As mentioned above, a placer can repeatedly perform the process 1800 of FIG. 18 to define a series of cut lines that recursively partition the IC layout into smaller and smaller regions. At each level of the recursion, the placer can then use the process 1900 of FIG. 19 to obtain congestion cost estimate, and to partition nets, across the cut line of that level.

Specifically, for each recursion level, the placer initially supplies the process 1900 with (1) the cut line for that level, and (2) a list of all the nets in that level's region. The process 1900 then (1) partitions the nets in that region about the cut line (i.e., as described above, the process adds the nets and their corresponding pins to the appropriate net lists for the sub-regions created by the cut line), and (2) calculates a cost for the congestion across the cut line.

After receiving from the process 1900 the congestion cost of the initial net configuration within a recursion level's region, the placer then uses an optimization algorithm that iteratively modifies the net configuration within this region to improve the congestion cost generated by the process 1900. In some embodiments, the optimization process uses the process 1900 to calculate the placement-configuration cost for each possible iterative modification to the placement configuration. This is further described below in Section VII, which presents several suitable optimization techniques.

V. Partitioning Placement Technique

Some embodiments of the invention use a partitioning technique that (1) partitions a design region into a number of sub-regions (also called slots), (2) for at least one net, identifies the set of sub-regions (i.e., the set of slots) that contain the net's circuit elements, (3) identifies a route that connects the identified set of sub-regions for the net, where the route has at least one partial or complete diagonal edge, and (4) for the net, computes a placement cost based on the identified route.

Figure 23:
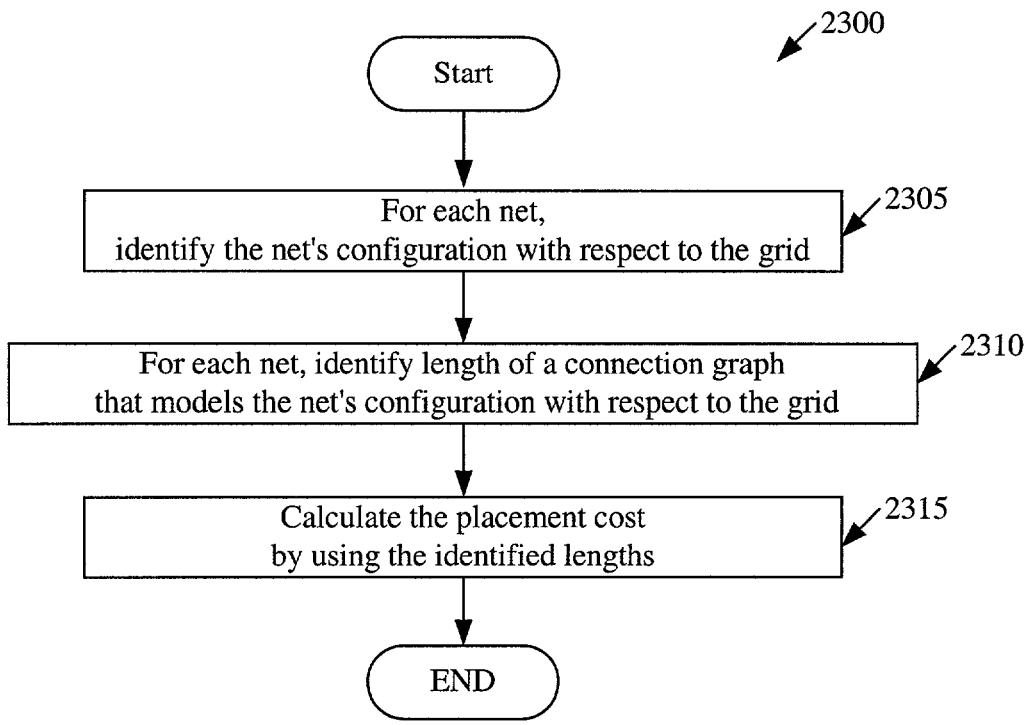
FIG. 23 illustrates a process that generates a length estimate for a partitioning placement approach.

FIG. 23 conceptually illustrates one such placement process 2300. This process starts each time it receives the coordinates for a region of an IC layout. The received region can be the entire IC layout, or a portion of this layout. In some embodiments, this process also receives a net list that specifies all the net's that have circuit elements in the received IC region. In other embodiments, the process receives a list of all the circuit elements in the received IC region, and from this list identifies the nets that have circuit elements in the received IC region.

Each received or identified net has a set of circuit elements associated with it (i.e., each net is defined to include a set of circuit elements). In some embodiments, the circuit elements associated with the nets are the pins of the circuit modules in the IC layout. However, in the embodiments described below, the circuit elements are the circuit modules. Some of these embodiments treat the circuit modules as the net circuit elements and obviate the need to distinguish between the different pin locations, by assuming that the pins of each module are all located at uniform locations (e.g., located at the origin of the modules).

Also, in some embodiment, the locations of the circuit elements in the received IC region define a placement configuration within this region. In some embodiments, the initial circuit-element positions before the process 2300 starts are random. Alternatively, some embodiments use a previous physical-design operation, such as the floor planning, to partially or completely specify the initial positions of these elements. Still other embodiments use another placer to specify the initial positions of the circuit elements in the received IC region, and then use process 2300 to optimize the placement configuration for a wiring architecture that uses diagonal wiring.

Before the start of the process 2300, a set of partitioning lines is defined. This set divides the received IC region into several sub-regions (also called slots). In the embodiments described below, the partitioning lines are intersecting lines that define a partitioning grid. In some of these embodiments, the intersecting partitioning lines are N horizontal and M vertical lines that divide the received IC region into (N+1)(M+1) sub-regions, where N and M can equal any integer. For instance, these horizontal and vertical lines divide the received IC region into (1) four sections when N and M equal 1, (2) nine sections when N and M equal 2, (3) sixteen sections when N and M equal 3, or (4) twenty sections when either N or M equals 4 and the other equals 5.

Figure 24:
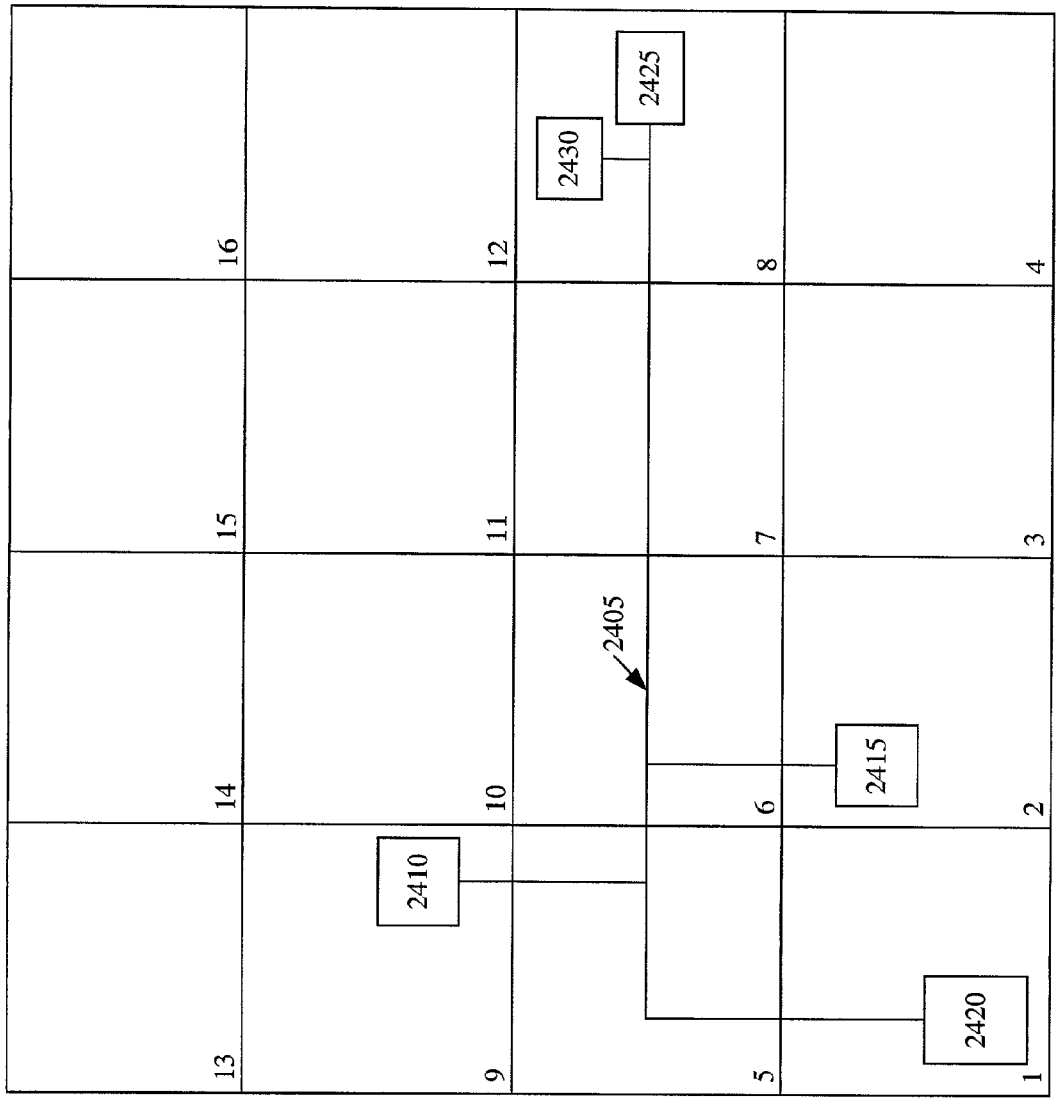
FIG. 24 illustrates an IC layout that has been divided into sixteen sub-regions by sets of three horizontal and vertical partitioning lines.

FIG. 24 illustrates an IC layout 2400 that has been divided into sixteen sub-regions by sets of three horizontal and vertical partitioning lines. This figure also shows a net 2405 that includes five circuit modules 2410, 2415, 2420, 2425, and 2430, which fall into four of the sixteen sub-regions. These four sub-regions are slots 1, 2, 8, and 9.

Once the partitioning grid has been defined, the process 2300 initially identifies (at 2305), for each received or identified net, the set of sub-regions (i.e., the set of slots) that contain the circuit modules of that net. The identified set of sub-regions for each net represents the net's configuration with respect to the defined grid.

For each received or identified net, the process next identifies (at 2310) the length of a connection graph that includes a set of interconnect lines (also called interconnect edges) that connect the slots that contain the net's circuit modules. Specifically, the connection graph of each net represents a route that traverses the set of sub-regions that contain the net's circuit elements. According to the invention, the connection graph can have edges that are completely or partially diagonal.

Figure 25:
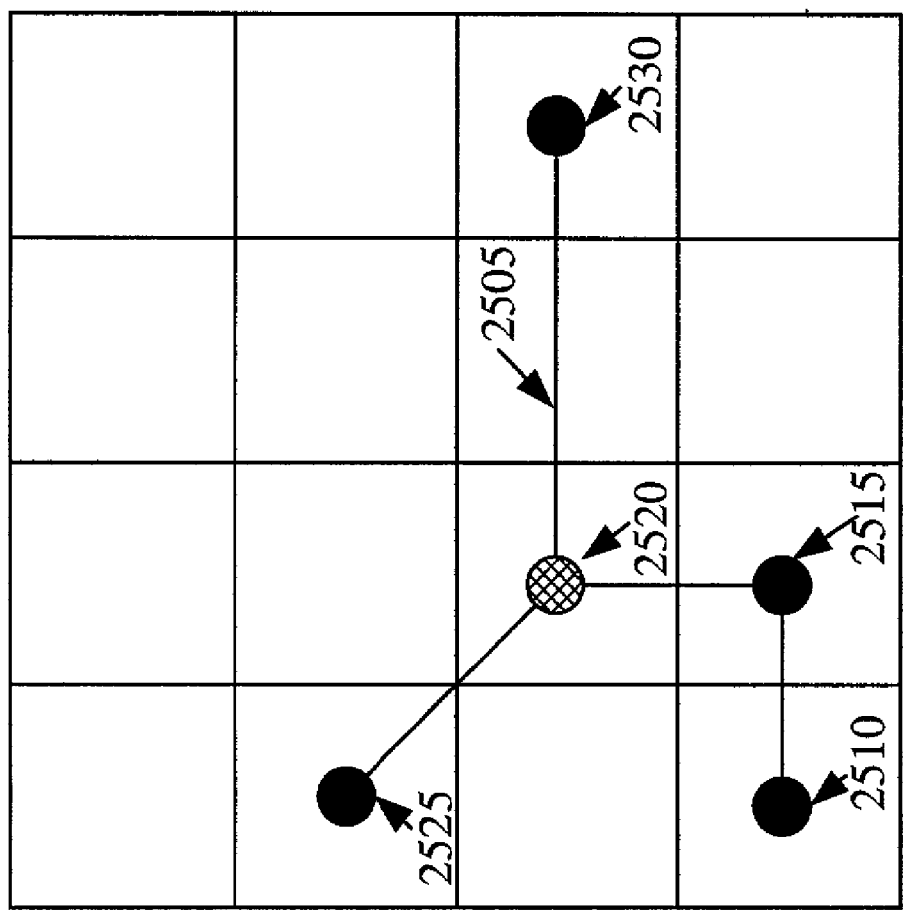
FIGS. 25–27 illustrate three Steiner trees for a net illustrated in FIG. 24.
Figure 27:
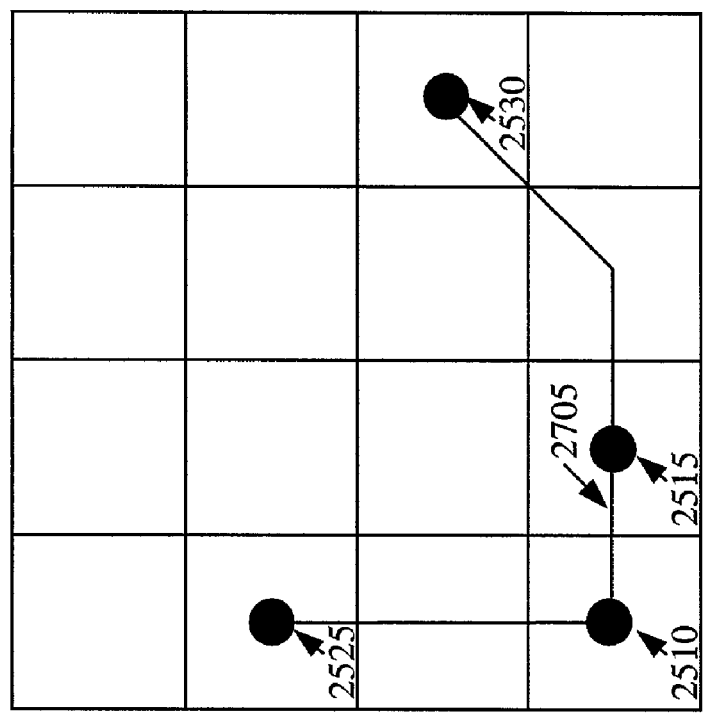
Figure 26:
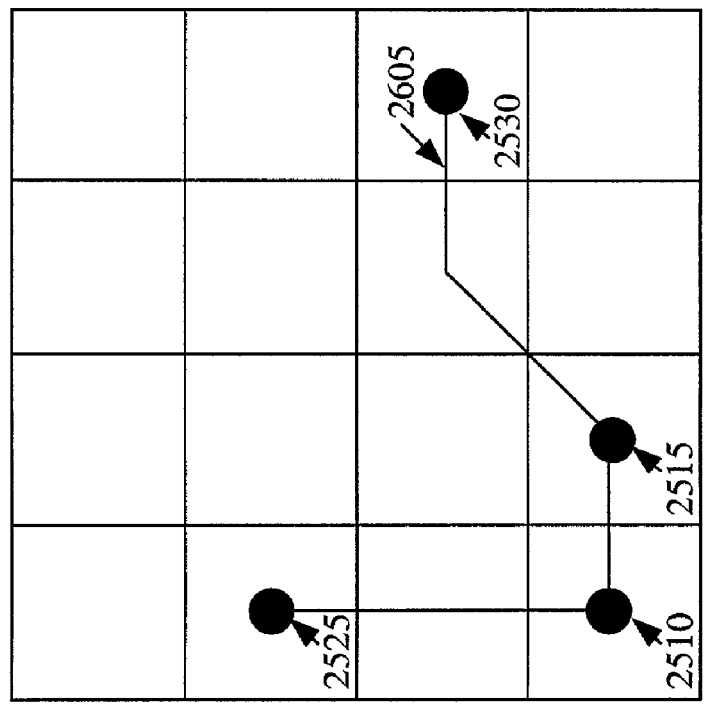

Different embodiments might use different connection graphs. In the embodiments described below, the connection graphs are Steiner trees. FIGS. 25–27 illustrate three Steiner trees 2505, 2605, and 2705 for the net 2405 in FIG. 24. These Steiner trees all have the same length. One of these trees (2505) has a Steiner node (2520). In addition, each of these trees has at least one edge that is partially diagonal. In these examples, the diagonal edges are at 45° degrees with respect to the layout boundary. When the octagonal wiring model is used, the lengths of these Steiner trees approximate the route (interconnect-line) length necessary for net 2405 at the level of the partitioning grid.

In some embodiments, the process identifies (at 2310) the length of each net's connection graph by constructing this connection graph in real-time and quantifying its length during or after the construction of the graph. However, the embodiments described below identify the connection-graph length in a different manner. Before the process 2300 starts, these embodiments (1) construct the connection graphs for each possible net configuration with respect to the partitioning grid, and (2) pre-tabulate the connection-graph lengths in a storage structure. During placement, these pre-tabulating embodiments then retrieve (at 2310) the connection-graph length of each identified net configuration from memory. One manner of constructing and pre-tabulating connection graphs will be described below by reference to FIGS. 28–31.

At 2315, the process 2300 uses the lengths identified at 2310 to calculate the placement cost of the received or identified nets in the layout within the received region. Some embodiments calculate this cost by combining (e.g., summing, multiplying, etc.) each graph's length.

In some embodiments of the invention, the process 2300 generates a placement cost estimate for an initial placement configuration, when it receives a net list that specifies the initial placement configuration (i.e., a net list that identifies all the nets in the IC layout region before any modifications to the positions of the modules in the layout).

After obtaining the cost of the initial placement configuration, some embodiments use an optimization algorithm that iteratively modifies the placement configuration in the received IC region, in order to improve the placement cost. Different embodiments of the invention use different optimization techniques, such as annealing, local optimization, KLFM, tabu search, etc. Also, different optimization techniques modify the placement configuration differently. For instance, at each iteration, some techniques move one circuit module, others swap two modules, and yet others move several related modules, between the sub-regions defined by the partitioning grid. Also, at each iteration, some optimization techniques (e.g., KLFM and tabu search algorithms) search for the best move, while others (e.g., simulated annealing and local optimization) select random moves. In addition, some techniques (e.g., simulated annealing) accept moves that make the metric score worse, whereas others (e.g., local optimization) do not. Several suitable optimization processes are discussed below in Section VII.

After each iterative modification during optimization, the placement configuration is re-calculated by repeating the process 2300 for all the nets or for just the nets on which the moved circuit module or modules reside. After optimizing the placement configuration, some embodiments terminate their placement operations. Other embodiments recursively repeat the process 2300 and the optimization operation on each defined sub-region (i.e., each sub-region defined by the partitioning grid) that meets one or more criteria. For instance, some embodiments recursively perform the partitioning and optimization operations on each sub-region that contains more than a specified number of circuit modules.

Some embodiments use different shaped partitioning grids for different levels in the recursion process. Other embodiments use same shaped partitioning grids for all the recursion levels. At each recursion level, these embodiments simply adjust the coordinates of the partitioning grid to match the coordinates of the IC region at that recursion level. Using the same shaped partitioning grids for all the recursion levels has several advantages. For instance, it allows the pre-tabulating embodiments to store only net configuration lengths for one partitioning grid; these lengths can be re-used at all the recursion levels because they can be used to define the relative costs of the net configurations at any one level.

Figure 28A:
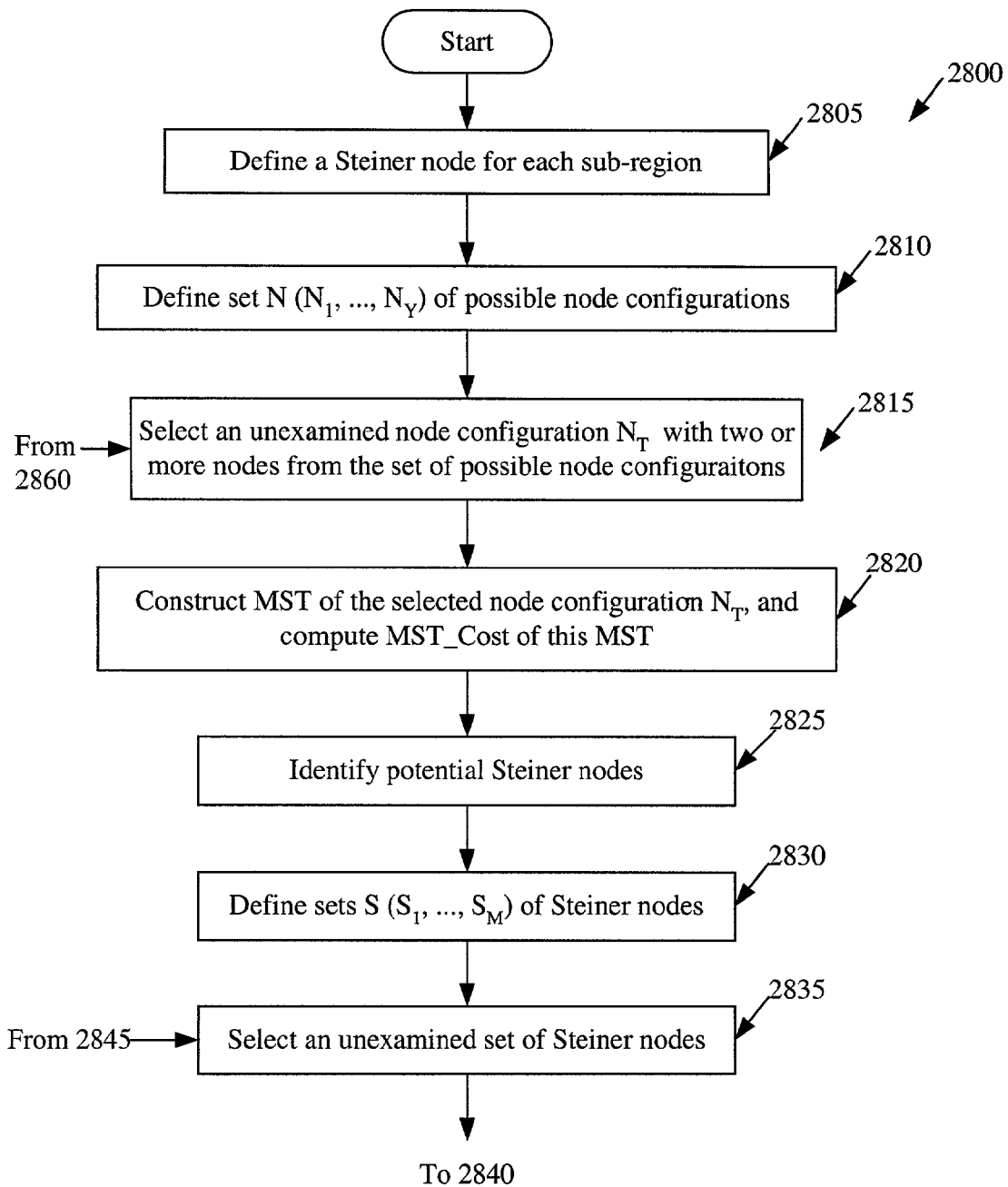
FIG. 28 illustrates a process that constructs Steiner trees for each possible net configuration with respect to a partitioning grid, and stores the length of each constructed Steiner tree in a look-up table ("LUT").
Figure 28B:
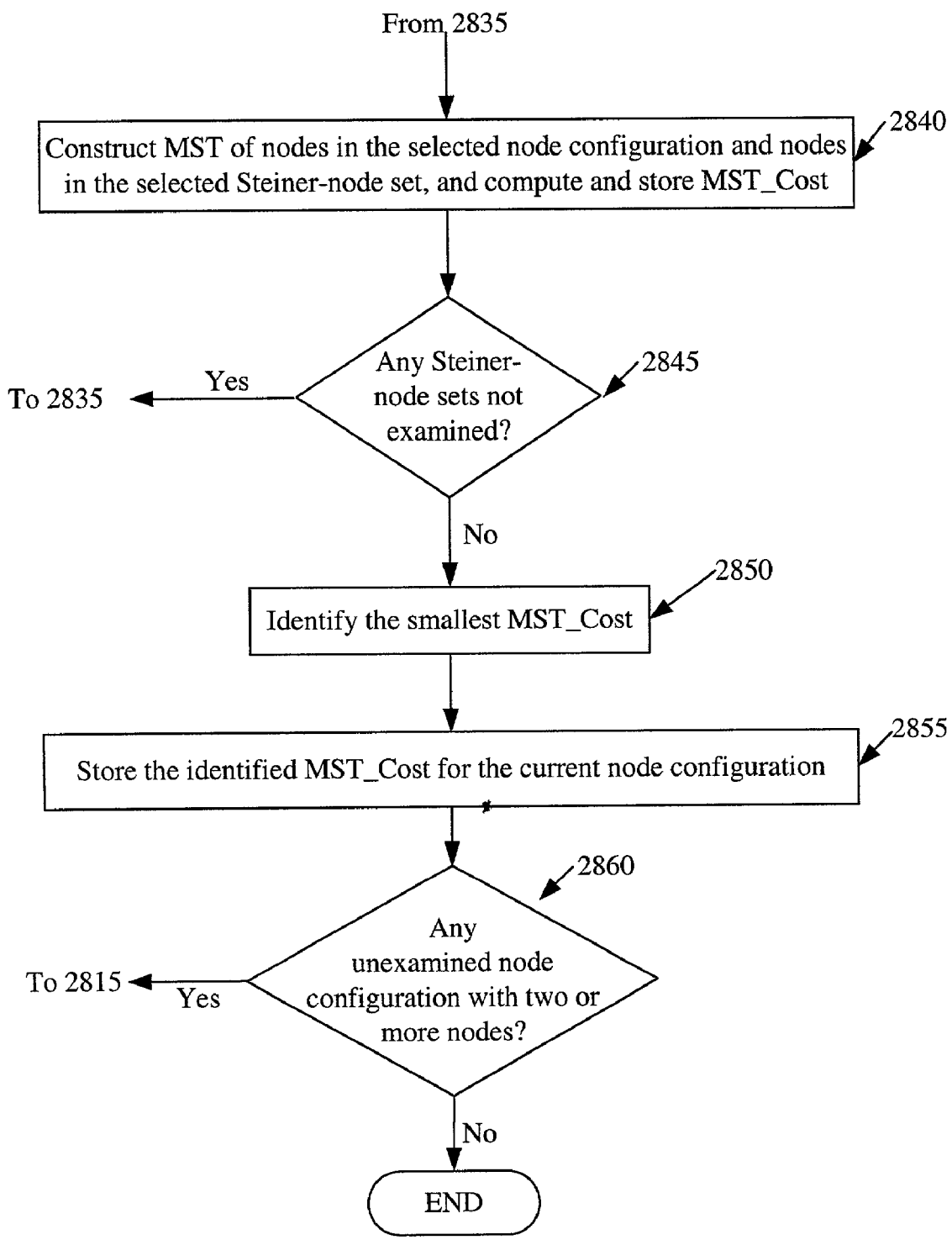

FIGS. 28–31 illustrate one manner of pre-tabulating Steiner-tree lengths that model possible net configurations with respect to a partitioning grid. Specifically, FIG. 28 illustrates a process 2800 that (1) constructs Steiner trees for each possible net configuration with respect to a partitioning grid, and (2) stores the length of each constructed Steiner tree in a look-up table ("LUT").

Figure 29:
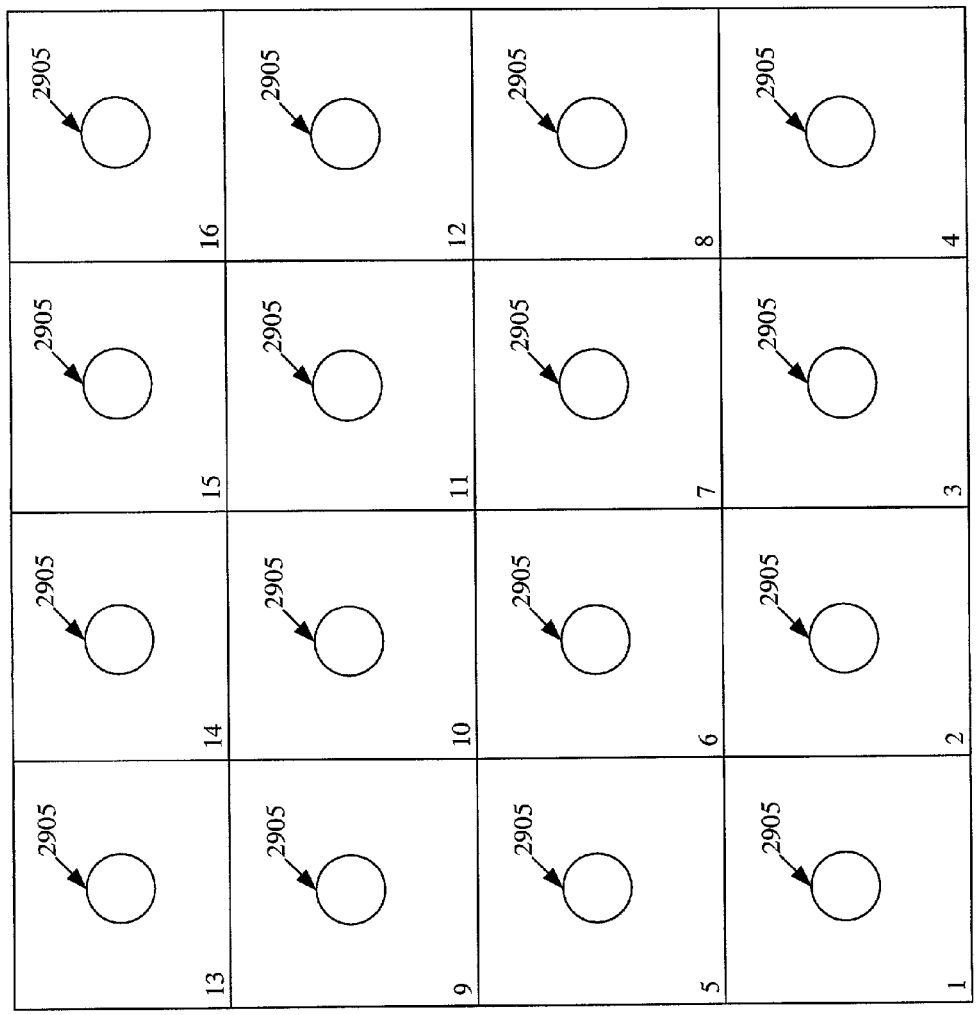
FIG. 29 pictorially illustrates sixteen Steiner-tree nodes for sixteen slots created by a 4-by-4 partitioning grid.

The process 2800 initially starts (at 2805) by defining a Steiner-tree node for each sub-region (also called slot) defined by a particular partitioning grid. FIG. 29 pictorially illustrates sixteen Steiner-tree nodes 2905 for sixteen slots created by a 4-by-4 partitioning grid. These nodes represent all the potential nodes of Steiner trees that model the interconnect topologies of all the net configurations. In FIG. 29, the identified nodes are positioned at the center of each slot. In other embodiments, the nodes can uniformly be defined at other locations in the slots (e.g., can be uniformly positioned at one of the corners of the slots).

Next, the process 2800 defines (at 2810) a set N of possible node configurations. When the grid partitioning defines Y (e.g., four, nine, sixteen, twenty, etc.) sub-regions, set N includes $2^Y$ node configurations. Node configurations with less than two nodes do not have Steiner trees. Accordingly, the process sets the lengths of these configurations to zero.

After 2810, the process 2800 select (at 2815) one of the possible node configurations $N_T$ that has more than two nodes from the set defined at 2810. The process then constructs (at 2820) a minimum spanning tree ("MST") for the node configuration selected at 2815, and computes this tree's length (MST_Cost). The process constructs this minimum spanning tree by using edges that can be completely or partially diagonal.

One manner of constructing such a MST and computing its length will be described below by reference to FIG. 31.

Figure 30:
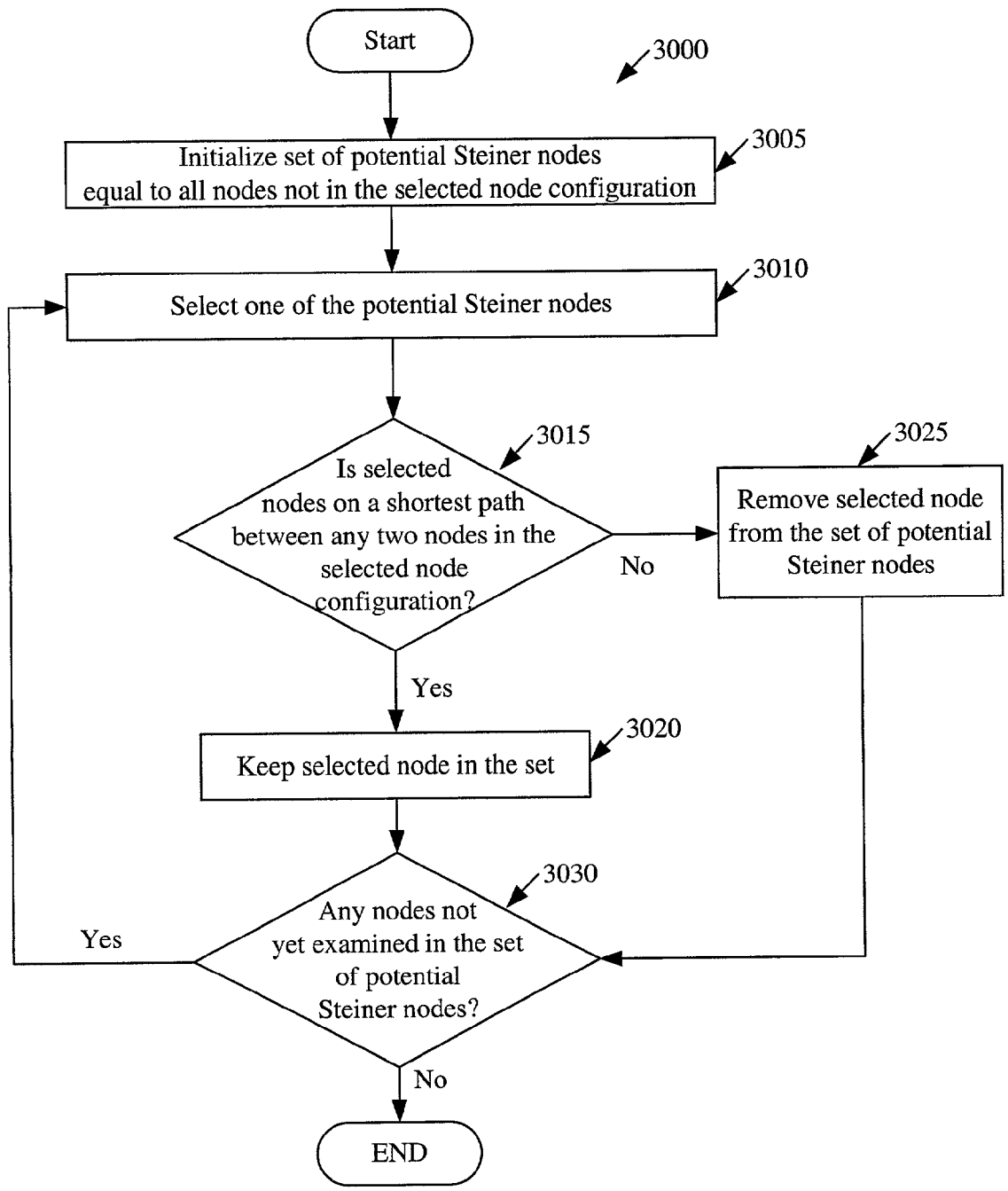
FIG. 30 illustrates a process for identifying potential Steiner nodes.

After constructing the MST for the selected node configuration, the process 2800 identifies (at 2825) potential Steiner nodes. FIG. 30 illustrates a process 3000 for identifying potential Steiner nodes. This process starts (at 3005) by initializing a set P of potential Steiner nodes equal to all the nodes defined at 2805 that are not part of the node configuration selected at 2815. This process then selects (at 3010) one of the potential Steiner nodes.

Next, the process 3000 determines (at 3015) whether the node (Q) selected at 3010 is on a shortest path between any two nodes in the selected node configuration. To make this determination, the process determines whether any two nodes (B and C) exist in the node configuration such that the distance between the two nodes (B and C) equals the sum of (1) the distance between the first node (B) and the selected node (Q), and (2) the distance between the second node (C) and the selected node (Q). In some embodiments, the process calculates the distance between any pair of nodes by using the above-described bounding box approach and Equation (A).

If the process determines that the node Q selected at 3010 lies on a shortest path between any two nodes in the node configuration, the process keeps (at 3020) the selected node in the set P of potential Steiner nodes, flags this node as a node that it has examined, and transitions to 3030, which is described below. On the other hand, if the selected node (Q) is not on the shortest path between any two nodes in the selected node configuration, the process removes (at 3025) the selected node from the set P of potential Steiner nodes, and transitions to 3030.

At 3030, the process determines whether it has examined all the nodes in the set of potential Steiner nodes. If not, the process returns to 3010 to select another node in this set so that it can determine at 3015 whether this node is on a shortest path between any two nodes in the selected node configuration. When the process determines (at 3030) that it has examined all the nodes in the set of potential Steiner nodes, it ends.

Once the process 2800 performs (at 2825) the process 3000 of FIG. 30 to identify potential Steiner nodes, the process 2800 defines (at 2830) all possible sets of Steiner nodes. Each defined set of Steiner nodes includes one or more of the Steiner nodes identified at 2825. Also, each defined set of Steiner nodes has a maximum size that is two nodes less than the number of nodes in the selected node configuration.

The process 2800 then selects (at 2835) one of the Steiner-node sets defined at 2830. The process then (at 2840) (1) constructs a minimum spanning tree (MST) for the nodes in the selected node configuration and the selected Steiner-node set, and (2) computes and stores this MST's length (MST_Cost). The process constructs this MST by using edges that can be completely or partially diagonal. One manner of constructing such a MST and computing its length will be described below by reference to FIG. 31.

Next, the process determines (at 2845) whether, in the Steiner node sets defined at 2830, there are any additional Steiner-node sets that it has not yet examined. If so, the process returns to 2835 to select another Steiner-node set, so that it can construct a MST for the nodes of this set and the nodes in the selected node configuration.

When the process determines (at 2845) that it has generated MST's of the selected node configuration and each Steiner-node set, the process identifies (at 2850) the smallest MST_Cost that it computed at 2820 and 2840. The process then stores (at 2855) in a LUT the MST_Cost identified at 2850 as the length of the Steiner-tree route for the node configuration selected at 2815. During the placement operation, a placer can then quickly identify the Steiner-tree length for the current node configuration by retrieving the stored length from the storage structure.

The process next determines (at 2860) whether it has examined all node configurations in the set defined at 2810 that have two or more nodes. If not, the process returns to 2815 to select an unexamined node configuration that has two or more nodes, and then repeat operations 2820–55 to determine and store the Steiner length for this node configuration. Otherwise, the process ends.

Figure 31:
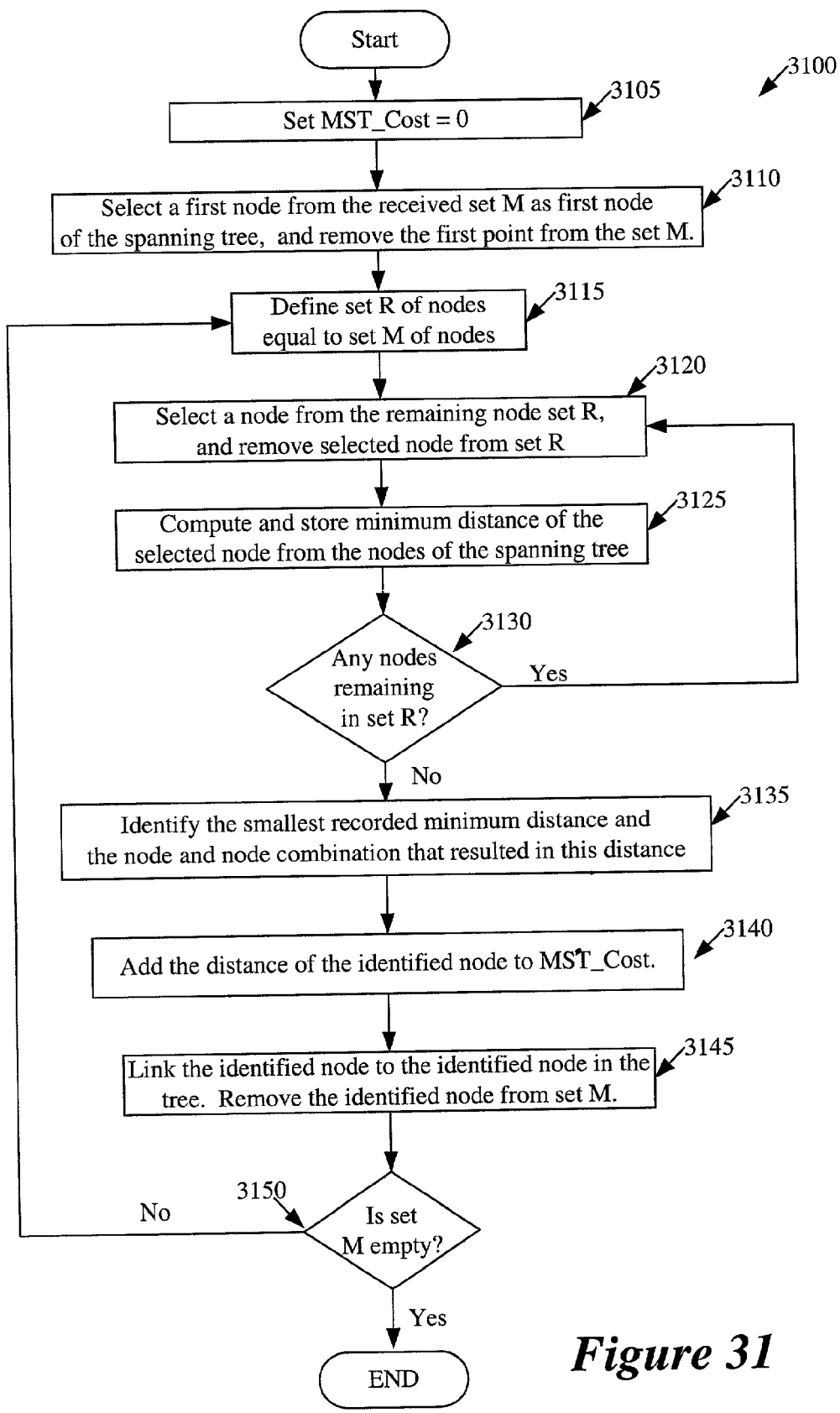
FIG. 31 illustrates a process that the process of FIG. 28 uses to construct minimum spanning trees.

FIG. 31 illustrates a process 3100 that the process 2800 of FIG. 28 uses at 2820 and 2840 to construct minimum spanning trees. A minimum spanning tree for a node configuration is a tree that has N−1 edges that connect (i.e., span) the N nodes of the configuration through the shortest route, which only branches (i.e., starts or ends) at the nodes. The length of a MST for a net configuration provides a lower-bound estimate of the amount of wiring needed to interconnect the nodes associated with the net configuration.

According to the embodiments described below, the edges of the MST's can be horizontal, vertical, or diagonal. The diagonal edges can be completely or partially diagonal. Also, when the IC layouts use diagonal interconnect lines (e.g., ±120° interconnect lines), the diagonal edges of the MST's can be in the same direction (e.g., can be in ±120° direction) as some of the diagonal interconnect lines in the layout.

For instance, when the IC layout uses an octagonal wiring model that specifies horizontal, vertical, and 45° diagonal lines, some embodiments construct MST's that have horizontal, vertical, and 45° diagonal edges. The above-described FIG. 11 illustrates an example of such a MST. Also, as discussed above, by treating the two nodes of each edge of an MST as two opposing corners of a bounding box, the length of each edge can be obtained by using the above-described bounding-box approach and Equation (A).

The process 3100 starts whenever the process 2800 calls it (at 2820 or 2840) (1) to construct an MST for a set M of nodes, and (2) to calculate this MST's length. This process initially (at 3105) sets the MST length (MST_Cost) to zero. Next, the process (at 3110) (1) selects a node from the received set M of nodes as the first node of the spanning tree, and (2) removes this node from this set M.

The process then defines (at 3115) a remainder set R of nodes equal to the current set M of nodes. At 3120, the process selects a node from the remaining node set R, and removes the selected node from the set of remaining nodes. The process then computes and stores (at 3125) the distance between the node selected at 3120 and each current node of the spanning tree. The distance between the selected node and each node can be traversed by an edge that is completely or partially diagonal. Hence, in some embodiments, the process uses the above-described bounding-box approach and Equation (A) to compute the minimum distance between the selected node and each node.

Next, the process determines (at 3130) whether there is any node remaining in set R. If so, the process returns to 3120 to select another node from this set, so that it can compute (at 3125) the distance between this node and the current nodes of the spanning tree. Otherwise, the process (at 3135) identifies the smallest distance recorded at 3125, and identifies the node combination (i.e., the node in set M and the MST's node) that resulted in this distance. The process then (at 3140) adds the identified smallest distance to the MST length (MST Cost).

The process next (at 3145) (1) defines a tree node corresponding to the node identified at 3135, (2) removes the identified node from the node set M, and (3) links the defined tree node to the MST node identified at 3135. The process then determines (at 3150) whether the node set M is empty. If not, the process transitions back to 3115 to identify the next node (in this set M) that is closest to the current nodes of the MST. Otherwise, the process determines that it has constructed the MST for the received set M of nodes, returns the computed MST length (MST_Cost) for this set, and then ends.

VI. Delay Metric

Several embodiments described above compute length metrics to cost different placement configurations. These length metrics account for the use of a wiring model that includes diagonal wiring. One of ordinary skill will realize that other embodiments might use other types of placement metrics.

For instance, some embodiments compute placement delay costs that account for the use of diagonal wiring. Some of these embodiments derive the delay cost for a to placement of a net from the net's length cost that was derived for such a placement. For example, some embodiments derive the delay cost from the length cost by using a linear equation, such as Equation (F) recited below:

$$\text{Delay\_Cost} = A * \text{Wirelength\_Cost} + B, \quad (F)$$

where A and B are scalar constants. Other embodiments derive the delay cost from the length cost by using a non-linear equation, such as Equation (G) recited below:

$$\text{Delay\_Cost} = A * \text{Wirelength\_Cost}^D + A' * \text{Wirelength\_Cost}^{D-1} + \ldots + B, \quad (G)$$

where A, A', B, and D are scalar constants. In the equation above, D can be any value greater than one. Also, the equation can have multiple components that are dependent on the length. In these equations, the length cost can be computed according to any of the above-described approaches.

Also, when the length cost is computed according to the pre-tabulating partitioning approach described above, the delay cost can be pre-tabulated along with the length cost. For instance, the process 2800 can calculate and store the delay cost at 2855 when it identifies the length cost of a net configuration with respect to the partitioning grid. Specifically, at 2855, the process 2800 could use the above Equation (F) or (G) to calculate the delay cost from the length cost identified at 2850, and then could store the delay cost along with the length cost in the LUT.

Figure 32:
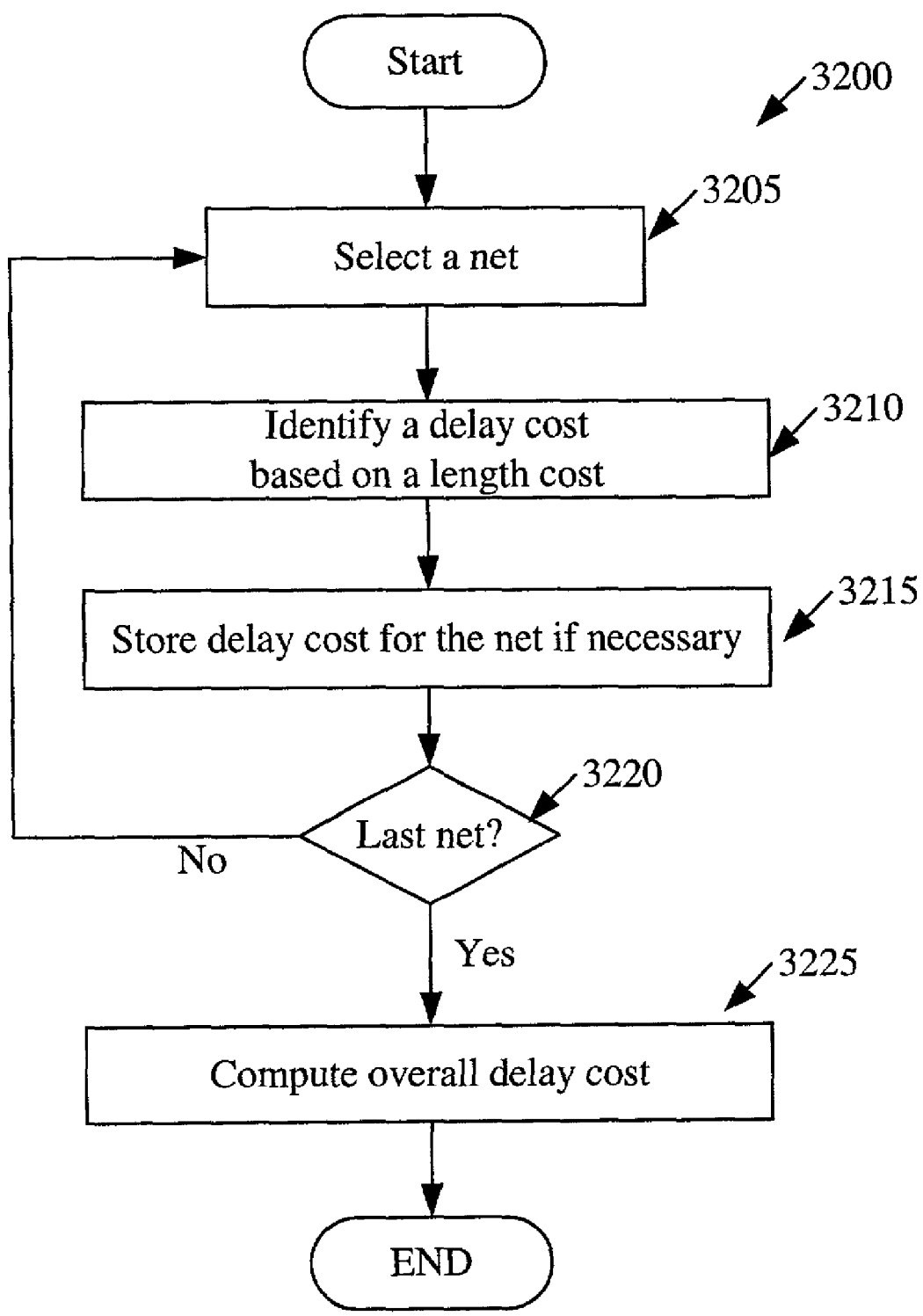
FIG. 32 illustrates a process that computes delay costs.

FIG. 32 illustrates a process 3200 that computes delay costs. A placer can use this process to generate a delay cost estimate for a set of nets on a net list. In some embodiments, the process 3200 starts whenever it receives a net list that specifies a number of nets.

Each received net has a set of circuit elements associated with it (i.e., each net is defined to include several circuit elements). In other words, the nets on the net list specify the interconnection between some or all the circuit elements in the IC layout. In the embodiments described below, the circuit elements associated with the nets are the pins of circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 3200 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 3200 to optimize the placement configuration for a wiring architecture that uses diagonal wiring.

The process 3200 initially selects (at 3205) a net. For the selected net, it then identifies (at 3210) a delay cost that is based on a length cost of the net. The length cost can be computed based on any of the above-described processes 1000, 1200, 1400, 1900, and 2300. Also, the identified delay cost can be derived from the length cost based on any number of mathematical relationships, such as those described by Equations (F) and (G). As mentioned above, the embodiments that use the pre-tabulating partitioning approach can pre-tabulate the delay cost for each net configuration. Accordingly, in these embodiments, the process 3200 identifies (at 3210) the delay cost by using the selected net's configuration with respect to a partitioning grid to retrieve a pre-computed delay cost from a storage structure.

After 3210, the process stores (at 3215) the identified delay cost of the selected net, if necessary. The process 3200 does not have to store the identified delay cost when it uses the above-described partitioning approach that uses pre-tabulated delay costs. In these embodiments, the delay costs have already been stored for each net configuration with respect to the partitioning grid.

The process then determines (at 3220) whether it has examined the last net in the received net list. If not, the process returns to 3205 to select another net and then repeats 3210–3215 for the newly selected net. Otherwise, for the received placement configuration, the process computes (at 3225) an overall delay cost based on the delay costs identified at 3210. In some embodiments, the process computes the overall delay cost as a sum of the delay costs identified at 3210. After 3225, the process ends.

In some embodiments of the invention, the process 3200 generates a delay cost estimate for an initial placement configuration, when it receives a net list that specifies the initial placement configuration (i.e., a net list that identifies all the nets in the IC layout before any modifications to the positions of the modules in the layout).

After obtaining the delay cost of the initial placement configuration, some embodiments use an optimization process that iteratively modifies the placement configuration to improve the placement-configuration cost. In some embodiments, the optimization process uses the process 3200 to calculate the placement-configuration cost for each possible iterative modification to the placement configuration. This is further described below in Section VII, which presents several suitable optimization techniques.

VII. Optimization Techniques

As mentioned above, the invention's cost-calculating methods can be used with a variety of optimization techniques. Three suitable optimization techniques are described below. These three are: (1) local optimization, (2) simulated annealing, and (3) KLFM.

A. Local Optimization.

Local optimization is a technique that iteratively modifies the placement configuration to improve the placement score generated by a cost-calculating function. At each iteration, this technique might move one circuit module, swap two modules, or move a number of related modules, etc. Also, at each iteration, this technique randomly selects moves. In addition, this techniques does not accept moves that make the calculated cost worse.

Figure 33A:
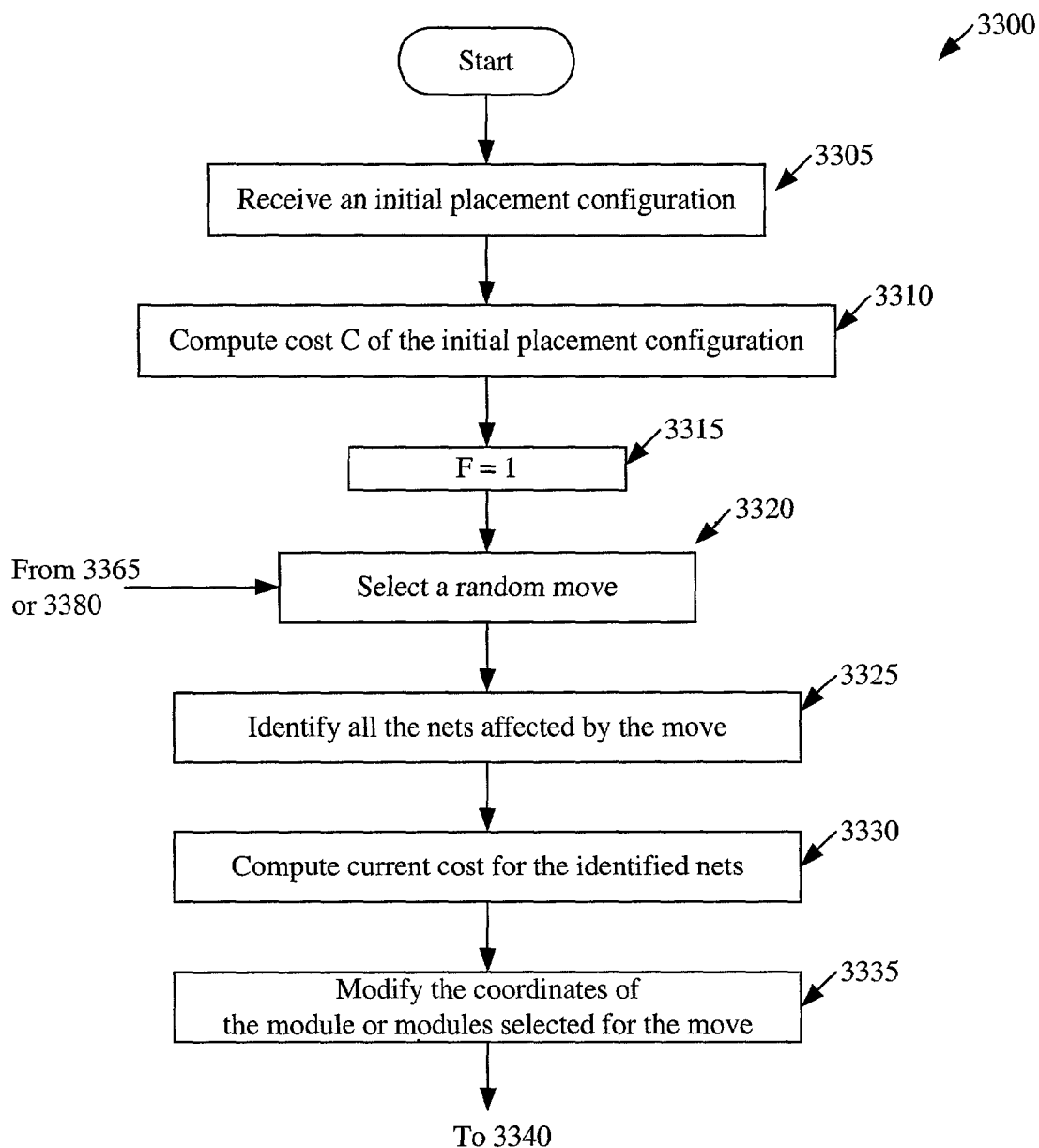
FIG. 33 illustrates one example of a local optimization process.
Figure 33B:
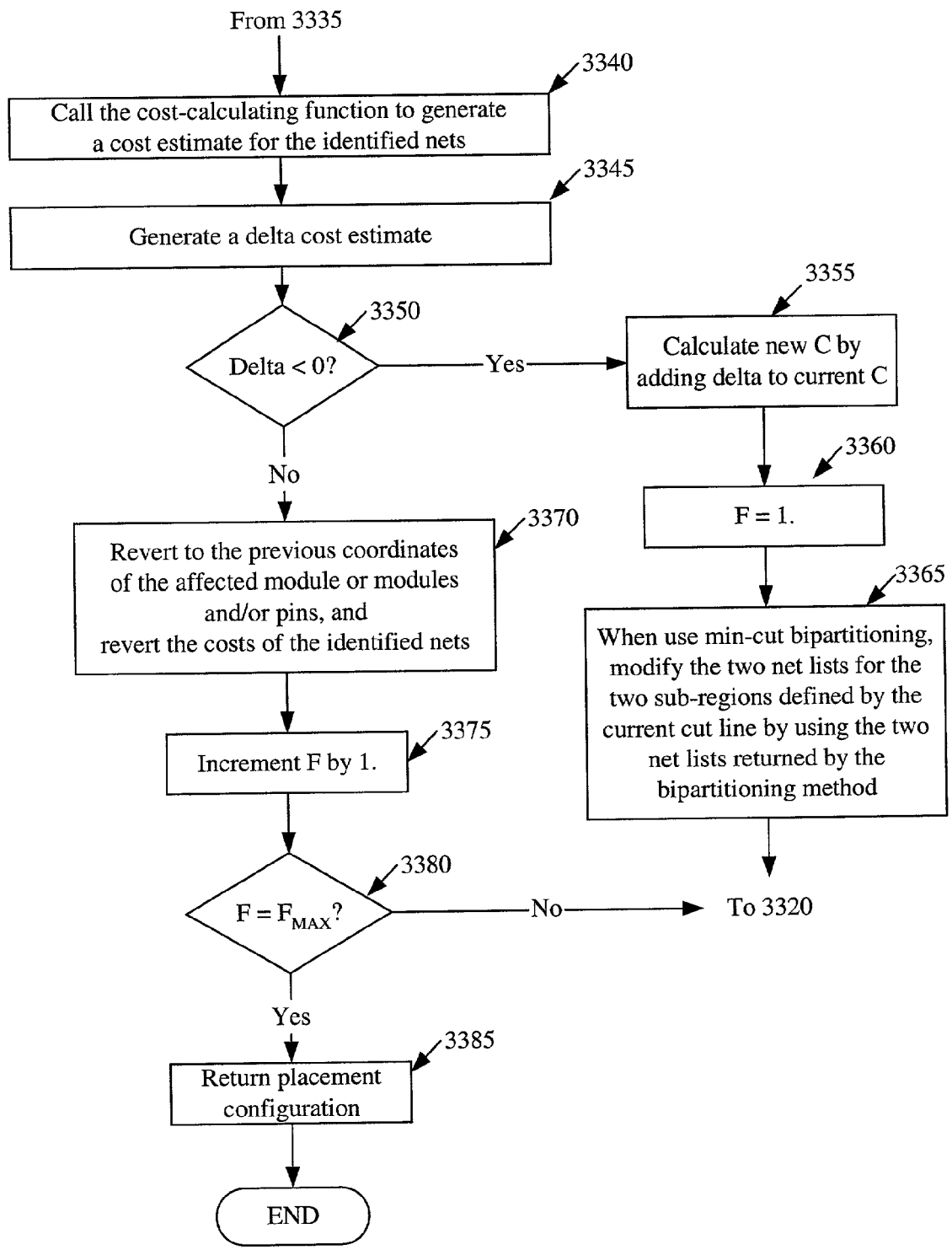

FIG. 33 illustrates one example of a local optimization process 3300. This process initially receives (at 3305) an initial placement configuration. In some embodiments, the process receives the initial configuration by receiving a list of circuit modules, a starting placement configuration for these modules, and a net list that specifies the interconnection between these modules.

After receiving the initial placement configuration, the process 3300 calls (at 3310) a cost-calculating method, like one of the cost-calculating methods described above in Sections II–VI. In response, this cost-calculating method computes and returns the cost (C) of the initial placement configuration.

When the process 3300 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1900 described above, the process 3300 calls the process 1800 before calling the process 1900. As described above, the process 1800 defines a cut line for the current IC region being optimized by the optimization process 3300. The process 3300 supplies the congestion-calculating process 1900 with this cut line along with the initial-configuration's net list, in order to receive from the process 1900 the net-cut congestion cost (C) of the initial placement configuration. From the process 1900, the process 3300 also receives two net lists that specify the nets and the pins in the two regions defined by the current cut line.

After obtaining cost of the initial placement configuration at 3310, the process sets (at 3315) a futile-iteration counter (F) equal to 1. As further described below, the process uses counter to determine whether it needs to terminate its operation as it has performed a predetermined number of iterations without improving the score.

The process then selects (at 3320) a random move that requires the modification of the coordinates of one or more circuit modules in the IC layout. When the process 3300 uses either of the partitioning processes 1900 or 2300, the random move repositions one or more of the circuit modules with respect to the partitioning lines. For instance, for process 2300, the random move might specify a change of position for a circuit module from one slot to another.

The process next identifies (at 3325) all the nets affected by this random move. Depending on how nets are defined, these nets are the nets that either (1) contain the circuit module or modules selected for the move, or (2) contain the pins of these circuit modules.

At 3330, the process computes the current cost for the nets identified at 3325. As mentioned above, the cost calculating processes 1000, 1200, 1400, 1900, 2300, and 3200 store the cost for each net. Hence, the process 3300 can compute the current cost for the identified nets by summing the stored cost values for these nets.

According to the selected random move, the process 3300 modifies (at 3335) the coordinates of each circuit module and/or pin affected by the move. In other words, at 3335, the process makes the move by modifying the coordinates of the affected circuit module or modules and/or their associated pins to match the random location identified at 3320.

The process then calls the cost-calculating process and supplies this process with a net list that specifies the identified nets that are affected by the selected move. This net list specifies the configuration of the identified nets after the selected move, since the process 3300 modified the coordinates of the affected circuit modules and/or pins at 3335. In the embodiments where the cost-calculating process is the bipartitioning process 1900, the process 3300 supplies this process 1900 with the cut line for the current IC region being optimized, along with the list of the identified nets.

In response to the call at 3340, the cost-calculating method computes and returns the cost (C) for the configuration of the identified nets after the potential modification. When the cost-calculating method is the bipartitioning process 1900, this process also partitions the identified nets about the cut line, and returns two net lists that reflect this partitioning.

After receiving (at 3340) the cost for the identified nets after the potential modification, the process generates (at 3345) a delta cost by subtracting the cost for the identified nets after the potential modification (i.e., the cost calculated at 3340) from the cost for the identified nets before the potential modification (i.e., the cost calculated at 3330)

At 3350, the process determines whether the delta cost is less than zero. If so, the selected move reduces the placement cost, and the process decides to retain the move. Specifically, when the delta cost is less than zero, the process sets (at 3355) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C.

The process 3300 then resets (at 3360) the futile-iteration counter F to 1. Also, when the cost-calculating method is the bipartitioning method 1900, the process 3300 uses the two net lists returned by the method 1900 at 3340 to modify the two net lists for the two sub-regions defined by the current cut line. The process then returns to 3320 to select another random move.

One of ordinary skill will realize that in some embodiments the process 3300 does not base its decision to retain the move solely on the value of the delta computed at 3345. For instance, when the process 3300 uses the partitioning process 2300, the process 3300 in some embodiments also computes a balance cost that quantifies the congestion of each sub-region defined by the partitioning grid of the process 2300. In these embodiments, the process 3300 might not retain a move that reduces the delta cost computed at 3345, when such a move increases the balance cost.

If the process determines (at 3350) that the delta cost is not less than zero, the process realizes that the selected move does not reduce the placement cost. Consequently, the process changes (at 3370) the coordinates of the affected circuit module or modules and/or their corresponding pins back to their original coordinates before the move (i.e., their coordinates before 3335). The process also changes the cost of each of the identified nets back to its original value (i.e., back to the cost stored for the net before 3340), if necessary. When the process 3300 uses the partitioning length or delay costing process 2300 or 3200 that uses pre-tabulated length or delay costs, the process does not need to change the costs of each of the identified nets back to the original value because, in these embodiments, the process 2300 or 3200 did not modify these costs in the first place.

The process then increments (at 3375) the futile-iteration counter by one. The process then determines (at 3380) whether the futile-iteration count equals a pre-specified maximum. If not, the process returns to 3320 to select another random move. Otherwise, the process realizes (at 3380) that it has performed a pre-specified maximum number of iterations without improving the placement score. Hence, the process returns (at 3385) a net list specifying the current placement configuration, and then ends.

B. Simulated Annealing.

Simulated annealing is an optimization technique that iteratively modifies the placement configuration to improve the placement score generated by a cost-calculating function. At each iteration, this technique might move one circuit module, swap two modules, move a number of related modules, etc. Also, at each iteration, this technique randomly selects moves. It also accepts moves that make the calculated cost worse, but its tolerates fewer bad moves as the number of iterations increases.

Figure 34A:
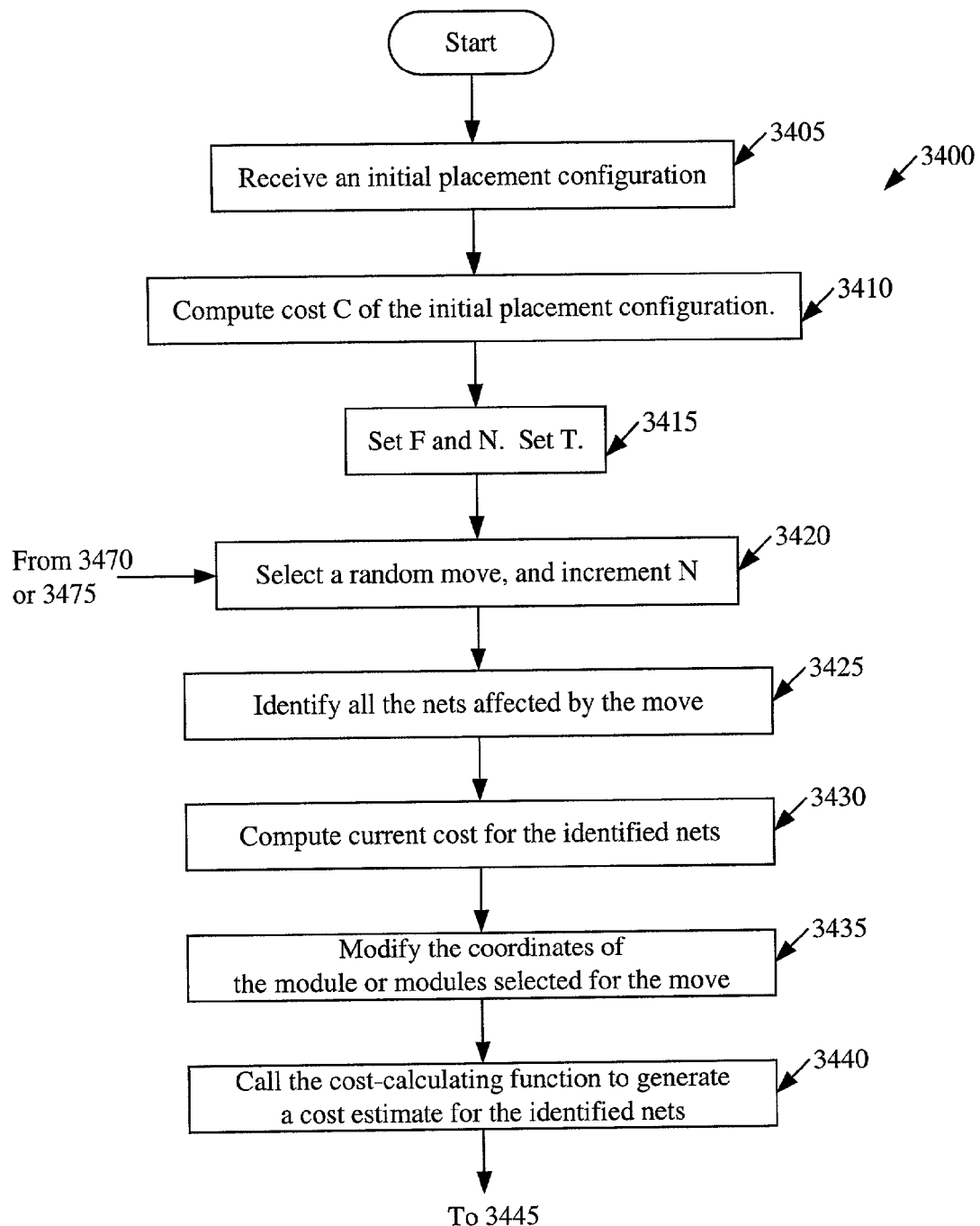
FIG. 34 illustrates one example of a simulated annealing process.
Figure 34B:
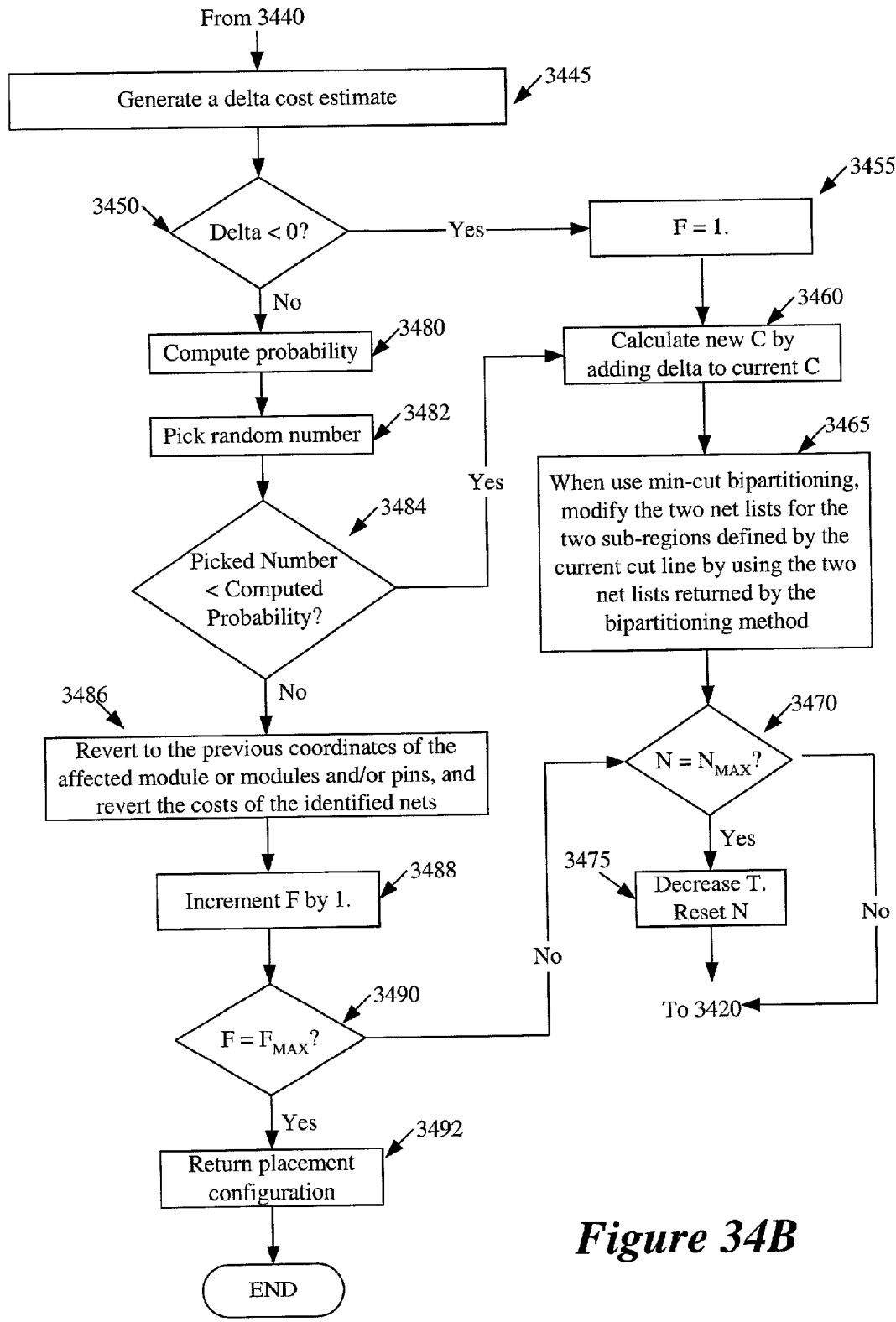

FIG. 34 illustrates one example of a local optimization process 3400. This process initially receives (at 3405) an initial placement configuration. In some embodiments, the process receives the initial configuration by receiving a list of circuit modules, a starting placement configuration for these modules, and a net list that specifies the interconnection between these modules.

After receiving the initial placement configuration, the process 3400 calls (at 3410) a cost-calculating method, like one of the cost-calculating methods described above in Sections II–VI. In response, this cost-calculating method computes and returns the cost (C) of the initial placement configuration.

When the process 3400 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1900 described above, the process 3400 calls the process 1800 before calling the process 1900. As described above, the process 1800 defines a cut line for the current IC region being optimized by the optimization process 3400. The process 3400 supplies the congestion-calculating process 1900 with this cut line along with the initial-configuration's net list, in order to receive from the process 1900 the net-cut congestion cost (C) of the initial placement configuration. From the process 1900, the process 3400 also receives two net lists that specify the nets and the pins in the two regions defined by the current cut line.

After obtaining cost of the initial placement configuration at 3410, the process sets (at 3415) a futile-iteration counter (F) equal to 1. As further described below, the process uses counter to determine whether it needs to terminate its operation as it has performed a predetermined number of iterations without improving the score.

At 3415, the process also sets an annealing "temperature" T and iteration counter N. As further described below, the annealing temperature determines how likely the process 3400 will accept bad moves. The iteration counter is used to decrease this temperature over time, so as to make process 3400 less and less willing to accept bad moves.

At 3420, the process then (1) selects a random move that requires the modification of the coordinates of one or more circuit modules in the IC layout, and (2) increments the iteration counter N. When the process 3400 uses either of the partitioning processes 1900 or 2300, the random move repositions one or more of the circuit modules with respect to the partitioning lines. For instance, for process 2300, the random move might specify a change of position for a circuit module from one slot to another.

The process next identifies (at 3425) all the nets affected by this random move. Depending on how nets are defined, these nets are the nets that either (1) contain the circuit module or modules selected for the move, or (2) contain the pins of these circuit modules.

At 3430, the process computes the current cost for the nets identified at 3425. As mentioned above, the cost calculating processes 1000, 1200, 1400, 1900, 2300, and 3200 store the cost for each net. Hence, the process 3400 can compute the current cost for the identified nets by summing the stored cost values for these nets.

According to the selected random move, the process 3400 modifies (at 3435) the coordinates of each circuit module and/or pin affected by the move. In other words, at 3435, the process makes the move by modifying the coordinates of the affected circuit module or modules and/or their associated pins to match the random location identified at 3420.

The process then calls the cost-calculating process and supplies this process with a net list that specifies the identified nets that are affected by the selected move. This net list specifies the configuration of the identified nets after the selected move, since the process 3400 modified the coordinates of the affected circuit modules and/or pins at 3435. In the embodiments where the cost-calculating process is the bipartitioning process 1900, the process 3400 supplies this process 1900 with the cut line for the current IC region being optimized, along with the list of the identified nets.

In response to the call at 3440, the cost-calculating method computes and returns the cost (C) for the configuration of the identified nets after the potential modification. When the cost-calculating method is the bipartitioning process 1900, this process also partitions the identified nets about the cut line, and returns two net lists that reflect this partitioning.

After receiving (at 3440) the cost for the identified nets after the potential modification, the process generates (at 3445) a delta cost by subtracting the cost for the identified nets after the potential modification (i.e., the cost calculated at 3440) from the cost for the identified nets be fore the potential modification (i.e., the cost calculated at 3430)

At 3450, the process determines whether the delta cost is less than zero. If so, the selected move reduces the placement cost, and the process decides to retain the move. Specifically, when the delta cost is less than zero, the process resets (at 3455) the futile-iteration counter F to 1. The process then sets (at 3460) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C. Also, when the cost-calculating method is the bipartitioning method 1900, the process 3400 uses (at 3465) the two net lists returned by the method 1900 at 3440 to modify the two net lists for the two sub-regions defined by the current cut line.

The process next determines (at 3470) whether the iteration counter N has reached a maximum. If not, the process returns to 3420 to select another random move. Otherwise, the process decreases the annealing temperature and resets the iteration counter at 3475, and then returns to 3420 to select another random move.

One of ordinary skill will realize that in some embodiments the process 3400 does not base its decision to retain the move solely on the value of the delta computed at 3345. For instance, when the process 3400 uses the partitioning process 2300, the process 3400 in some embodiments also computes a balance cost that quantifies the congestion of each sub-region defined by the partitioning grid of the process 2300. In these embodiments, the process 3400 might not retain a move that reduces the delta cost computed at 3345, when such a move increases the balance cost.

If the process determines (at 3450) that the delta cost is not less than zero, the process computes (at 3480) a probability between 0 and 1. In some embodiments, the equation for computing the probability equals $e^{-(Delta)/T}$, where Delta is the value computed at 3445 and T is the annealing temperature.

Next, the process picks (at 3482) a random number between 0 and 1. At 3484, the process then determines whether the random number is less than the computed probability. If so, the process decides to make the move, and thereby transitions to 3460 to perform the other operations associated with the move, as described above.

If the selected random number is not less than the computed probability, the process changes (at 3486) the coordinates of the affected circuit module or modules and/or their corresponding pins back to their original coordinates before the move (i.e., their coordinates before 3435). At 3486, the process also changes the cost of each of the identified nets back to its original value (i.e., back to the cost stored for the net before 3440), if necessary.

When the process 3400 uses the partitioning length or delay costing process 2300 or 3200 that uses pre-tabulated length or delay costs, the process does not need to change the costs of each of the identified nets back to the original value because, in these embodiments, the process 2300 or 3200 did not modify these costs in the first place.

The process then increments (at 3488) the futile-iteration counter by one. The process then determines (at 3490) whether the futile-iteration count equals a pre-specified maximum. If not, the process transitions to 3470, which was described above. Otherwise, the process realizes (at 3490) that it has performed a pre-specified maximum number of iterations without improving the placement score. Hence, the process returns (at 3492) a net list specifying the current placement configuration, and then ends.

C. KLFM.

KLFM is an optimization technique that iteratively modifies the placement configuration to improve the placement score generated by a cost-calculating function. At each iteration, this technique might move one circuit module, swap two modules, move a number of related modules, etc. Unlike local optimization and simulated annealing, KLFM does not randomly select moves. Instead, at each iteration, it selects the best move over all the possible moves that it can make. KLFM will make moves that make the placement cost worse. Over an entire sweep, it then identifies the best placement configuration that it sees, and if that best placement configuration has a better cost than the original placement configuration, KLFM starts over with the improved solution.

Figure 35A:
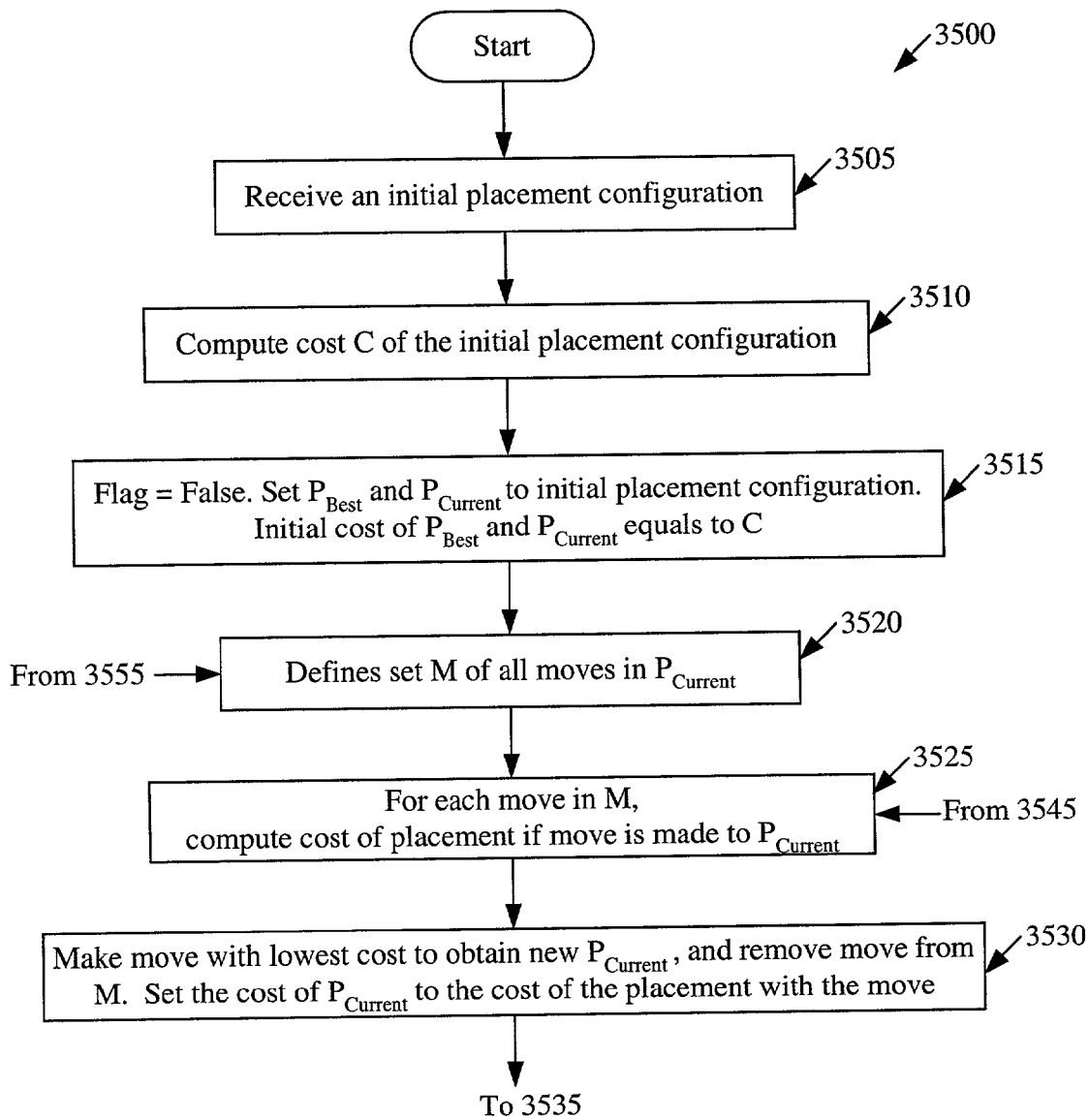
FIG. 35 illustrates one example of a KLFM process.
Figure 35B:
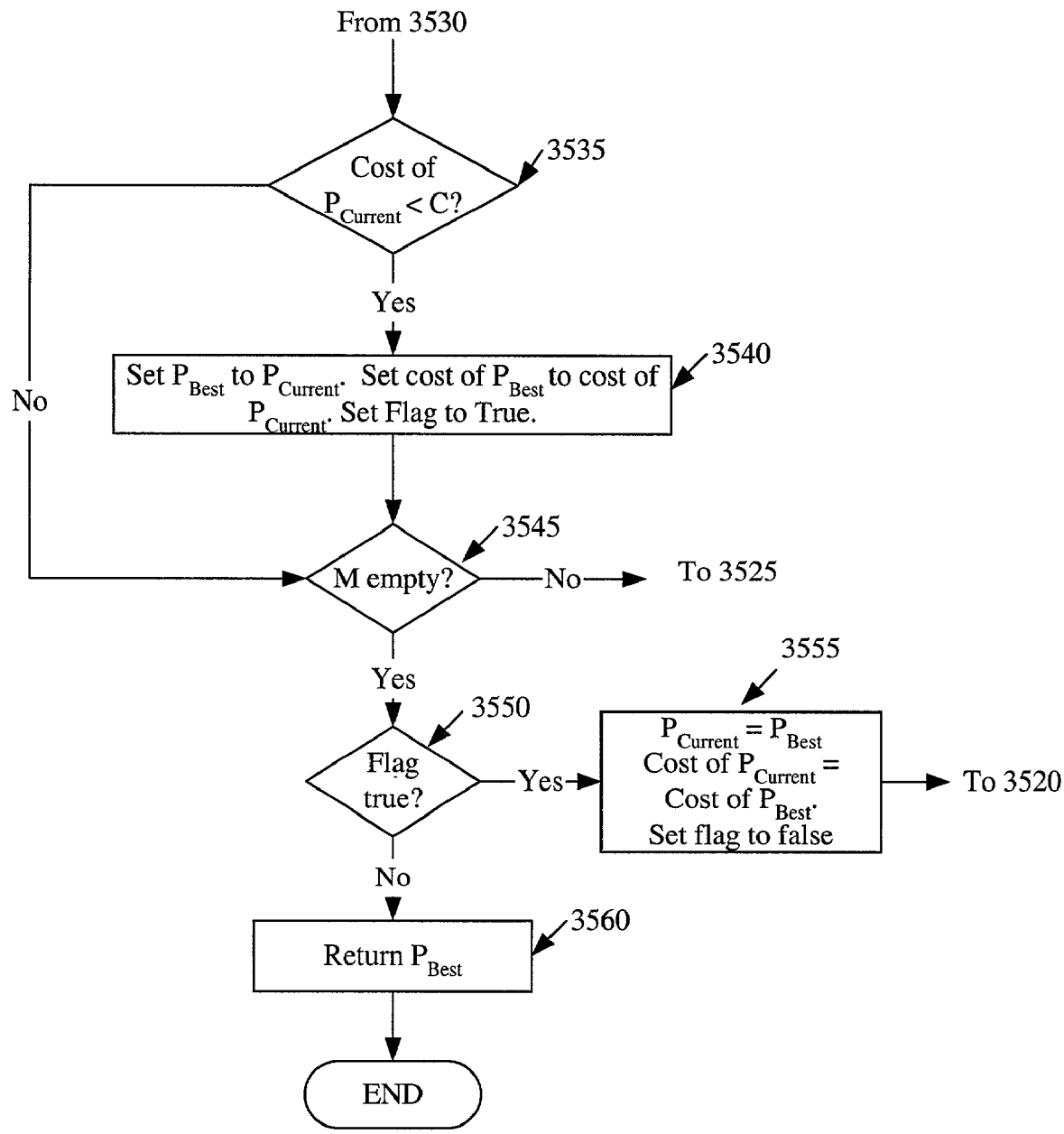

FIG. 35 illustrates one example of a KLFM process 3500. This process initially receives (at 3505) an initial placement configuration. In some embodiments, the process receives the initial configuration by receiving a list of circuit modules, a starting placement configuration for these modules, and a net list that specifies the interconnection between these modules.

After receiving the initial placement configuration, the process 3500 calls (at 3510) a cost-calculating method, like one of the cost-calculating methods described above in Sections II–VI. In response, this cost-calculating method computes and returns the cost (C) of the initial placement configuration.

When the process 3500 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1900 described above, the process 3500 calls the process 1800 before calling the process 1900. As described above, the process 1800 defines a cut line for the current IC region being optimized by the optimization process 3500. The process 3500 supplies the congestion-calculating process 1900 with this cut line along with the initial-configuration's net list, in order to receive from the process 1900 the net-cut congestion cost (C) of the initial placement configuration. From the process 1900, the process 3500 also receives two net lists that specify the nets and the pins in the two regions defined by the current cut line.

After obtaining cost of the initial placement configuration at 3510, the process sets (at 3515) a flag (F) equal to false. As further described below, the process uses this flag after performing a number of moves to determine whether any of the moves improved the placement-configuration score. At 3515, the process also (1) identifies the initial placement configuration as the current and best placement configurations, and (2) initializes the costs of the current and best configurations to the cost of the initial configuration.

Next, the process defines (at 3520) a set M of all moves in the current placement configuration ($P_{Current}$). When the process 3500 uses either of the partitioning processes 1900 or 2300, each move repositions one or more of the circuit modules with respect to the partitioning lines. For instance, for process 2300, a move might specify a change of position for a circuit module from one slot to another.

For each move in M, the process computes (at 3525) the cost (C) of the placement configuration after the move. To compute the cost of each move, the process performs the following six operations. First, the process (1) identifies all the nets affected by the move, and (2) computes the current cost for the identified nets by summing the stored cost values for these nets. Second, the process modifies the coordinates of each circuit element affected by the move according to the move.

Third, it supplies the cost-calculating process with a net list that specifies the identified nets that are affected by the selected move. When the cost-calculating process is the bipartitioning process 1900, the process 3500 also supplies the cost-calculating process with the cut line for the current IC region. From the cost-calculating process, the process 3500 receives the cost for the identified nets after the potential move. When the cost-calculating process is the bipartitioning process 1900, the process 3500 also receives two net lists that represent the partitioning of the identified net list by the process 1900.

Fourth, after receiving the cost for the identified nets after the potential modification, the process generates a delta cost by subtracting the cost for the identified nets after the potential modification from the cost for the identified nets before the potential modification.

Fifth, the process generates the cost of the move by adding the computed delta cost to the cost of the current placement configuration. Sixth, the process (1) changes the coordinates of the affected circuit elements (modules and/or pins) back to their original coordinates before the move, and (2) changes the cost of each of the identified nets back to its original value before the move, if necessary. As described above, the process does not need to change the costs of each of the identified nets back to the original value when the process 3500 uses the partitioning length or delay costing process 2300 or 3200 that uses pre-tabulated length or delay costs. In addition, when the process 3500 uses the partitioning process 2300, the process 3500 might also use another process to compute a balance cost that quantifies the congestion of each sub-region defined by the partitioning grid of the process 2300. In these embodiments, the process 3500 combines the computed length and balance costs to obtain an overall cost.

At 3530, the process makes the move with the lowest placement-configuration cost to obtain a new current placement configuration $P_{Current}$. At this stage, the process also removes the selected move from the set M of possible moves. The process also sets the cost of the current placement configuration equal to the cost of the placement after the move. Also, when the cost-calculating method is the bipartitioning method 1900, the process modifies (at 3530) the two net lists for the two sub-regions defined by the current cut line by using the two net lists returned by this method at 3525 for the move.

The process then determines (at 3535) whether the cost of the current placement configuration (i.e., the configuration obtained at 3530) is less than the lowest placement-configuration cost yet seen. If not, the process transitions to 3545, which will be described below. Otherwise, the process (at 3540) (1) defines the best placement configuration to be the current placement configuration, (2) sets the cost of the best placement configuration to the cost of the current placement configuration, and (3) sets the flag (F) to true to indicate that at least one of the performed moves improved the placement cost. The process then transitions to 3545.

At 3545, the process determines whether the set M of possible moves is empty. If not, the process transitions back to 3525 to compute, for each remaining move in the set, the cost (C) of the placement configuration after the move. The process recomputes the cost associated with the moves because the previous move might have affected the placement configuration costs for the remaining moves.

If the process determines (at 3545) that the set M is empty, the process determines that it has performed all the moves in the set defined at 3520. Consequently, the process determines (at 3550) whether one of the performed moves improved the placement cost by determining whether the flag (F) is set to true.

If the flag is true, the process (at 3555) (1) sets the current placement configuration equal to the best placement configuration identified in the last sweep through the moves, (2) define the cost of the current placement configuration equal to the cost of the best placement configuration, and (3) sets the flag (F) to true. The process then returns to 3520 to repeat for the current placement configuration, in order to determine whether it can improve on this configuration.

If the process determines (at 3550) that the flag is false, the process returns (at 3560) the best placement configuration that it identified as the final placement configuration. The process then ends.

VIII. The Computer System

Figure 36:
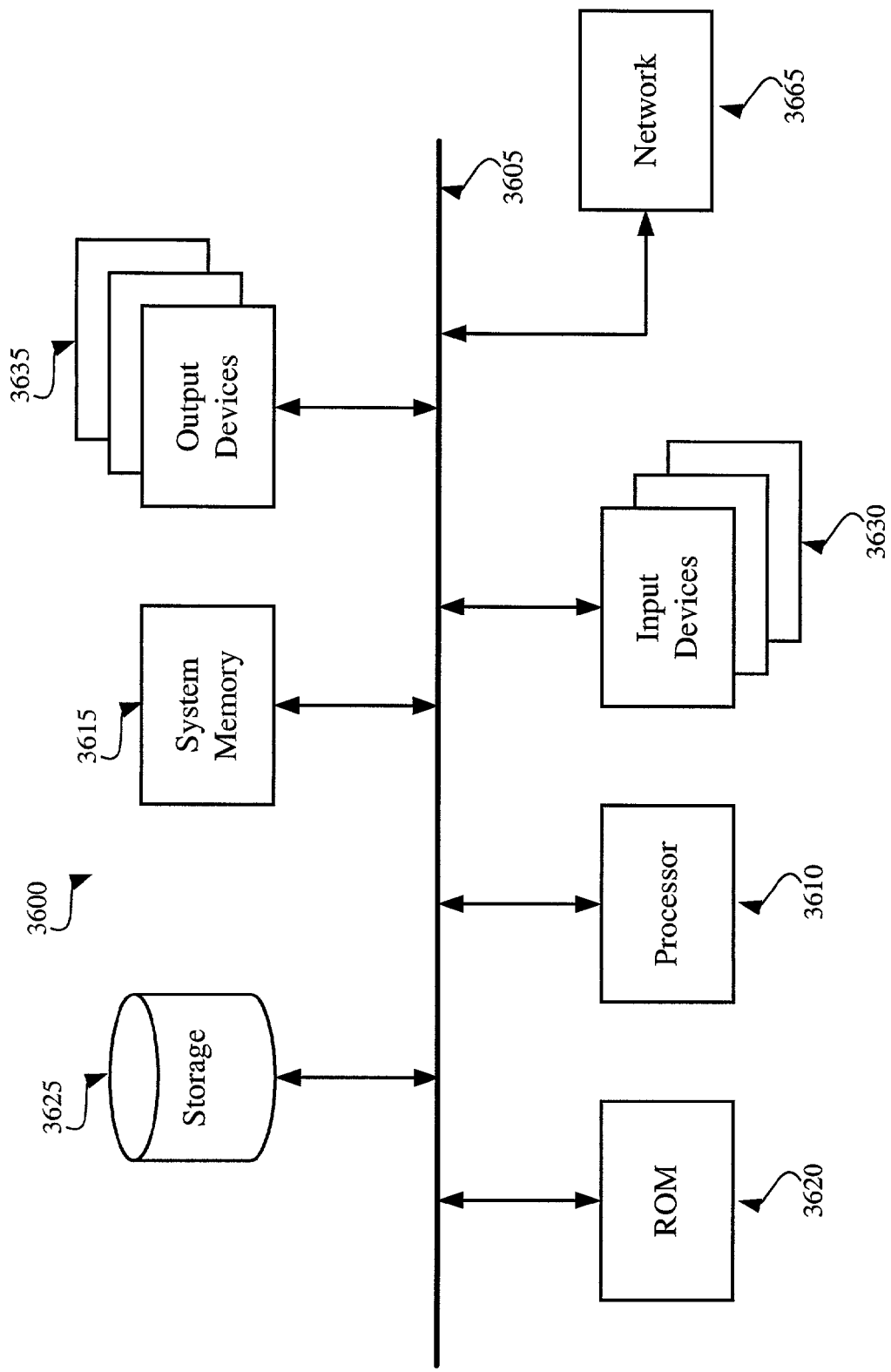
FIG. 36 illustrates a computer system used by some embodiments of the invention.

FIG. 36 presents a computer system with which one embodiment of the present invention is implemented. Computer system 3600 includes a bus 3605, a processor 3610, a system memory 3615, a read-only memory 3620, a permanent storage device 3625, input devices 3630, and output devices 3635.

The bus 3605 collectively represents all system, peripheral, and chipset buses that communicatively connect the numerous internal devices of the computer system 3600. For instance, the bus 3605 communicatively connects the processor 3610 with the read-only memory 3620, the system memory 3615, and the permanent storage device 3625.

From these various memory units, the processor 3610 retrieves instructions to execute and data to process in order to execute the processes of the invention. The read-only memory (ROM) 3620 stores static data and instructions that are needed by the processor 3610 and other modules of the computer system. The permanent storage device 3625, on the other hand, is read-and-write memory device. This device is a non-volatile memory unit that stores instruction and data even when the computer system 3600 is off. Some embodiments of the invention use a mass-storage device (such as a magnetic or optical disk and its corresponding disk drive) as the permanent storage device 3625. Other embodiments use a removable storage device (such as a floppy disk or zip® disk, and its corresponding disk drive) as the permanent storage device.

Like the permanent storage device 3625, the system memory 3615 is a read-and-write memory device. However, unlike storage device 3625, the system memory is a volatile read-and-write memory, such as a random access memory. The system memory stores some of the instructions and data that the processor needs at runtime. In some embodiments, the invention's processes are stored in the system memory 3615, the permanent storage device 3625, and/or the read-only memory 3620.

The bus 105 also connects to the input and output devices 3630 and 3635. The input devices enable the user to communicate information and select commands to the computer system. The input devices 3630 include alphanumeric keyboards and cursor-controllers.

The output devices 3635 display images generated by the computer system. For instance, these devices display IC design layouts. The output devices include printers and display devices, such as cathode ray tubes (CRT) or liquid crystal displays (LCD).

Finally, as shown in FIG. 36, bus 3605 also couples computer 3600 to a network 3665 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 3600 may be used in conjunction with the invention. However, one of ordinary skill in the art would appreciate that any other system configuration may also be used in conjunction with the present invention.

IX. Advantages.

The embodiments of the invention that factor diagonal, horizontal, and vertical wiring during placement, result in the better distribution of the nets when such wiring is used to route the nets. When the router uses diagonal, horizontal, and vertical wiring but the placer is optimized only for Manhattan wiring, the placer poorly positions the nets in the IC layout. Specifically, in these situations, the placer has a tendency to ignore diagonal positions, since it is inclined to place all circuit elements related to a particular circuit element directly above or below, or directly to the right or left, of the particular circuit element.

On the other hand, when a placer is optimized for diagonal, horizontal, and vertical wiring, such a placer is less inclined to ignore diagonal positions. Hence, such a placer places related circuit elements in horizontal, vertical, or diagonal positions with respect to each other. This, in turn, provides for a more uniform distribution of related circuit elements.

In other words, a placer that is optimized for horizontal, vertical, and diagonal wiring can position the circuit modules in more locations that cost the same. This ability, in turn, opens up more positions to place the circuit modules, and thereby reduces wirelength.

While the invention has been described with reference to numerous specific details, one of ordinary skill in the art will recognize that the invention can be embodied in other specific forms without departing from the spirit of the invention. For instance, while the above-described wirelength calculating processes compute their total costs by summing the wirelength cost for each net, other embodiments might compute their total wirelength costs by combining the net wirelength costs in a different manner (e.g., they might multiply their computed net wirelength costs).

Also, some embodiments were described above by only reference to the identification of the wirelength of various connection graphs with potential diagonal edges. One of ordinary skill will realize that other embodiments might identify other attributes of such connection graphs. For instance, some embodiments might identify the number of bends (i.e., the number of changes in wiring direction) of each graph. Thus, one of ordinary skill in the art would understand that the invention is not to be limited by the foregoing illustrative details, but rather is to be defined by the appended claims.

We claim:

1. For an electronic design automation process that uses a wiring model that includes diagonal wiring directions, a method of placing a net in a region of a circuit layout, said placement for a routing operation, the method comprising:
   before said routing operation, selecting a net from a plurality of nets in said region;
   for the selected net, computing a delay cost that accounts for potential diagonal wiring for said routing operation;
   identifying a placement cost from the computed delay cost.

2. The method of claim 1, wherein the placement cost equals the delay cost.

3. The method of claim 1 further comprising:
   for each net in said plurality of nets, computing a delay cost that accounts for potential diagonal wiring for said routing operation;
   identifying the placement cost from the computed delay costs.

4. The method of claim 3, wherein the placement cost equals the sum of the delay costs.

5. The method of claim 3, wherein computing the delay cost for each net comprises:
   computing a wirelength estimate for each net, wherein the wirelength estimates are computed by accounting for diagonal wiring for said routing operation;
   computing the delay cost for each net from the computed wirelength estimate for the net.

6. The method of claim 5, wherein for at least one net, the delay cost has a linear relationship to the net's wirelength cost.

7. The method of claim 5, wherein for at least one net, the delay cost has a non linear relationship to the net's wirelength cost.

8. The method of claim 5, wherein said wiring model specifies at least one diagonal wiring direction, wherein computing the wirelength estimate for each net comprises:
   identifying a bounding box that encloses a set of circuit elements of the net;
   measuring the distance (D) between two opposing corners of the bounding box by using the following equation, D=[L−{S(cos A/sin A)}]+S/sin A,
   wherein L is the longest side of the bounding box, S is the shortest side of the bounding box, and A is an angle of said at least one diagonal wiring direction specified by the wiring model.

9. The method of claim 5,
   wherein each net comprises a plurality of circuit elements: and
   wherein computing the wirelength estimate for each net comprises:
      identifying a connection graph that connects the circuit elements of the net;
      identifying the length of the connection graph;
   wherein some of the connection graphs include at least one edge that is at least partially diagonal.

10. The method of claim 5 further comprising:
    partitioning the region into a plurality of sub-regions;
    wherein computing the wirelength estimate for each net comprises:
       identifying the set of sub-regions that contain the net's circuit elements; and
       identifying the length of a set of interconnect lines that traverses the identified set of sub-regions;
    wherein some of the identified interconnect lines are at least partially diagonal.

11. The method of claim 3, wherein the placement cost is the cost of an initial placement configuration.

12. The method of claim 11, wherein the initial placement configuration is specified by a placer that does not account for potential diagonal wiring for said routing operation.

13. The method of claim 12 further comprising:
    for a net in said circuit-layout region, said net comprising at least one circuit module, modifying a position of said circuit module; and
    after said modification, computing a delay cost associated with said position that accounts for potential diagonal wiring for said routing operation.

14. The method of claim 1, wherein the electronic design automation process includes said routing operation, wherein said routine operation comprises a router that uses diagonal wiring to route the nets in the circuit-layout region.

15. The method of claim 14, wherein the router also uses Manhattan wiring to route the nets in the circuit-layout region.

16. For a placer that partitions a region of a circuit layout into a plurality of sub-regions, a method of computing placement costs, the method comprising:
    for a set of sub-regions, identifying a connection graph that connects the set of sub-regions, wherein the connection graph has at least one edge that is at least partially diagonal;
    identifying a delay cost from an attribute of the connection graph; and
    identifying a placement cost from said computed delay cost.

17. The method of claim 16, wherein the attribute is the length of the connection graph, and the delay cost is derived from the length of the connection graph.

18. The method of claim 16, wherein the method computes delay costs of nets in the circuit-layout region, and each net represents a set of circuit elements in the circuit-layout region, the method further comprising:
    before the identification of the connection graph, identifying the set of sub-regions that contains a net comprising said set of circuit elements;
    wherein the delay cost is a placement cost for the net.

19. The method of claim 18 further comprising:
    from a storage structure, retrieving the delay cost based on said identified set of sub-regions.

20. The method of claim 18 further comprising:

from a storage structure, retrieving the attribute based on said identified set of sub-regions.

21. The method of claim 18 further comprising:

for each net in the circuit-layout region, identifying a set of sub-regions that contains the set of circuit elements of the net;

identifying a connection graph that connects the set of sub-regions;

identifying the delay cost from an attribute of the connection graph identified for the net; wherein some connection graphs have at least one edge that is at least partially diagonal;

identifying an overall placement cost from the identified delay cost of each net.

22. The method of claim 16, wherein the connection graph is a Steiner tree.

* * * * *

UNITED STATES PATENT AND TRADEMARK OFFICE
CERTIFICATE OF CORRECTION

| | |
|---|---|
| PATENT NO. | : 7,055,120 B2 |
| APPLICATION NO. | : 10/046858 |
| DATED | : May 30, 2006 |
| INVENTOR(S) | : Steven Teig et al. |

Page 1 of 1

It is certified that error appears in the above-identified patent and that said Letters Patent is hereby corrected as shown below:

Column 1,
Line 16 reads, "This patent application is also a continuation-in-part application of U.S. patent application Ser. No. 10/013,816, filed Sep. 19, 2001."

Should read (correction to the date) -- This patent application is also a continuation-in-part application of U.S. patent application Ser. No. 10/013,816, filed on Oct. 19, 2001. --

Column 36,
Lines 36-37 read "wherein said routine operation comprises a router that uses diagonal wiring to route the nets in the circuit-layout region."

Should read (correction to language) -- wherein said routing operation comprises a router that uses diagonal wiring to route the nets in the circuit-layout region. --

Signed and Sealed this

Twenty-eighth Day of August, 2007

JON W. DUDAS
*Director of the United States Patent and Trademark Office*